United States Patent [19]
Rohrbaugh et al.

[11] Patent Number: 5,381,344
[45] Date of Patent: Jan. 10, 1995

[54] APPARATUS AND METHOD FOR OBTAINING A LIST OF NUMBERS OF WAFERS FOR INTEGRATED CIRCUIT TESTING

[75] Inventors: John G. Rohrbaugh, Fort Collins; Thomas H. Baker, Loveland; Michael J. Bennett, Wellington; Mercedes P. Gil; Robert W. Proulx, both of Fort Collins, all of Colo.

[73] Assignee: Hewlett-Packard Company, Palo Alto, Calif.

[21] Appl. No.: 863,257

[22] Filed: Apr. 6, 1992

[51] Int. Cl.⁶ .............................................. G06F 15/46
[52] U.S. Cl. ............................... 364/490; 364/468; 364/478; 364/488; 364/489; 364/491
[58] Field of Search ........................... 364/488–491, 364/468, 478; 340/568, 825.86, 674; 414/757, 225, 752, 744.2, 627

[56] References Cited

U.S. PATENT DOCUMENTS

| | | | |
|---|---|---|---|
| 4,618,938 | 10/1986 | Sandland et al. | 364/552 |
| 4,672,185 | 6/1987 | Sato et al. | 235/462 |
| 4,849,901 | 7/1989 | Shimizu | 364/468 |
| 4,859,993 | 8/1989 | Kagami et al. | 340/674 |
| 4,897,795 | 1/1990 | Yoda et al. | 364/488 |
| 4,907,230 | 3/1990 | Heller et al. | 371/22.1 |
| 4,938,654 | 7/1990 | Schram | 414/757 |
| 4,974,166 | 11/1990 | Maney et al. | 364/478 |
| 5,124,931 | 6/1992 | Iwamatsu et al. | 364/489 |
| 5,153,841 | 10/1992 | Goff et al. | 364/478 |

OTHER PUBLICATIONS

K. K. Shokoohi et al., "100 MHz Circuit Pack Test System: A Reality", *Proceedings of the First European Test Conference*, pp. 86–93, 1989.

Anthony R. Taylor, "An Analysis of ATE Computational Architecture", *IEEE 1990 International Test Conference*, Paper 25.1, pp. 514–519, 1990.

Don Organ, "enVision TM: The Inside Story", *IEEE 1990 International Test Conference*, Paper 25.3, pp. 530–536, 1990.

David G. Edwards, "ATE Software", *IEEE International Test Conference Tutorials 1990*, pp. 1–37, Jun. 28, 1990.

Daryl Allred et al., "AGATHA: An Integrated Expert System to Test and Diagnose Complex Personal Computer Boards", *Innovative Applications of Artificial Intelligence 3*, pp. 87–103, 1991.

Arthur E. Downey, "Industry Graphic Standards and ATE Windowing Software", *IEEE International Test Conference 1991*, Paper 41.2, pp. 1087–1095, 1991.

Mercedes Gil et al., "A Production Test Shell for the HP82000", *The 1991 International HP82000 Users Group Meeting*, pp. 45–58, Apr. 4, 1991.

*Primary Examiner*—Kevin J. Teska
*Assistant Examiner*—Leigh Marie Garbowski

[57] ABSTRACT

The invention is a method for enabling a user to enter wafer numbers into a computer-based integrated circuit production test system. The method comprises the steps of: (a) prompting the user for the wafer numbers; (b) displaying the wafer numbers in a graphical representation of a wafer cassette; (c) enabling the user to edit the wafer numbers on the graphical representation; and (d) transmitting the wafer numbers to the computer-based IC production test system.

24 Claims, 46 Drawing Sheets

APPARATUS AND METHOD FOR OBTAINING A LIST OF NUMBERS OF WAFERS FOR INTEGRATED CIRCUIT TESTING

BACKGROUND OF THE INVENTION

1. Field Of The Invention

The present invention relates generally to an apparatus and method for entering data into an integrated circuit (IC) tester, and more particularly, to an apparatus and method for obtaining a list of numbers of wafers for integrated circuit testing.

2. Related Art

In testing dies on wafers, each wafer is numbered so that test results can be matched with the proper wafers. These numbers must be accurately entered into the test program.

A first technique for wafer number entry is to manually type a list of numbers through an ASCII-based terminal. The user manipulates numbers on the list via keyboard commands. This approach requires much typing and is therefore tedious and prone to error. Also, it does not provide an intuitive representation of the cassette (which holds wafers being tested). Furthermore, an error generally requires the user to begin typing the list over again. Finally, this approach does not enable the user to specify that certain wafers in the cassette are not to be tested.

In a second approach to wafer number entry, the user creates a file containing the list. The test program receives the wafer numbers by reading the file. This approach does not require the user to start over again if he or she errs in entering the wafer numbers. This approach has essentially the same disadvantages as the first approach, except that it is somewhat less tedious and prone to error.

A third approach to wafer number entry is to read the wafer numbers with a wafer reader, save the results to a file, and transmit the contents of the file to the test program. This approach still does not provide for skipping wafers in the cassette, and still is not an intuitive representation of the cassette. Furthermore, it requires the user to make the file created by the wafer reader accessible to the test program. Therefore, what is needed is a way to enter wafer numbers into the test program which requires little typing, presents the list as an intuitive representation of the cassette, provides extensive editing tools, and provides for skipping wafers in the cassette.

SUMMARY OF THE INVENTION

The invention is a method for enabling a user to enter wafer numbers into a computer-based integrated circuit production test system. The method comprises the steps of: (a) prompting the user for the wafer numbers; (b) displaying the wafer numbers in a graphical representation of a wafer cassette; (c) enabling the user to edit the wafer numbers on the graphical representation; and (d) transmitting the wafer numbers to the computer-based IC production test system.

DETAILED DESCRIPTION

High-Level Structure and Method

Figure 1:
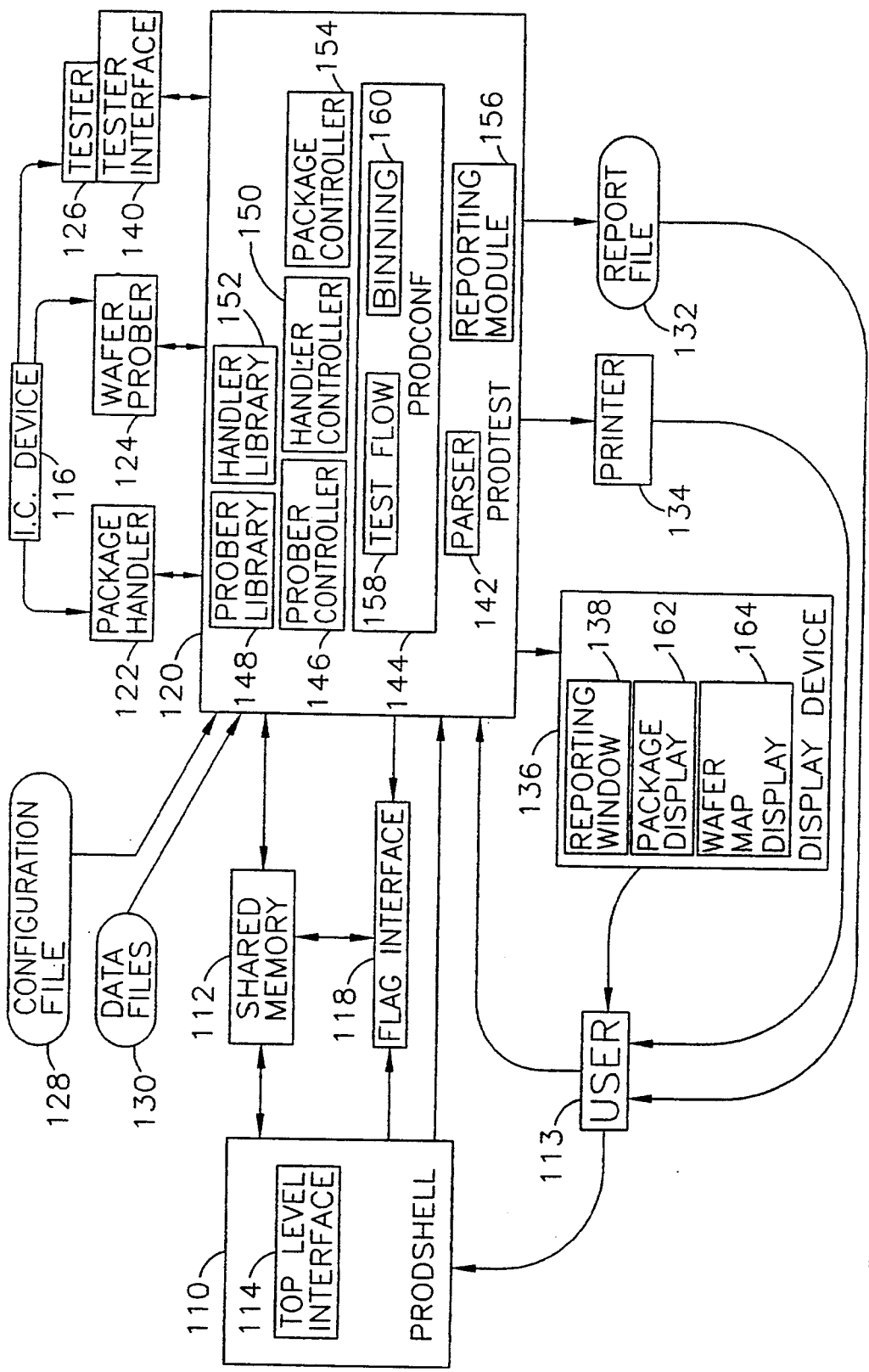
FIG. 1 shows a block diagram of the invention in the environment in which it operates.

FIG. 1 shows a block diagram of the environment in which a test shell, called a prodshell 110, of the present invention operates. The prodshell 110 receives input from a user 113 and communicates with a shared memory 112. The prodshell 110 comprises a top-level interface 114 for obtaining initial information needed for testing a device. In FIG. 1, the device is shown as an integrated circuit (IC) device, such as a die on a wafer or a package part. The prodshell 110 invokes a flag interface 118 to enable the user 113 to change the value of flags in the shared memory 112 which control the operation of the prodshell 110, including which tests are performed, the level of result reporting desired, the location or locations to which test results are sent and the appearance of the user 113 interfaces.

After receiving information from the user 113, the prodshell 110 transfers control to a process which executes a prodtest 120. The prodtest 120 communicates with a package handler 122 or wafer prober 124 and a tester 126. (During a single execution, the prodtest 120 communicates with either the package handler 122 or the wafer prober 124.) The prodtest 120 commands the package handler 122 or wafer prober 124 to position the device appropriately for the next test. The prodtest 120 then invokes the tester 126 to carry out that test.

Before positioning and testing the IC device 116, the prodtest 120 receives information from a configuration file 128 and from data files 130. In the configuration file 128, the user 113 uses a high level language to describe the tests to be performed on the IC device 116. The data files 130 could comprise, for example, a wafer download file containing information such as the geometry of a wafer, the chuck temperature and the alignment target, a calibration file, a pin attributes file, and chip pin, levels and timing files.

The prodtest 120 transmits test results to the user 113 via a report file 132, a printer 134, and/or a display device 136, as specified by the user 113.

Figure 2:
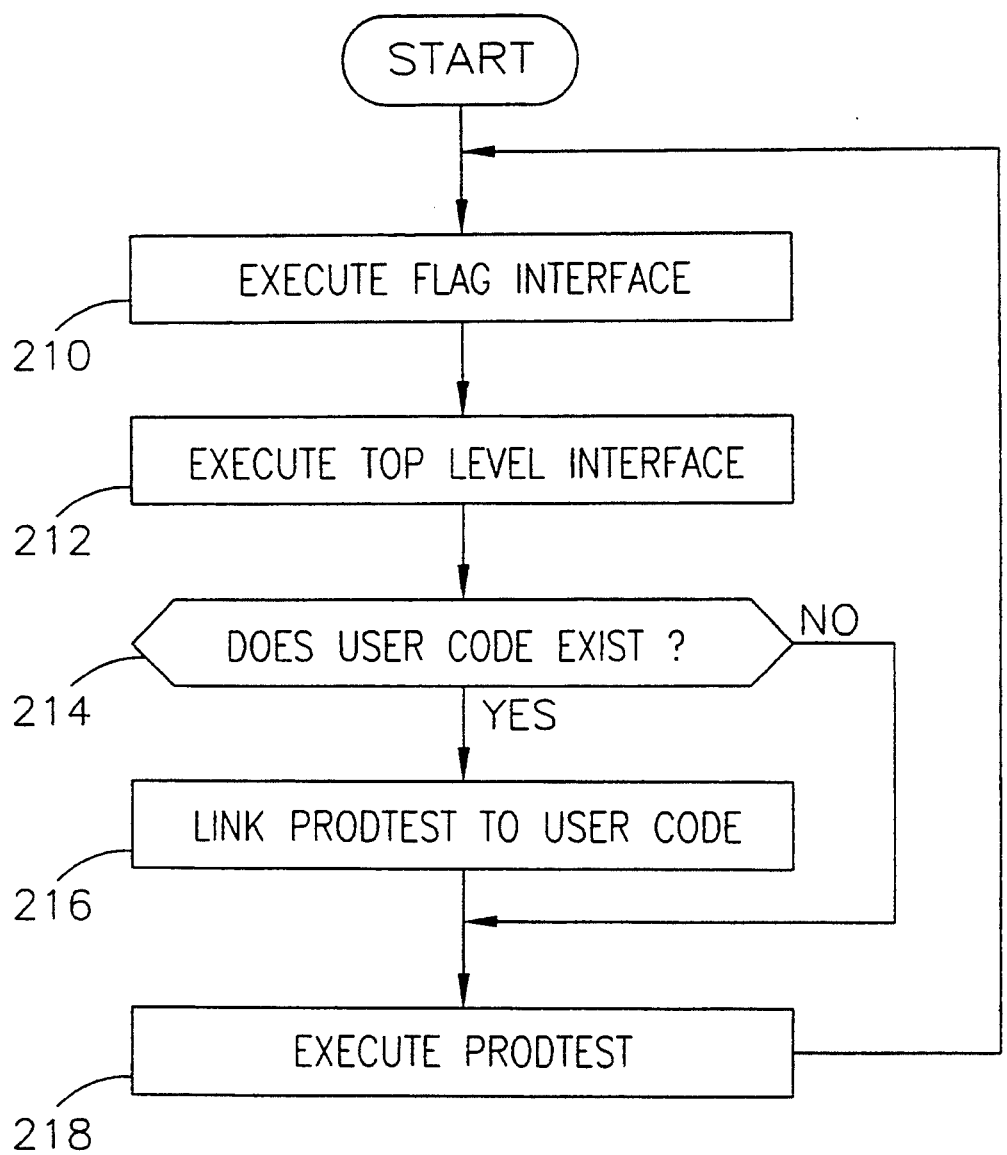
FIG. 2 is a high level flowchart of the method of the invention.

FIG. 2 is a flowchart which illustrates the method of the present invention. In a step 210, the prodshell 110 invokes the flag interface 118. The flag interface displays a graphical interface for facilitating the changing of the flag values in the shared memory 112. The flag interface is described in detail below in the section entitled "Flag Interface."

In a step 212, the prodshell 110 transfers control to the top-level interface 114. The top level interface 114 displays a graphical interface to query the user 113 for initial information needed to test the device. Specifically, the interface 114 queries the user for a lot number identifying the lot (group) of wafers (wafer group) to be tested, an identifier of the person performing the test, a grouping for the type of test to be performed (either production, QA or engineering), the temperature at which the device will be tested, the type of the device, and the test to be performed (either wafer autoprobe, wafer manual, package handler 122 or package manual), and an identifier of the type of part being tested and of the configuration file 128. The top-level interface 114 is described in greater detail below, in the section entitled "Top-level interface."

In a step 214, the prodshell 110 determines whether user code exists. The user code consists of one or more routines written by the user 113 to customize the testshell to a particular test site. If the user code exists, then in a step 216, the prodshell 110 executes a compiler to link the prodtest 120 with the user code. Linking the prodtest 120 and the user code enables the latter to easily communicate with other prodtest 120 modules and variables.

After the step 216 or a negative determination in the step 218, the prodshell 110 transfers control to a process which executes the prodtest 120. After executing the prodtest 120, control of flow of the prodshell 110 returns to the step 210. The method of the prodtest 120 is described below in the section entitled "Prodtest."

Configuration File

The configuration file 128 is a high level test language which allows the user 113 to specify the nature of the testing, binning, and reporting desired for the particular IC device 116 under test. The structure of the configuration file 128 is as follows (lines beginning with "--" are comments):

-- The next few lines contain general information
General information
    Configuration file description string
    Device name
    Device revision
    Test revision
    Test application type
    Test temperature
-- Variables used in the testflow section and in strings --
-- in the pins, levels, timing, user_calibration, and tests sections
Variable declarations and initialization
-- The files that the prodtest may need to use. All but calibration -- are optional
Files
    Wafer download file specification
    Calibration file specification
    Pin attributes file specification
-- Flags can be set here.
Flag specification and initialization
-- Pins, levels, timing, and user calibration are set up here.
Pin configuration specification
Levels specification
Timing specification
User calibration specification
-- These are the vectors that will be loaded into the memory of the tester 126
Vector load specification
-- These are definitions of tests to execute.
Test specification
    A test specification may contain:
        Commands to the tester interface 140
            * Parallel functional tests
            * Scan functional tests
            * AC Parametric tests
            * DC Parametric tests
            * Other
        Operating system command (e.g., HP-UX)
-- AC and DC parameter sets are a high speed test for AC vectors -- or DC measurements. They are a way to avoid reloads by storing -- the tester state for pins, levels and timing in memory. The result is -- fast switching between states
AC parameter sets specification
DC parameter sets specification -- Test suites are the basic units of a test sequence. All the -- characteristics previously defined are brought together in a -- test suite Test suite specification
A test suite specification contains any or all of:
Pins
Timing
Levels
Vectors
Tests
AC parameter sets
DC parameter sets
Local flags
Test suite level
-- Init, abort, pause, reset, user_func and exit are special test suites defined -- in separate sections

| | |
|---|---|
| Init specification -- | Test suite to execute when the diceconf is started |
| Abort specification -- | Test suite to execute when abort is pressed |
| Pause specification -- | Test suite to execute when pause is pressed |
| Reset specification -- | Test suite to execute when reset is pressed |
| User_func specification -- | Test suite to execute when user_func button -- is pressed; the test suite would commonly call -- the user code discussed above |
| Exit specification -- | Test suite to execute when the diceconf is finished |

-- The testflow section sets out how test suites are to be executed

Testflow specification
A programming language with statements
run(test_suite_name );
print(@variable_name);
if expression then statement [else statement]
while expression do statement
repeat statement until expression {statement; [statement;]}@<variable_name> = <expression>@<variable_name>="<string>"@<variable_name> = <string—expression>
;
stop;

-- The binning section specifies how the results of test suites are to be -- used to grade parts.

Binning specification
A set of rules in the following form:

---
if expression bin = "major_bin" "minor_bin";
.
.
.
otherwise bin = "major_bin" "minor_bin";
--- plus:
a list of major bins that are considered good, shippable parts
a list of major bins that are parts to be reprobed if they fail
a mapping of logical bins to physical bins
an assignment of colors to logical bins Both testflow and binning use expressions
Testflow and binning expressions are in this form:
expression operators: ">", ">=", "<", "<=", "==", "!=", "(",")", "and", "or", and "not"
operators used only in testflow: "+", "-", "*", "/", and expression operands
pass(test_suite_name)
fail(test_suite_name)
has_run(test_suite_name)
has_not_run(test_suite_name)
(compound expression) @<variable_name> <real_number> "<string>"

Flag Interface

Overview

The prodshell 110 supports a number of flags which enable the user 113 to change its behavior while it is running. There are essentially three categories of flags. First, system flags control the operation of the prodshell 110 in general. For example, they control the verbosity of output and where the output is sent. Second, user flags are used by the user code and by the user_func routine (described below). Third, test suite flags control the test flow and the type of output sent to the report window, the printer 134, and the report file 132.

The purposes of the flag interface 118 are to (1) allocate and initialize the system flags, and (2) enable the user 113 to change the value of any flag. The flag interface 118 displays a flag interface 118 main menu, and when requested, a system flags menu 304, a user flags menu 306 and a test suite flags menu 308. These menus are shown in FIGS. 3A, 3B, 3C and 3D, respectively.

Figure 3A:
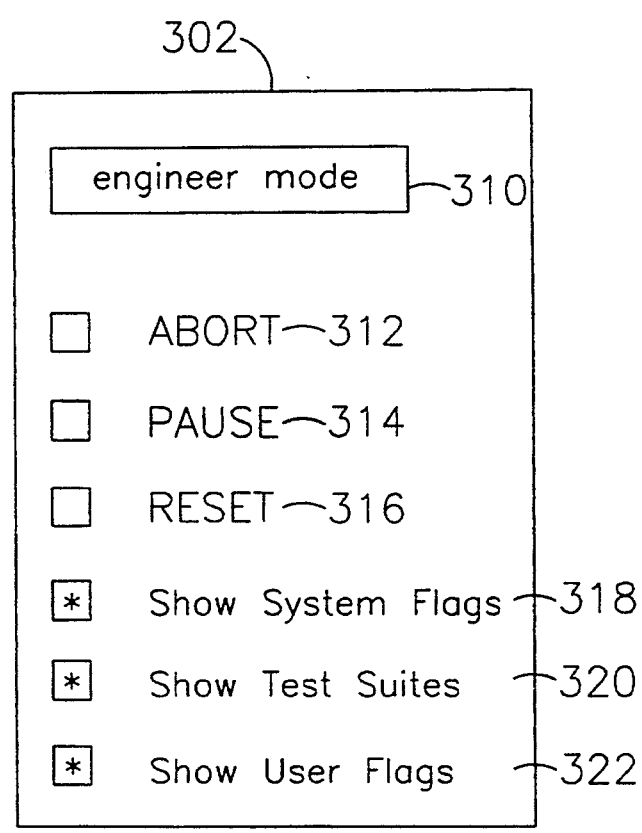
FIGS. 3A, 3B, 3C and 3D show screen displays of a flag interface module 118 of FIG. 1.

Referring to FIG. 3A, the flag interface 118 main menu 302 comprises: a user mode dialog box 310 for enabling the user 113 to change a user mode system flag; and, an abort function 312, pause function 314, and a reset function 316 for enabling the user 113 to change abort, pause, or reset system flags. The flag interface main menu 302 further comprises a show system flags button 318, a show test suites button 320 and a show user flags button 322 for enabling the user 113 to have the system flags menu 304, the show test suite flags menu 308 and the user flags menu 306 displayed.

Figure 3B:
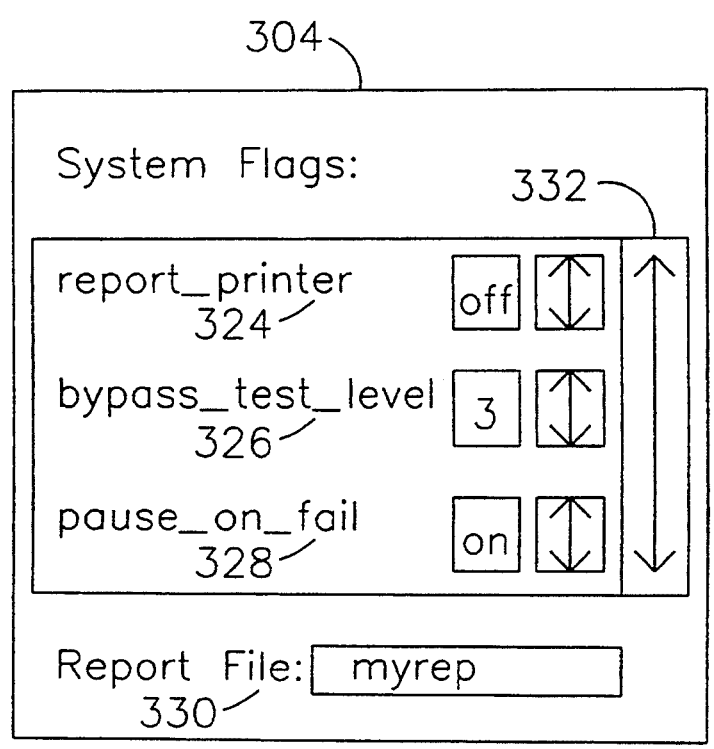

The system flags window 304 of FIG. 3B comprises a report_printer dialog box and slide bar 324, a bypass_test_level dialog box and slide bar 326, a pause_on_fail dialog box and slide bar 328, and a report file dialog box 330. The user 113 may change the value of a particular system flag by clicking on the associated dialog box and either entering a value in the dialog box or clicking on the slide bar to increase, decrease, or toggle its value. The system flags window 304 further comprises a slide bar 332 for scrolling to see additional system flags.

A preferred embodiment of the present invention would have the following system flags (and possibly others):
user_mode: The prodshell 110 operates under several user modes:
operator: This flag indicates the standard production mode, which has minimal capabilities. The operator only has access to abort, pause, and reset buttons 312, 314 and 316.
technician: This flag option represents the next level of capability allowing calibration and other similar functions.
engineer: This flag option allows full access to the prodshell environment for debugging and chip turn-on.

A password is required to go up in user mode capability.

abort: This flag indicates that the abort button 312 was pushed (i.e., that the user 113 clicked on it). The current test running will stop at the next logical place in the testflow, and control of flow will return to the top level interface.

pause: This flag indicates the pause button 314 was pushed. The current testflow being executed will be completed for the current IC device 116 and a pause menu will be displayed. The contents of the pause menu varies depending on whether the IC device 116 is a wafer or a package. In either case, a user_func button provides access to a user_func test suite defined in the device's configuration file 128. The consequences of pressing the pause button 314 are described in greater detail below, in the sections entitled "Prober Controller", "Handler Controller", and "Package Controller".

bypass_test_level: A value of −n will bypass all test suites with a level < =n while +n will bypass all test suites with a level > =n. 0 will bypass no tests.

debug_level: As the value of the debug_level flag increases, more detailed general prodshell 110 execution information is provided.

pause_on_fail: This flag will allow a test to run until a failure occurs, and then the paused state is entered.

report_file: This flag indicates whether reports are to be sent to the report file 132.

report_printer: This flag indicates whether reports are to be sent to the printer 134.

report_window: This flag indicates whether reports are to be sent to a reporting window 138 of the display device 136.

run_all_tests: This flag will allow all defined tests in a test suite to run. If the flag is false, then the test suite will run only until the first test failure.

show_suite: When on, the test suites flag menu 308 will be displayed. This flag is seen on the flag interface 118 menu 302 as the show test suites check box 329.

show_user: When on, the user flags menu 306 will be displayed. This flag is seen on the flag interface 118 menu 302 as the show user flags check box 322.

stop_on_fail: This flag will allow breaking in the middle of a test, and moving to the next test. When on, it could favorably affect test time.

Figure 3C:
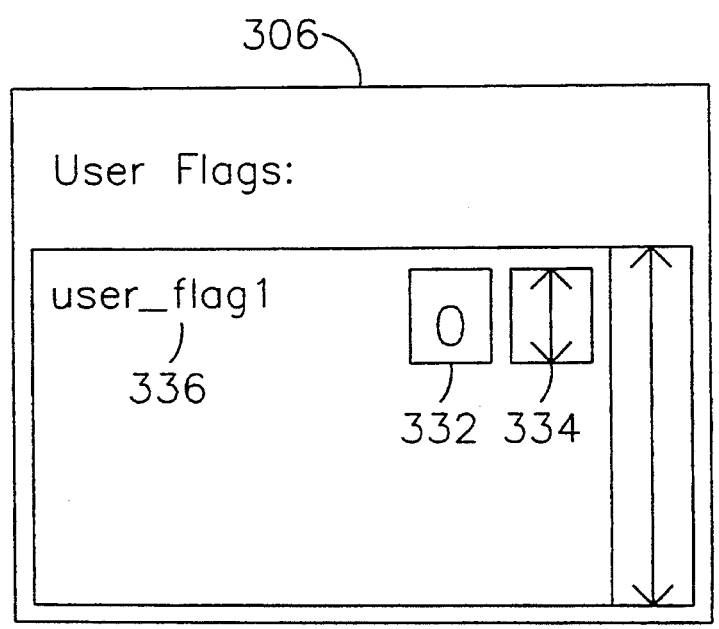

Referring to FIG. 3C, the user flags menu 306 comprises a dialog box 332 and a slide bar 334 for each user flag 336. As with the system flags menu 302, there is a slide bar 332 for causing the window to display additional user flags by scrolling the user flags menu 306. The user flags are defined in the configuration file 128, as is explained above in the section entitled "Configuration File".

Figure 3D:
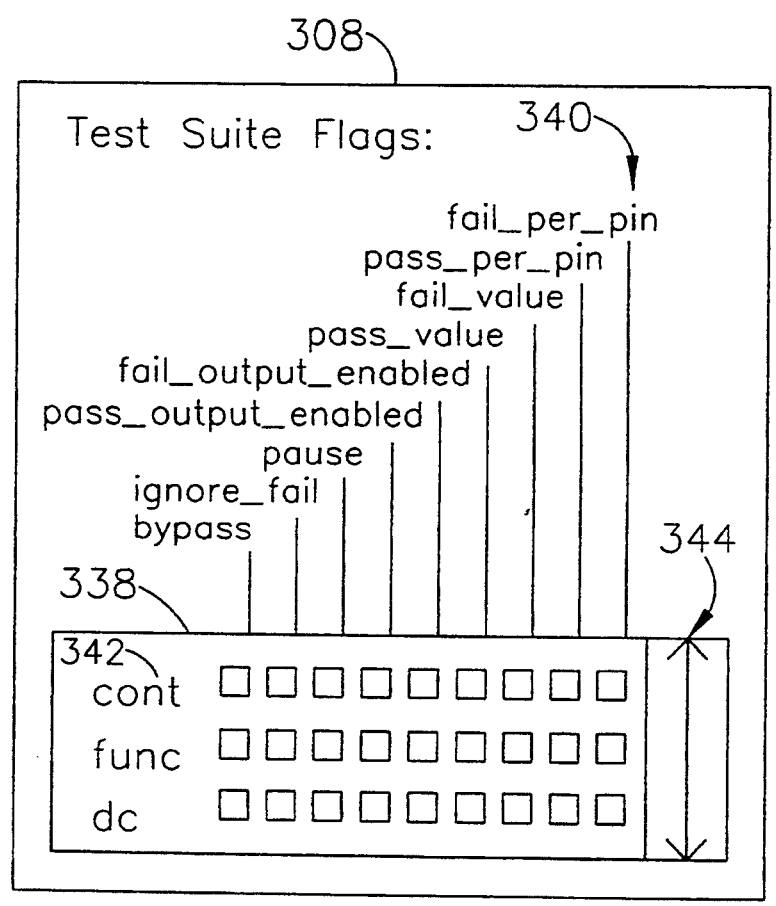

Referring to FIG. 3D, the test suite flags menu 308 comprises a grid of check boxes 338, the columns of which are identified by flag names 340 and the rows of which are identified by test suite names 342. The test suite flags menu 308 further comprises a slide bar 344 for scrolling that menu.

A preferred embodiment of the present invention would have the following test suite flags for each test suite (and possibly others):

bypass: Allows bypassing this test suite.

ignore_fail: Allows ignoring a failure in this test suite.

pause: Allows pausing the system before running this test suite to access a tester interface 140 of the tester 126.

pass_value: This flag causes a value, rather than a mere pass/fail indication, to be output.

fail_value: Outputs values for failed pins instead of just pass/fail.

pass$_{13}$ per_pin: Output passed information on a per pin rather than a pin list basis.

fail_per_pin: Output failed information on a per pin rather than a pin list basis.

Generally speaking, a module called a widget is associated with each button and dialog box. Accordingly, the buttons and dialog boxes of FIGS. 3A, 3B and 3C illustrate not only the flag interface 118's menus, but also its structure. Such is the case for all other menus described in this document as well.

Flag Interface Operation

Figure 4:
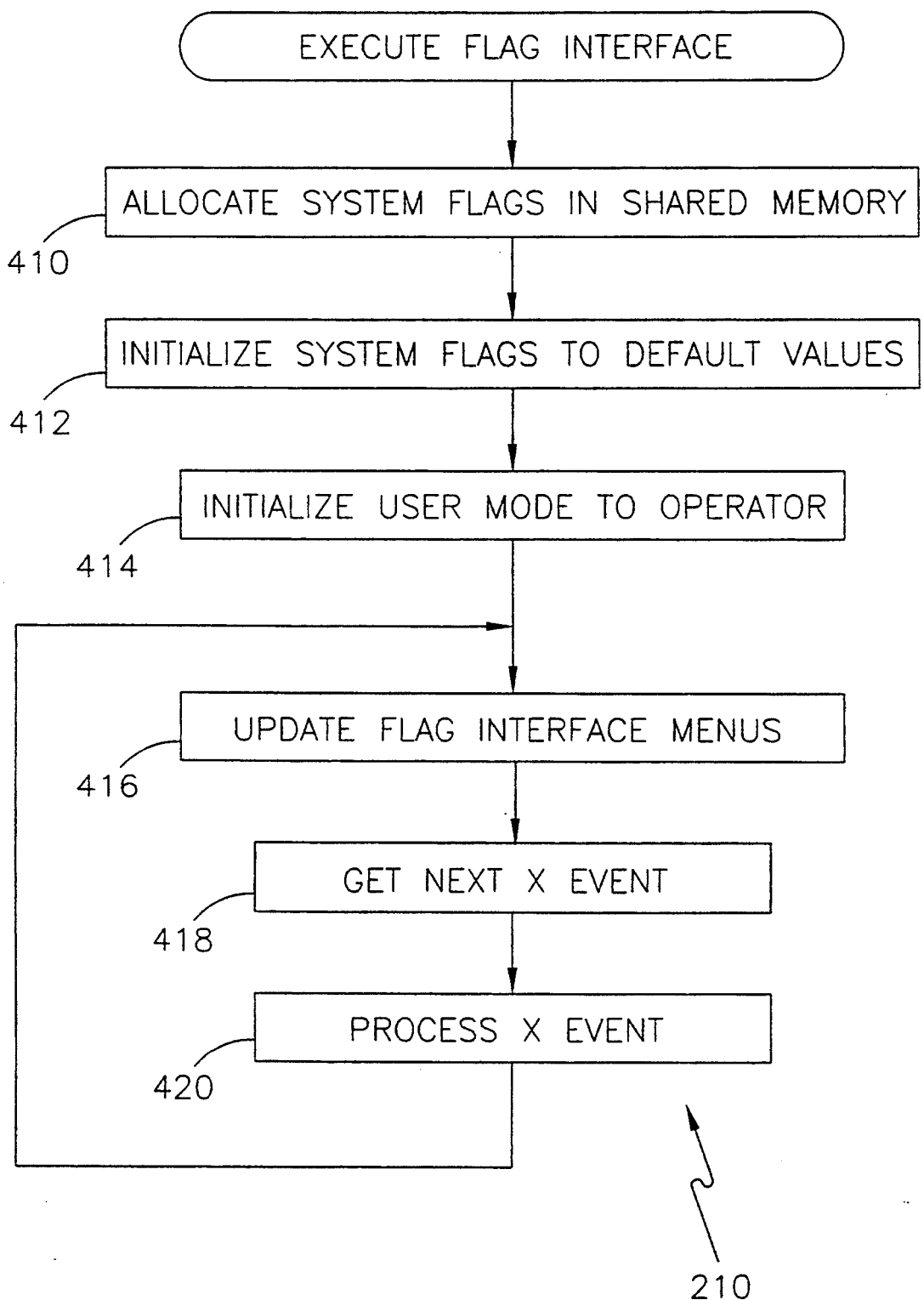
FIG. 4 shows a block diagram of the flag interface module 118 of FIG. 1.

FIG. 4 is a flowchart of the flag interface 118 menu in carrying out the step 210 of executing the flag interface 118. In a step 410, the flag interface 118 allocates space for the system flags in the shared memory 112. In the step 412, the flag interface 118 initializes the system flags to appropriate default values. In a step 414, the flag interface 118 initializes the user mode to "operator." In a step 416, the flag interface 118 updates the flag interface 118 menus. The method of menu updating is described in detail in FIGS. 5A and 5B and the accompanying text. The flag interface 118 then waits for a response from the user 113, which it receives in the form of an X event.

Once it receives an X event (in a step 418), then in a step 420 the flag interface 118 processes it. The step 420 is explained in greater detail in FIGS. 6A and 6B and the accompanying text.

Figure 5A:
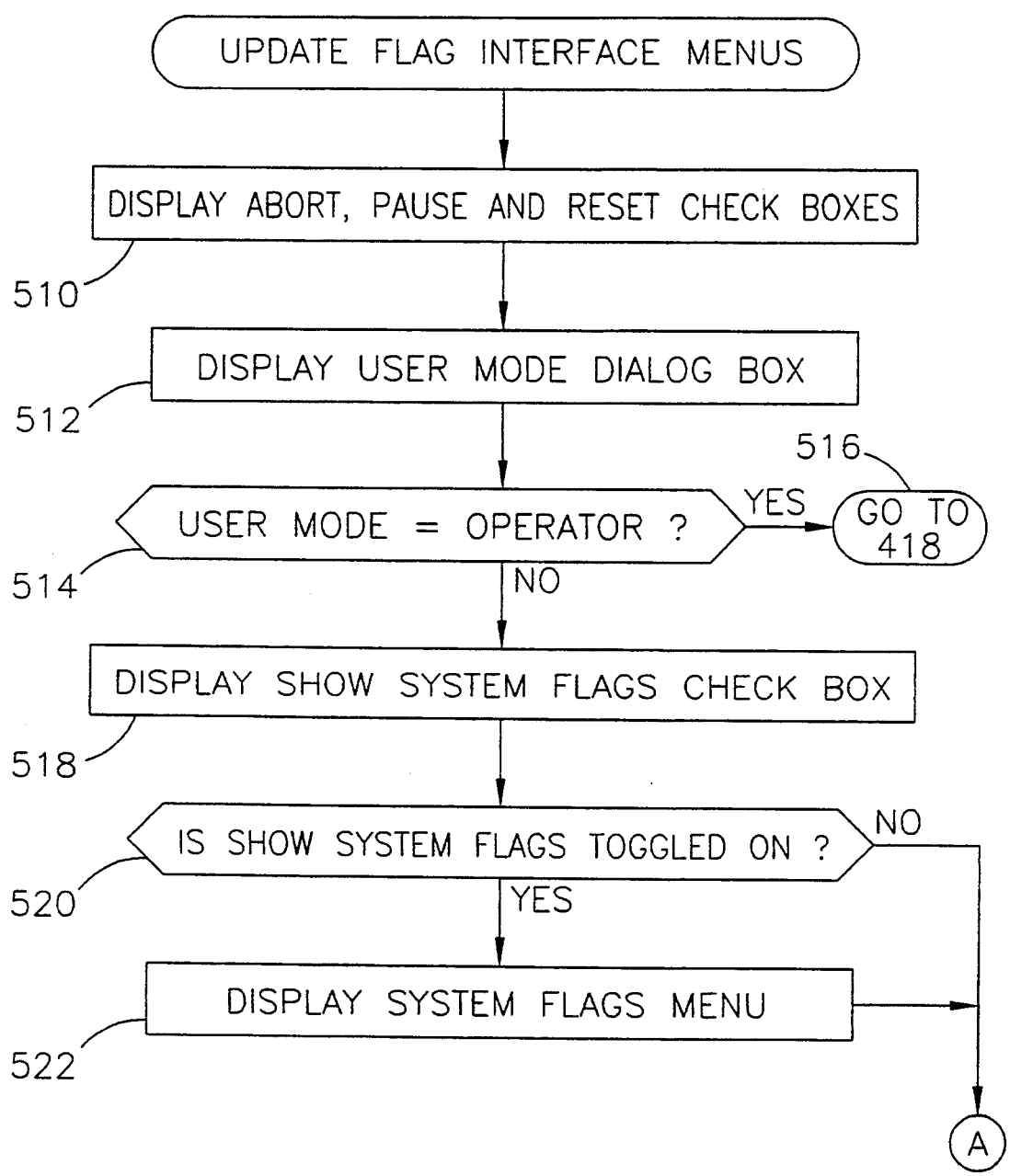
FIGS. 5A and 5B show a flowchart of a step 416 of FIG. 4 of updating the flag interface menus.
Figure 5B:
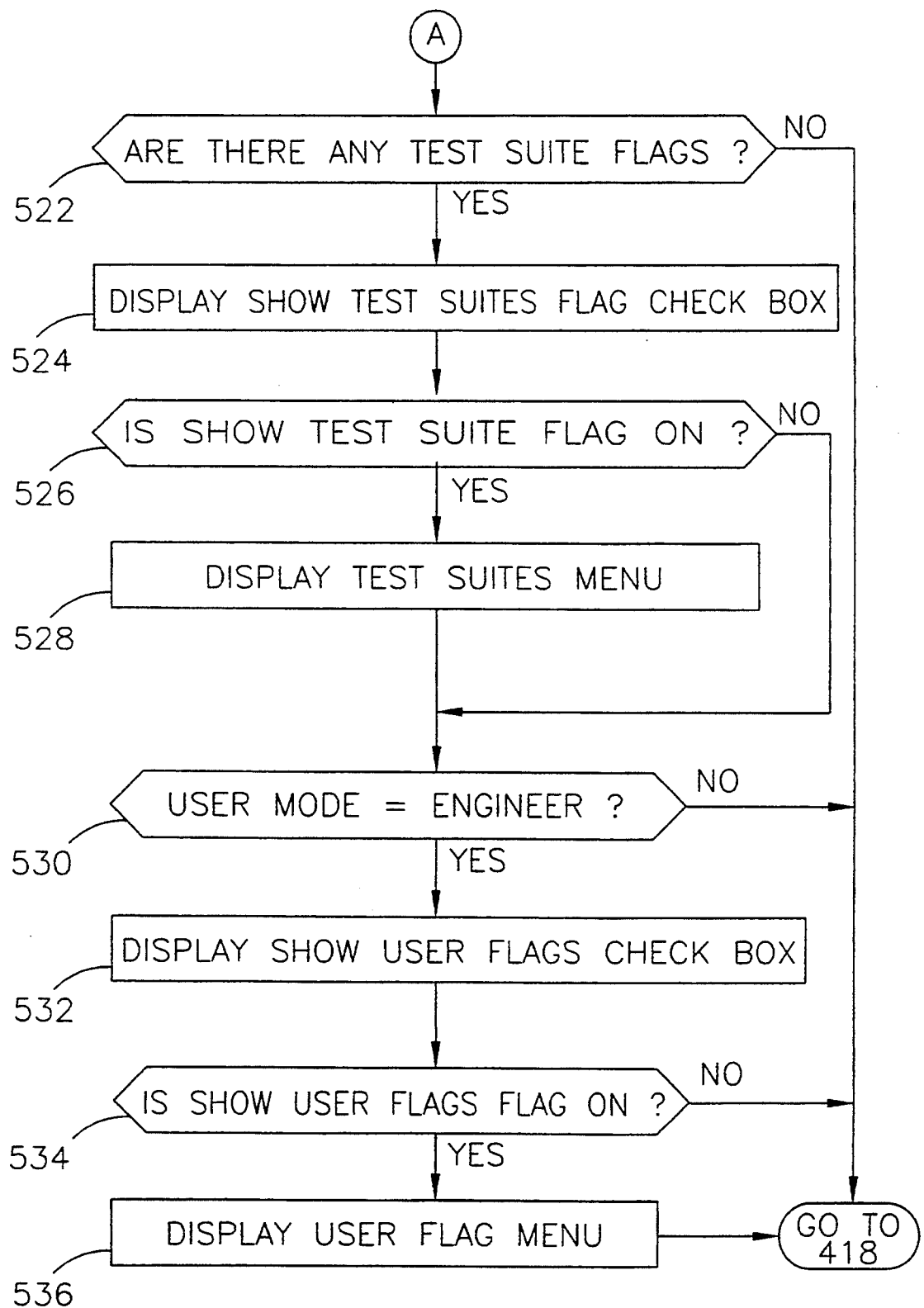

FIGS. 5A and 5B show a flowchart of the method of a flag menus update widget in carrying out the step 416 of updating the flag interface 118 menus. Referring to FIG. 5A, in a step 510 the flag window update widget displays the abort button 312, the pause button 314 and the reset button 316, along with their associated values. It determines their values by examining the shared memory 112. Note that these values are initially set to false.

In a step 512, the flag menus update widget displays the user mode dialog box 310 with the current user mode indicated therein (initially operator). It determines this value from the user_mode flag in the shared memory 112.

In a step 514, the flag menus update widget determines whether the requested user mode is "operator". If so, the flag window update widget has finished, and control of flow returns to the step 418. (See step 516.)

Otherwise, the flag menus update widget operates as follows. In a step 518, it displays the show system flags check box 318 and an indication of whether it is on or off. If the value is on, then (according to a step 520) the flag menus update widget carries out a step 522.

In the step 522, the flag menus update widget invokes the system flags widget to display the system flags menu 304. The system flags widget determines the flag values to display in the window by consulting the shared memory 112.

After the step 522, or a negative determination in the step 520, the flag menus update widget determines (in a step 524 of FIG. 5B) whether there are any test suite flags. If so, then in a step 524 it displays the show test suites check box 320 and its value (determined from the show_suite flag in the shared memory 112). If the flag is on (see step 526), then in a step 528 a test suites widget displays the test suites menu 308. The test suites widget does so by examining the shared memory 112 to determine which test suite flags are defined and to determine the values associated with the test suite flags.

After the step 528, or a negative determination in the step 526, in a step 530 the flag menus update widget determines whether the user mode is "engineer". If so, then the flag menus update widget operates as follows. In a step 532, it displays the show user flags check box and its value (determined from the show_user flag in the shared memory 112). If that value is on (see step 534), then in a step 536 a user flags widget displays the user flags menu 306. The user flags widget determines the user flags and their values by examining the shared memory 112. Next, or after a negative determination any of in the steps 522, 530 or 534, control of flow returns to the flag interface 118 widget at the step 418.

Figure 6A:
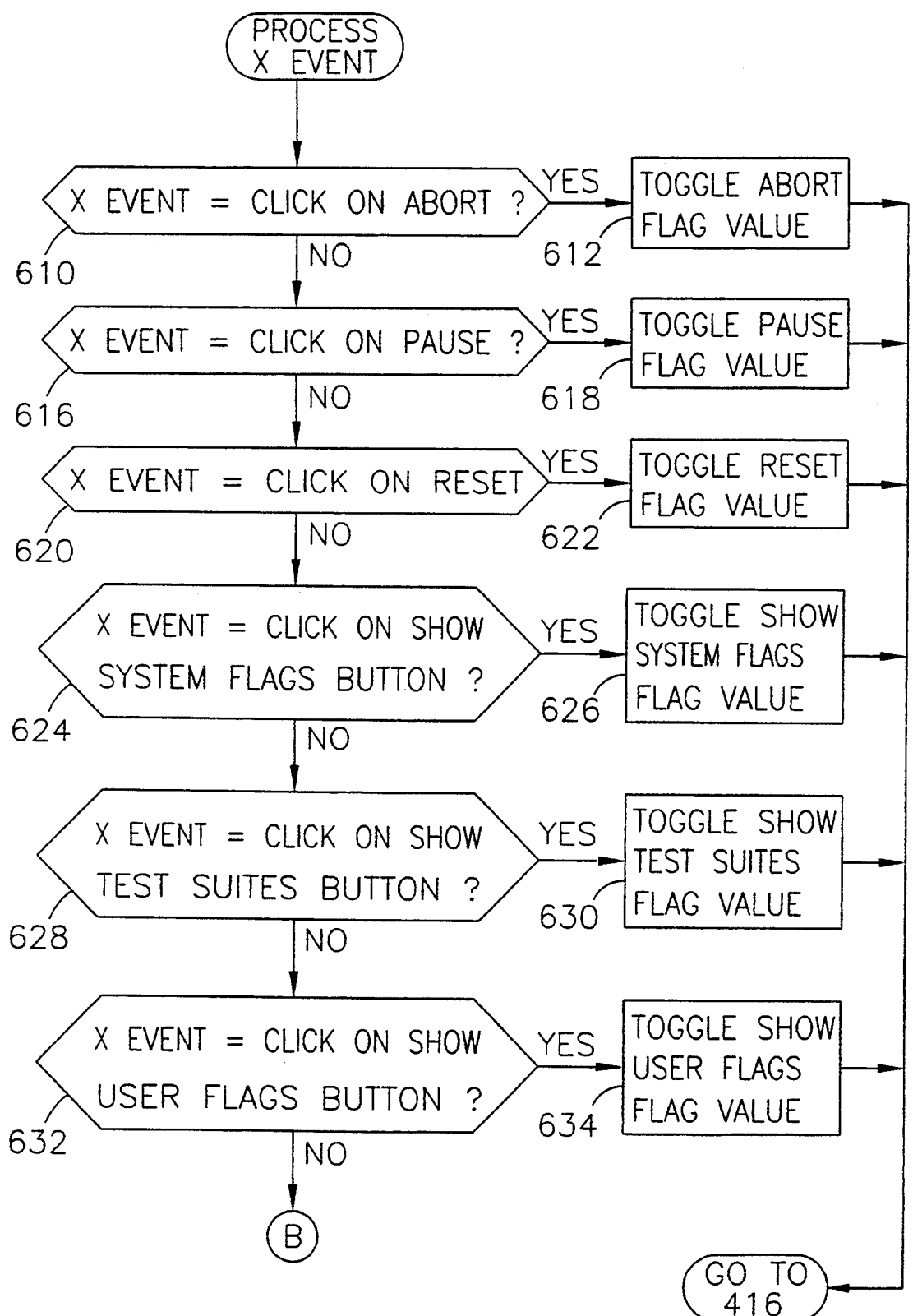
FIGS. 6A and 6B show a flowchart for the method of a step 420 of FIG. 4 of processing an X event.
Figure 6B:
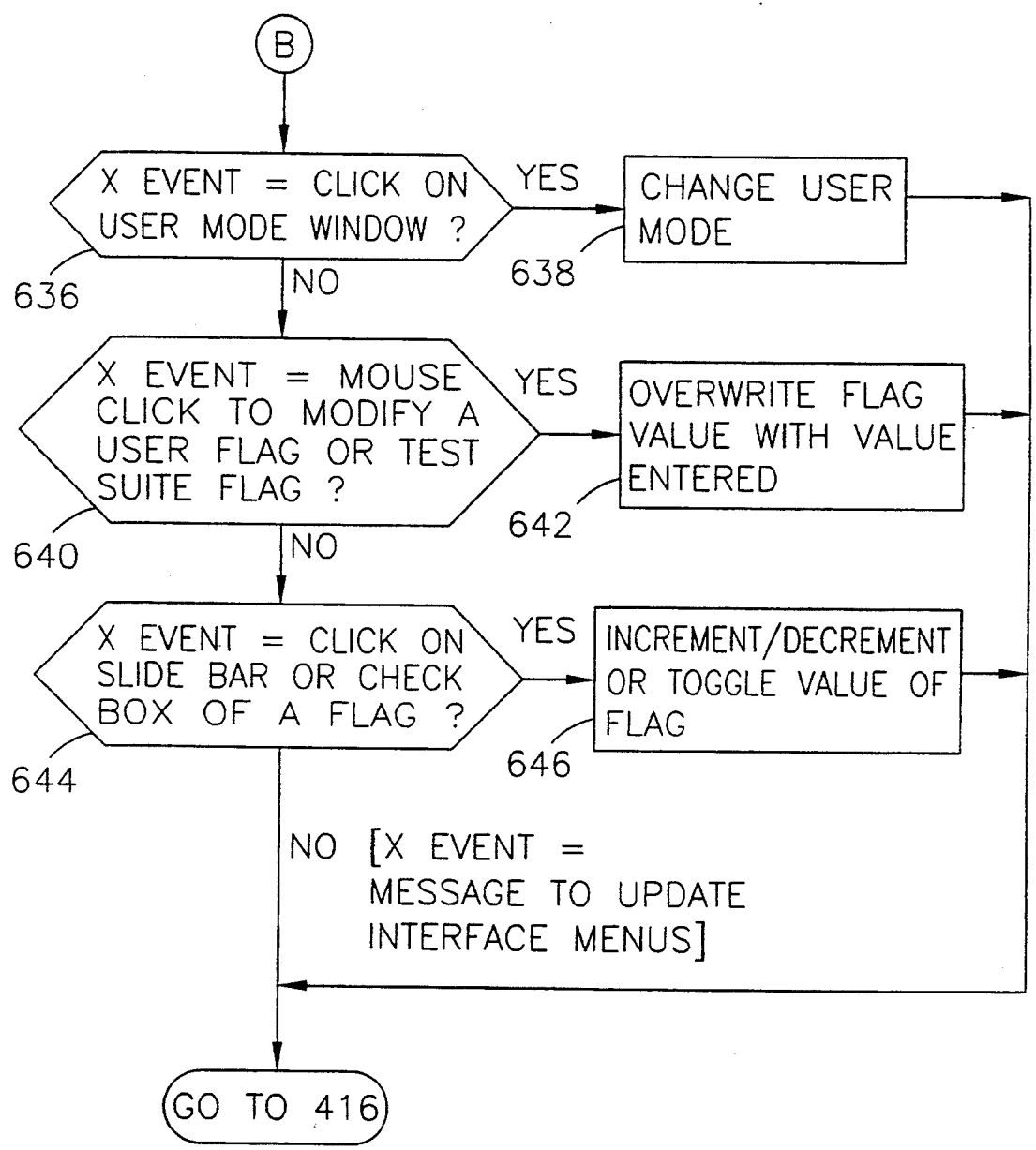

FIGS. 6A and 6B show a flowchart of the method of the flag interface 118 widget in carrying out the step 420 (processing an X event). Referring to FIG. 6A, in a step 610, the flag interface 118 widget determines whether the X event was a mouse click on the abort button 312. If so, then in a step 612, an abort widget toggles the abort flag in the shared memory 112.

Otherwise, in a step 616, the flag interface 118 widget determines whether the X event was a click on the pause button 314. If so, then in a step 618, a pause widget toggles the value of the pause flag in the shared memory 112.

After a negative determination in the step 616, in a step 620, the flag interface 118 widget determines whether the X event was a click on the reset button 316. If so, then a reset widget toggles the value of the reset flag in the shared memory 112.

After a negative determination in the step 620, in a step 624, the flag interface 118 widget determines whether the X event was a click on the show system flags check box 318. If so, then a show system flags widget toggles the value associated with the show system flags check box 318.

If the determination in the step 624 was negative, then in a step 628, the flag interface 118 widget determines whether the X event was a click on the show test suites check box 320. If so, then in a step 630, a show test suites widget toggles the show_suite flag in the shared memory 112.

If the determination in the step 628 was negative, then in a step 632, the flag interface 118 widget determines whether the X event was a click on the show user flags check box 320. If so, then in the step 634, a show user flags widget toggles the value of the show_user flag in the shared memory 112.

Figure 7:
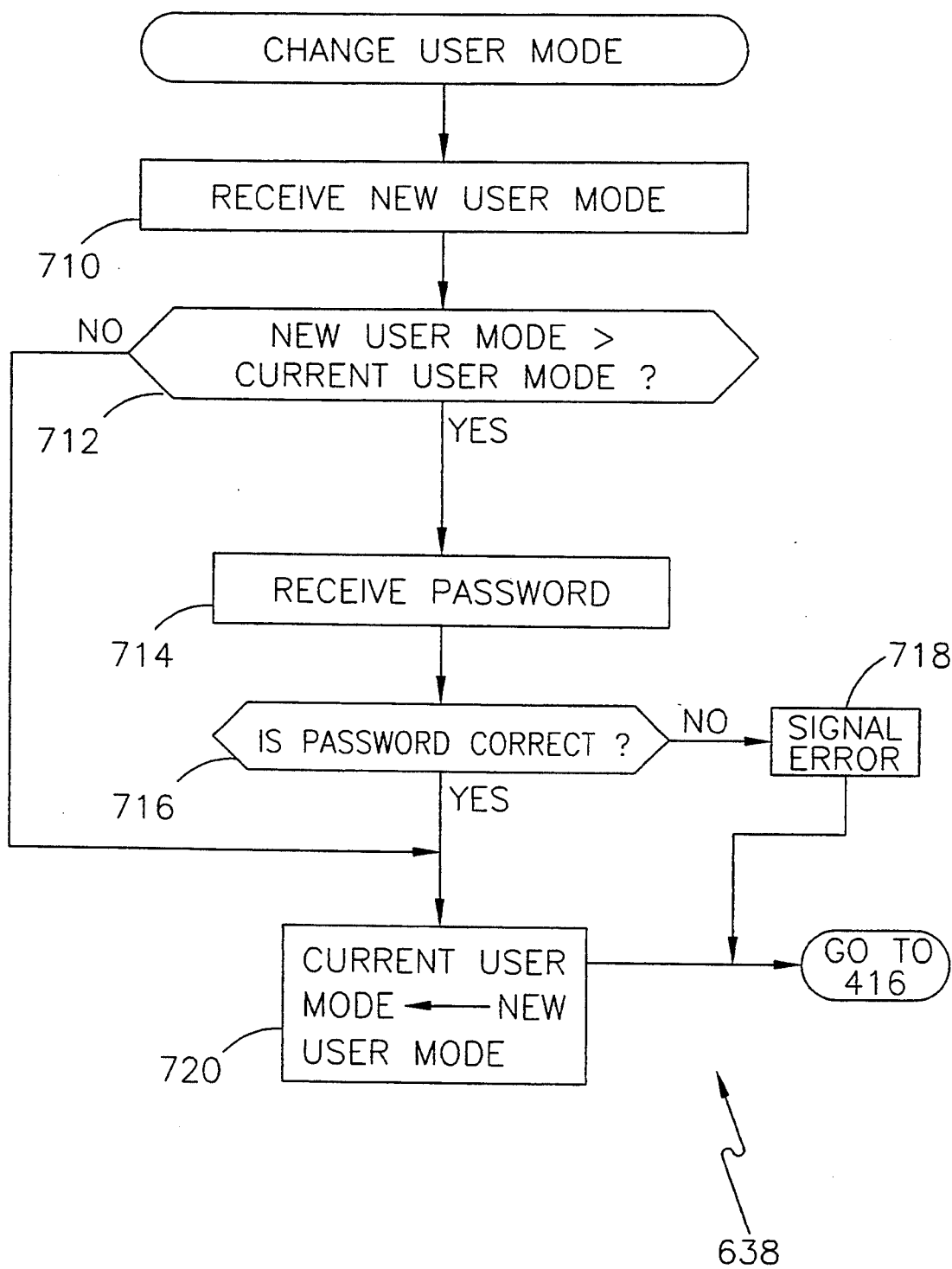
FIG. 7 shows a flowchart of the method of a step 638 of FIG. 6B of changing the user mode.

If the determination in the step 632 was negative, then in a step 636 of FIG. 6B, the flag interface 118 widget determines whether the X event was a click on the user mode dialog box 310. If so, then in a step 638, a user mode widget attempts to change the user mode. The operation of the user mode widget is described in detail below and is shown in FIG. 7.

If the determination in the step 636 was negative, then in a step 640, the flag interface 118 widget determines whether the X event was a click on the dialog box 332 or a click on a check box in the grid of check boxes 338. If so, then in a step 642, the value of the associated flag in shared memory is overwritten with the value in the dialog box.

After a negative determination in the step 640, the flag interface 118 window determines whether the X event was a click on the slide bar associated with a flag. If so, then in step 646, the flag interface 118 executes the widget associated with the flag to increment, decrement or toggle the value in the shared memory 112.

If the determination in the step 648 was negative, then the X event must have been a message indicating that the value of a flag has changed. In that case, the flag interface 118 widget need only update the flag interface 118 windows.

Accordingly, after a negative determination in the step 648, or after the steps 612, 618, 622, 626, 630, 634, 638, 642 or 646, control of flow returns to the flag interface 118 widget at the step 416.

FIG. 7 is a flow chart which shows the method of the user mode widget in carrying out the step 638 of FIG. 6B. Referring to FIG. 7, in a step 710, the user mode widget receives the requested user mode from the user mode dialog box 310. In a step 712, the user mode widget determines whether the value associated with user mode received is greater than the current user mode. (The value of "operator" is 0; the value of "technician" is 1; and the value of "engineer"is 2.) If so, then the user mode widget operates as follows.

In a step 714, the user mode widget receives a password from the user 113. In a step 716, it determines whether the password is correct. That is, it determines whether the text entered matches the password authorized for the user mode requested. If not, then in a step 718, the user mode widget signals an error, and control of flow returns to the flag interface 118 widget at the step 416.

After a negative determination in the step 712 or a positive determination in the step 716, the user mode widget (in a step 720) sets the user_mode flag to the value corresponding to the requested user mode. Control of flow then returns to the flag interface 118 widget at the step 416.

Top Level Interface

Figure 8:
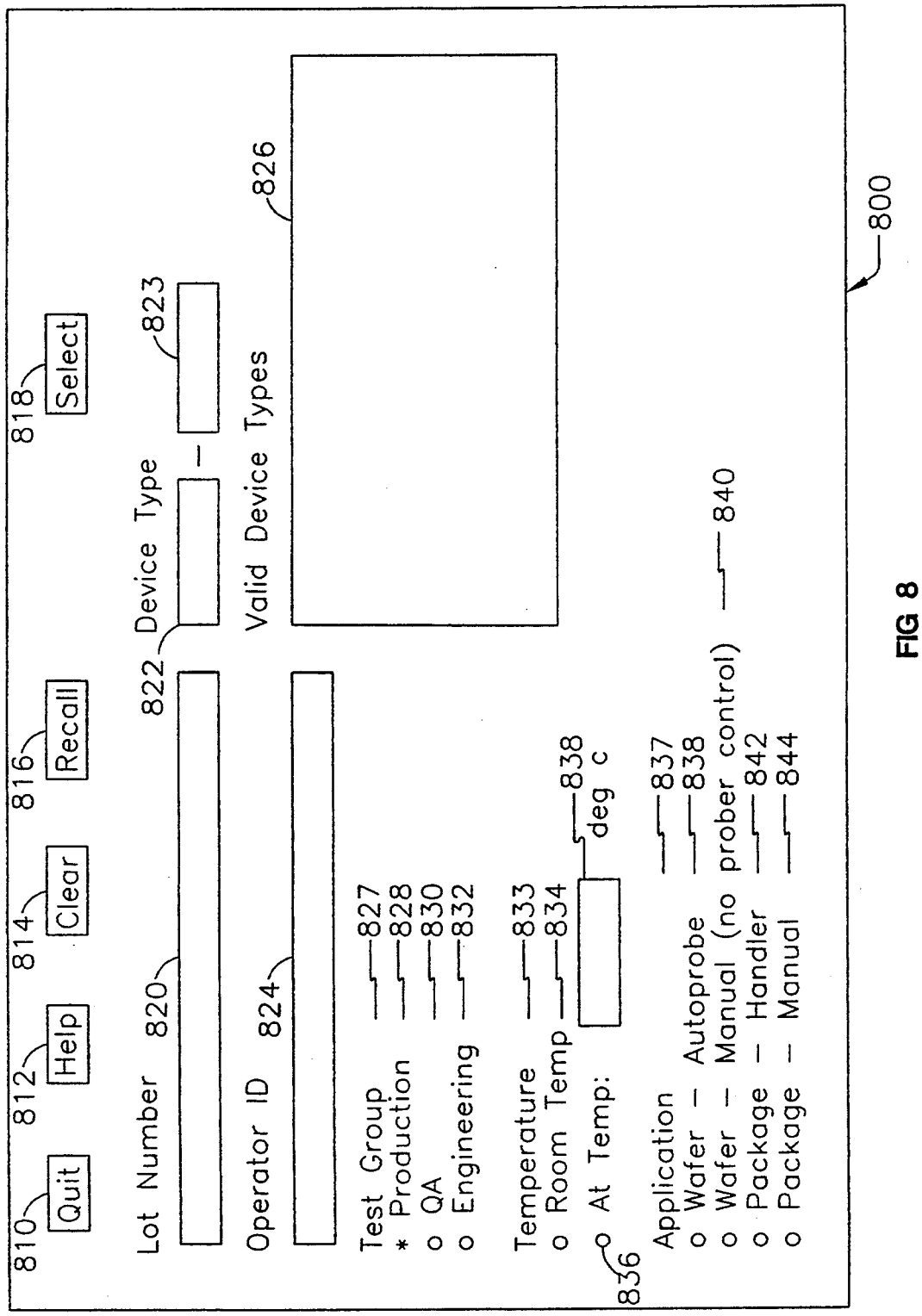
FIG. 8 shows a menu displayed by a top level interface 114 of FIG. 1.

After invoking the flag interface 118 (see the step 210 of FIG. 2), the prodshell 110 executes the top level interface to query the user 113 for information needed to test the IC device 116 (see the step 212). The top level interface presents a top level menu 800 as shown in FIG. 8. Looking at FIG. 8, the top level menu 800 comprises a quit button 810, a help button 812, a clear button 814, a recall button 816 and a select button 818. The buttons perform the following functions. The quit button 810 terminates the top level interface. The help button 812 provides on-line help capability. The clear button 814 clears the entries in the dialog boxes and check boxes of the top level menu 800. The recall button 816 recalls the last valid entry for a lot number, device type, device suffix, and operator ID (each of which is described below). The select button 818 verifies the correctness and completeness of all data entered on the top level menu 800 and writes the data to the shared memory 112. The functions of the buttons are described in greater detail in FIG. 9 and the accompanying text.

The top level menu 800 further comprises a lot number dialog box 820, a device type dialog box 822, a device suffix box 823, an operator ID dialog box 824 and a valid device types box 826.

The lot number is a site-specific identifier for a lot (i.e., a group) of IC devices to be tested. The top level interface has an environment variable which enables the user 113 to specify a format for the lot number. The device type is the type of the IC device 116. The device suffix specifies the configuration file 128 to be used in testing the IC device 116.

The top level menu 800 further comprises test group check boxes 827, temperature boxes 833 and application check boxes 837. The test group check boxes 827 enable the user 113 to specify the type of test to be performed by selecting the production check box 828, the QA check box 830, or the engineering check box 832.

The temperature boxes 833 enable the user 113 to specify the temperature at which the part will be tested by either selecting a room temperature check box 834 or an at temperature check box 836. If the user 113 selects the latter, he or she would then enter the desired temperature (e.g., in degrees Celsius) in a temperature dialog box 838.

With the application check boxes 837, the user 113 specifies whether the IC device 116 is a die on a wafer or a package part, and whether the tests will be carried out manually. Specifically, the user 113 selects a wafer autoprobe check box 838, a wafer manual check box 840, a package handler 122 check box 842, or a package manual check box 844.

Top Level Interface Operation

Figure 9:
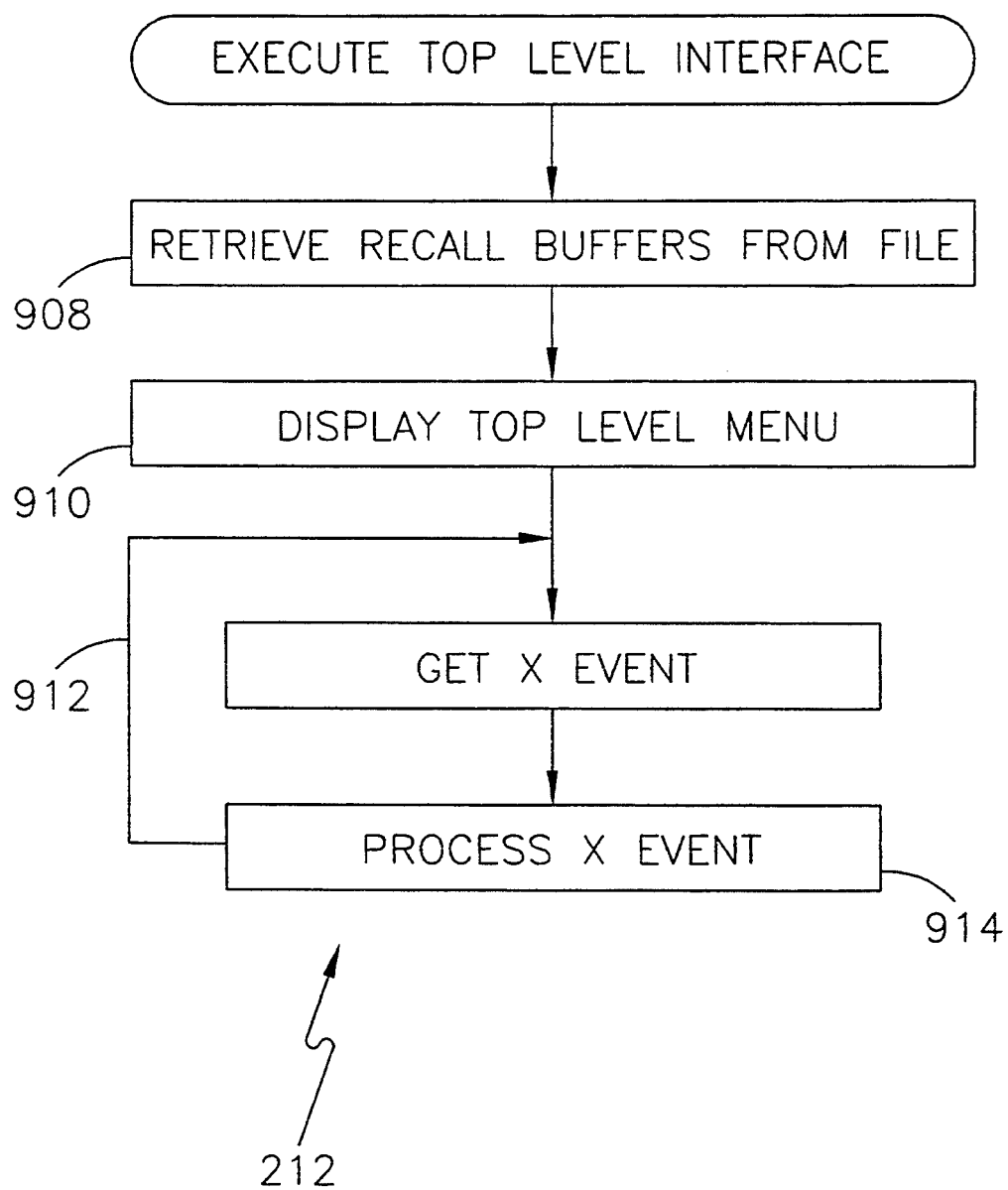
FIG. 9 shows a high level flowchart of the method of the top level interface in of FIG. 1.

FIG. 9 shows a high level flow chart of the method of the top level interface. Looking at FIG. 9, in a step 908 the top level interface retrieves joint and independent recall buffers from a file. The joint recall buffer is a circular buffer which stores the last ten valid entries selected for the lot number, device type, device suffix and operator ID. Each independent recall buffer is a circular buffer which stores the last ten valid entries for either the lot number, the device type, the device suffix or the operator ID. Upon termination of the top level interface, the recall buffers will be written to a file. Accordingly, the recall buffers "remember" entries from previous sessions of the top level interface. Next, in a step 910, the top level interface displays the top level menu 800. The top level interface then waits for a response from the user 113 in the form of an X event. The top level interface receives the X event in a step 912, and processes it in a step 914. After the step 914, control of flow returns to the step 912 to process additional X events.

Figure 10A:
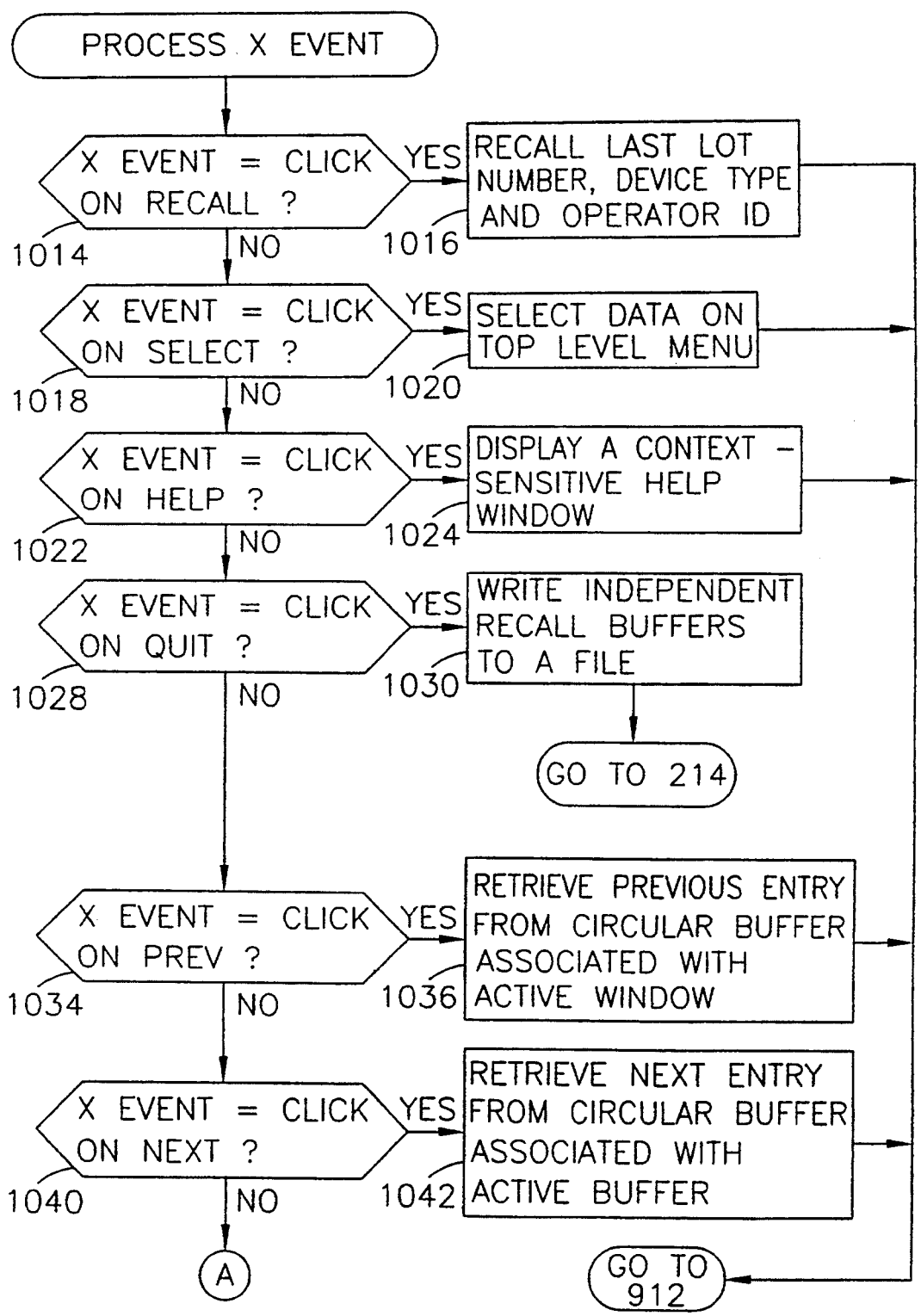
FIGS. 10A and 10B show a flowchart of the method of a step 914 of FIG. 9 of processing an X event.
Figure 10B:
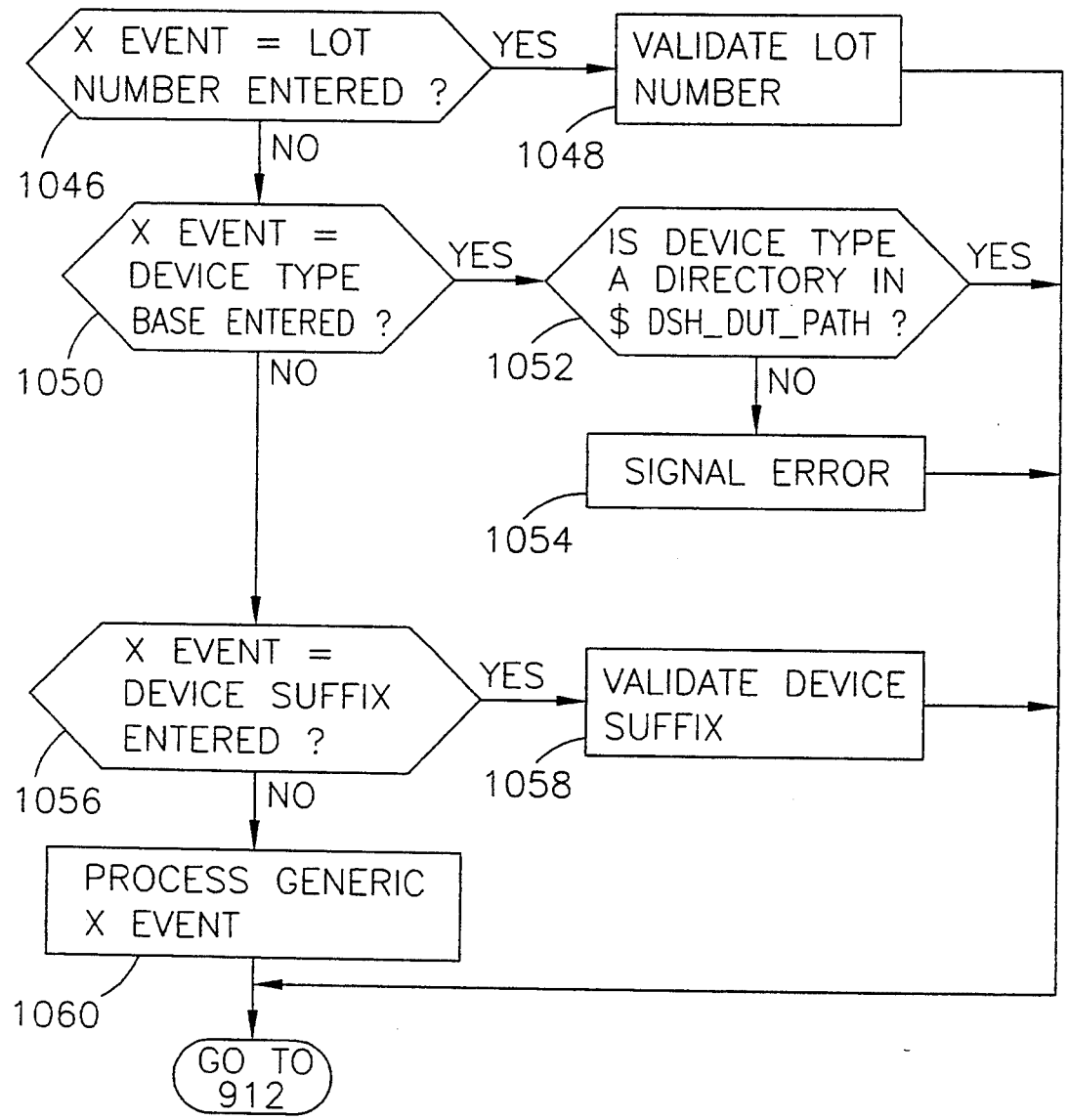

FIGS. 10A and 10B show a flow chart which illustrates the method of the top level interface in carrying out the step 914. In a step 1014 of FIG. 10A, the top level interface determines whether the X event was a mouse click on the recall button 816. If so, then in a step 1016, a recall widget displays the last valid entry for the lot number, device number, device suffix and operator ID in the corresponding dialog boxes. It determines the entries from the joint recall buffer.

Figure 12:
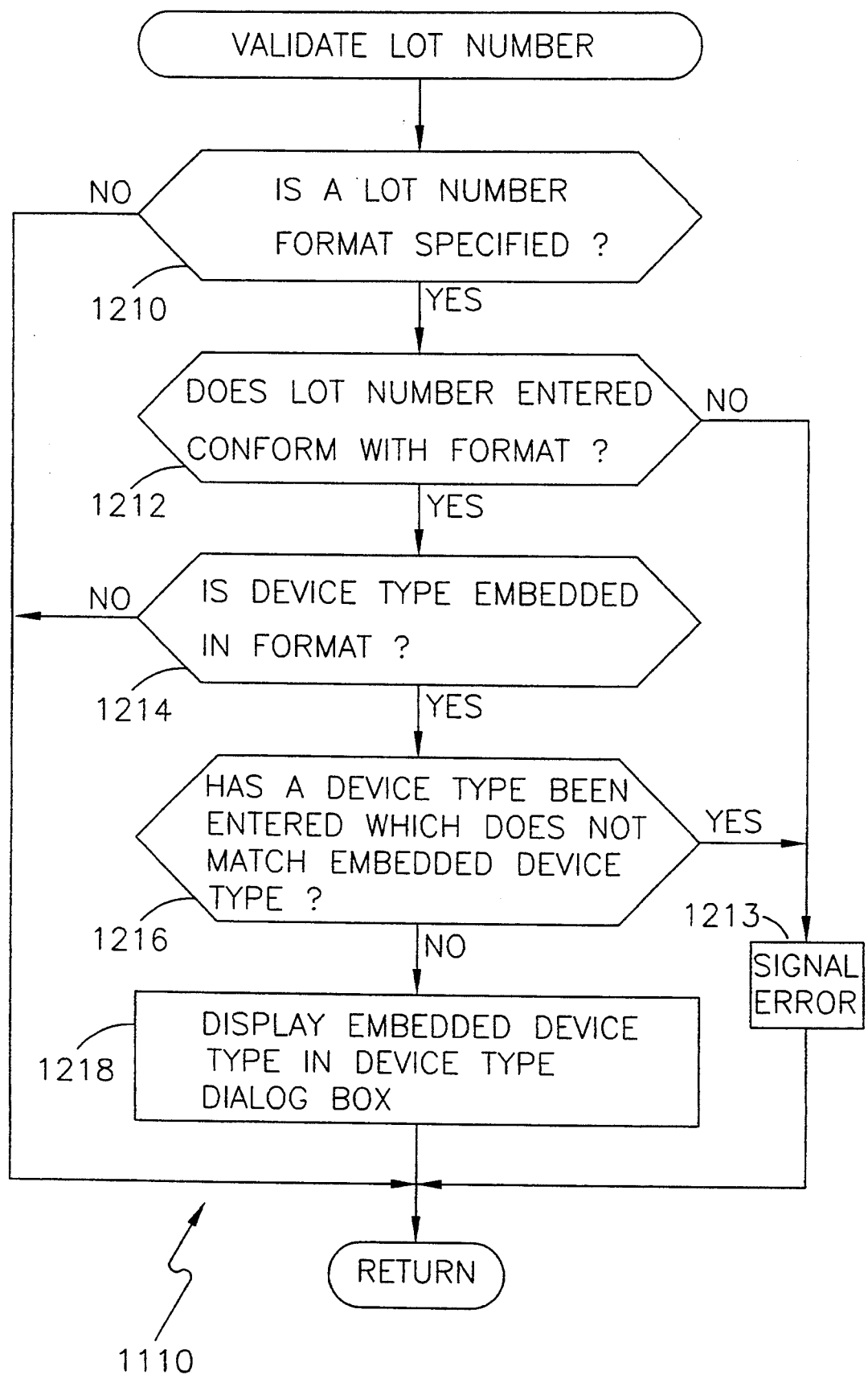
FIG. 12 shows a flowchart of the method for a step 1110 of FIG. 11 of validating a lot number.

Otherwise, in a step 1018, the top level interface determines whether the X event is a mouse click on the select button 818. If so, then in a step 1020 a select widget selects the data on the top level interface menu 800. FIG. 12 shows a flow chart of the detailed method by which the select widget carries out the step 1020.

After a negative determination in the step 1018, then in a step 1022 the top level interface determines whether the X event was a mouse click on the help button 812. If so, then in a step 1024, the help widget displays a context-sensitive help message.

After a negative determination in the step 1022, then in step 1028 the top level interface determines whether the X event is a mouse click on the quit button. If so, then in a step 1030 a quit widget writes the independent recall buffers to a file so that their contents are "remembered" between sessions of the top level interface. The quit widget then terminates the top level interface and returns a "quit" status to the prodshell 110 at the step 214.

After a negative determination in the step 1028, then in a step 1034 the top level interface determines whether the X event was a press of a "prev" (i.e., previous) key on the keyboard. If so, then in a step 1036 a prev widget retrieves the previous entry from the individual recall buffer associated with the active dialog box.

After a negative determination in the step 1034, then in a step 1040 the top level interface determines whether the X event was a press on the "next" key. If so, then in a step 1042, a next widget retrieves the next entry from the independent buffer associated with the active dialog box. The operation of the next widget is similar to the prev widget, except that the next widget steps forward through the appropriate individual recall buffer.

After a negative determination in the step 1040, then in a step 1046 (of FIG. 10B) the top level interface determines whether the X event was a request to validate a lot number. That is, it determines whether the X event was either a press of the return key after clicking on the lot number dialog box 2432, or a message from the select widget requesting lot number validation. If so, then in a step 1048, a lot number widget validates the lot number in the dialog box. The method by which the lot number widget carries out the step 1048 is described in greater detail below with reference to FIG. 12.

After a negative determination in the step 1046, then in a step 1050 the top level interface determines whether the X event was a request to validate a device type. That is, it determines whether the X event was (1) a press of the return key after clicking on the device type dialog box or (2) a message from the select widget requesting a device type validation. If the X event was either (1) or (2) then in a step 1052, the base device type widget determines whether the data in the device type window is the name of the directory path stored in the environment variable "$DSH_DUT_PATH". If not, then in a step 1056 the device type widget indicates that the device type entered is invalid.

After a negative determination in the step 1050, then in a step 1056 the top level interface determines whether the X event was a request to validate a device suffix. In other words, it determines whether the X event was: (1) a press of the return key after clicking on the device suffix window or (2) a device suffix verification request from the select widget. If the X event was either (1) or (2), then in a step 1058, a device suffix widget validates the device suffix. The method by which the device suffix widget carries out the step 1058 is described in FIG. 12 and the accompanying text.

If the X event was none of those listed above, then in a step 1060 an appropriate widget processes the event in a conventional manner.

Finally, after any one of the steps 1016, 1024, 1030, 1036, 1042, 1048, 1054, 1058, or 1060, or after a positive determination in the step 1052, control of flow returns to the top level interface at the step 912 of FIG. 9.

Figure 11:
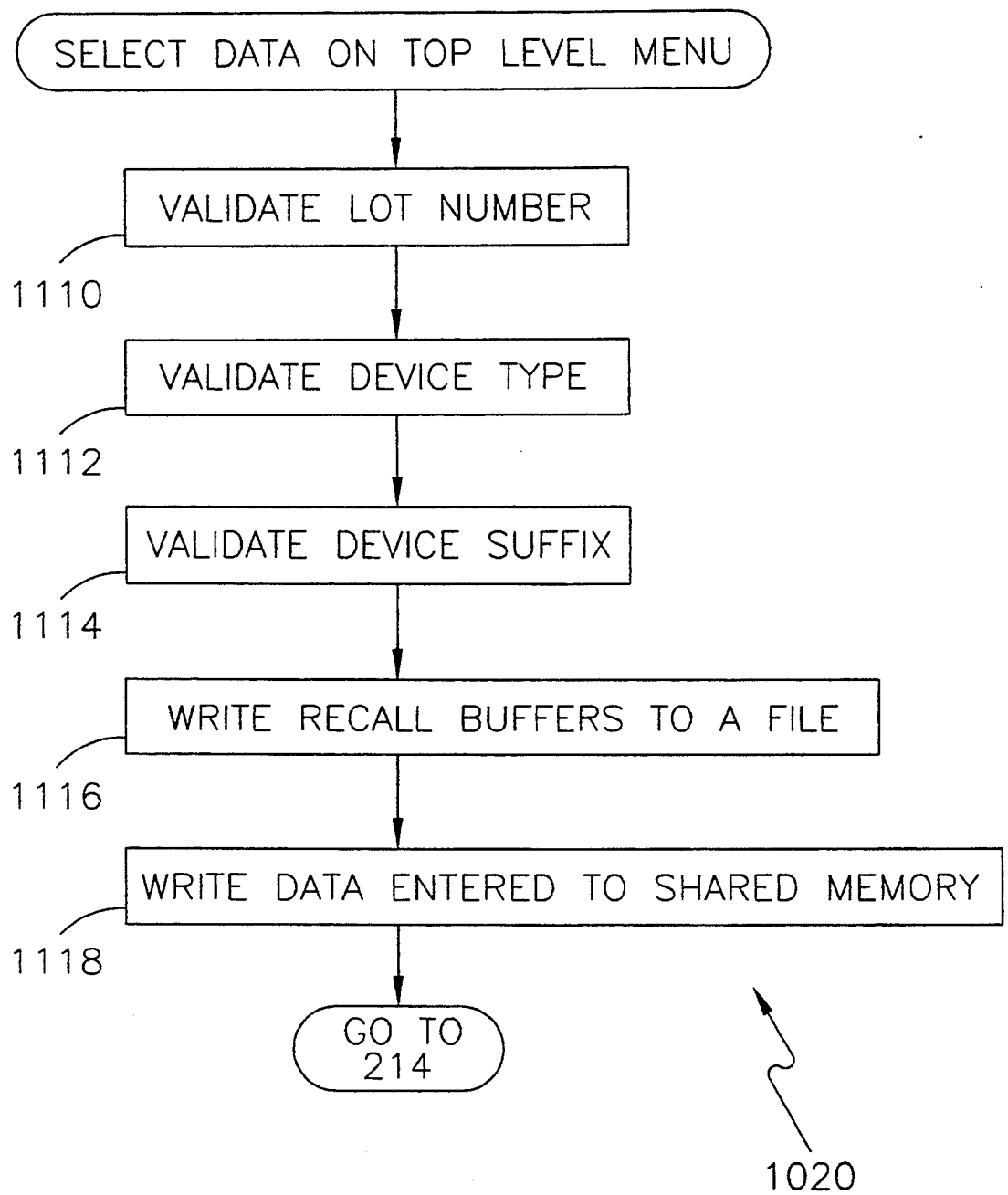
FIG. 11 shows a flowchart for the method for a step 1020 of FIG. 10A of selecting data on the top level menu of FIG. 8.

FIG. 11 is a flow chart which illustrates the method of the select widget in carrying out the step 1020 of FIG. 10A. Referring to FIG. 11, in a step 1110 the select widget invokes the lot number widget to validate the lot number. Lot number validation is described in FIG. 12 and the accompanying text. Next, in a step 1112 the select widget invokes the device type widget to validate the device type. Device type validation is described in FIG. 13 and the accompanying text. In a step 1114, the select widget invokes the device suffix widget to validate the device suffix. Device suffix validation is described in FIG. 14 and the accompanying text.

In a step 1116, the select widget writes the joint and independent recall buffers to a file so that the buffers can be retrieved the next time the top level interface is invoked. Finally, in a step 1118 the select widget writes the data entered on the top level interface menu 800 to the shared memory 112, where the prodtest 120 may later access it. The select widget then terminates the top level interface and returns a 'select' status to the prodshell 110 (at the step 214 of FIG. 2).

FIG. 12 shows a flow chart which illustrates the method of the lot number widget in performing validation. Referring to FIG. 12, in a step 1210 the lot number widget determines whether a lot number format is specified in an environment variable. If not, no further validation is performed. Otherwise, lot number validation proceeds as follows.

In a step 1212, the lot number widget determines whether the lot number entered on the top level interface menu conforms with the specified format. If not, then in a step 1213 an error message is generated. Otherwise, lot number validation proceeds as follows.

In a step 1214, the lot number widget determines whether an indication of the device type is embedded in the specified lot number format. If not, no further validation is possible. Otherwise, the lot number validation proceeds as follows.

In a step 1216, the lot number widget determines whether a device type has been entered on the top level menu 800 which does not match the device type embedded in the lot number format. If so, the lot number widget carries out the step 1213 (explained above). Otherwise, in a step 1218 the lot number widget displays the embedded device type in the device type dialog box 822. After either of the steps 1213 or 1218, or a negative determination in the step 1214, control of flow returns to the calling routine.

Figure 13:
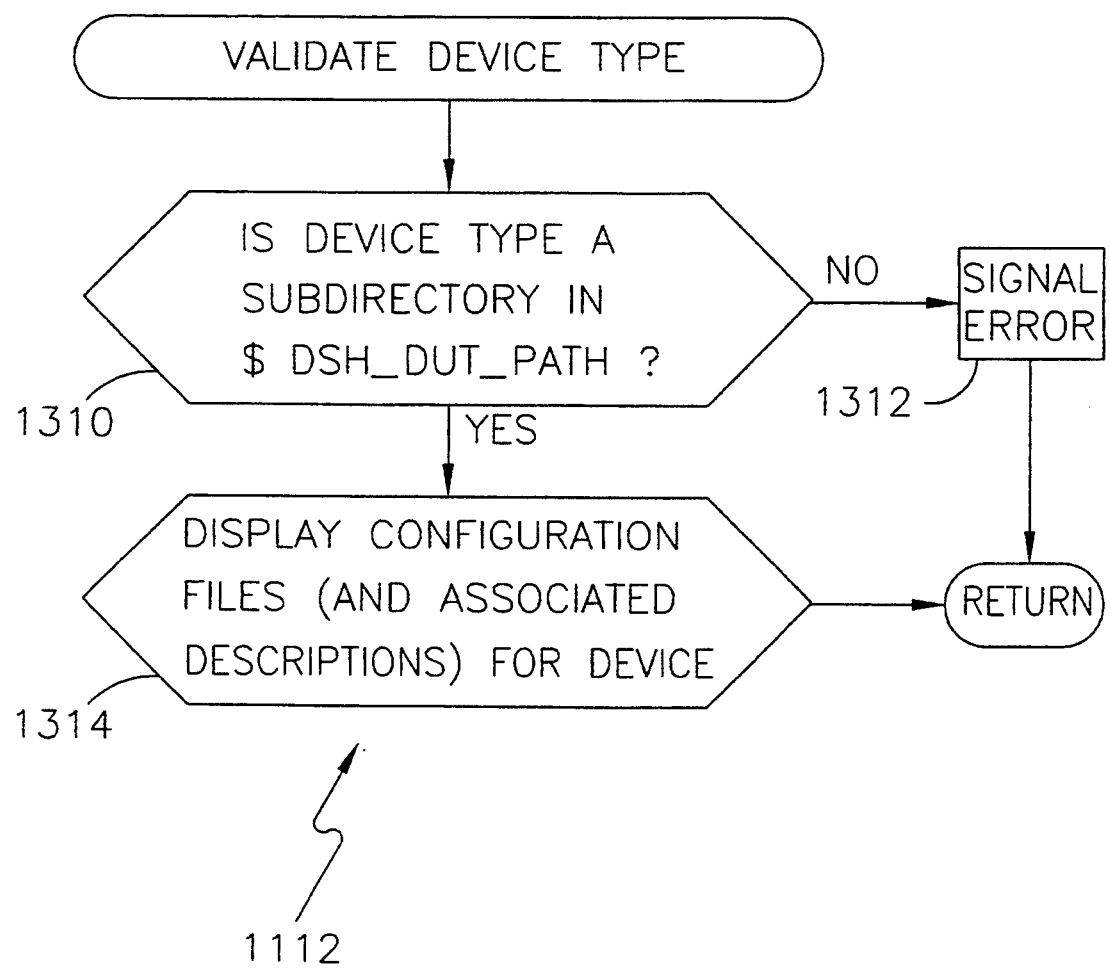
FIG. 13 shows a flowchart for the method of a step 1112 of FIG. 11 of validating a device type.

FIG. 13 illustrates the method by which the device type widget performs validation. Referring to FIG. 13, in a step 1310 the device type widget determines whether the device type entered on the top level interface menu is a subdirectory in the directory stored in the environment variable called "$DSH_DUT_PATH". This directory must contain subdirectories for all valid device types. Accordingly, if there is no such subdirectory, then in a step 1312 the device type widget signals an error and lists all valid devices. Control of flow then returns to the widget which requested the device type validation.

Otherwise, in a step 1314 the device type widget displays the configuration files 128 (and any descriptions specified for them) for the IC device 116 in the valid device types dialog box 826. The configuration files 128 are listed in the device type subdirectory. Control of flow then returns to the widget which requested the device type validation.

Figure 14:
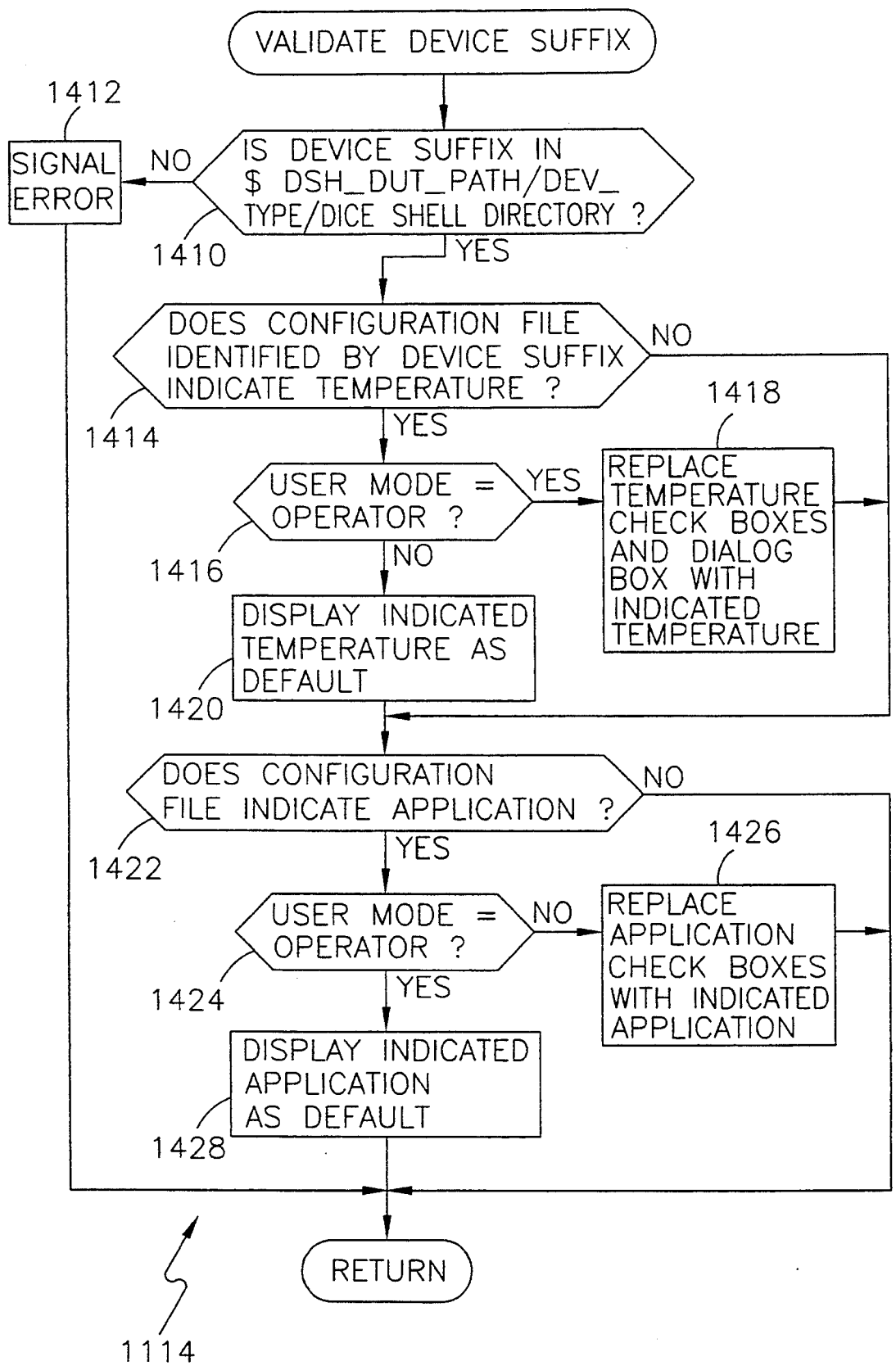
FIG. 14 shows a flowchart for the method of a step 1114 of FIG. 11 of validating a device suffix.

FIG. 14 shows a flow chart of the method of the device suffix widget in validating a device suffix. Referring to FIG. 14, in a step 1410 the device suffix widget determines whether the device suffix in the device suffix dialog box 823 is in a subdirectory called "$DSH_DUT_PATH/DEV_TYPE/shell 110", where $DSH_DUT_PATH is an environment variable containing a directory path and DEV_TYPE is the name of the device directory. If not, then in a step 1412 the device suffix widget signals an error. Otherwise, it operates as follows.

In a step 1414, the device suffix widget determines whether the configuration file 128 identified by the device suffix entered indicates a temperature. If so, then it continues as follows.

In a step 1416 it determines whether the user mode is "operator." If so, then in a step 1418 it replaces temperature boxes 833 with the indicated temperature. Otherwise, in a step 1420 the device suffix widget displays the indicated temperature as the default temperature.

After the step 1420, the step 1418, or a negative determination in the step 1414, the device suffix widget proceeds as follows. In the step 1422, it determines whether the configuration file 128 indicates an application. If so, and if the user mode was found to be "operator" (see steps 1416 and 14324) then the device suffix widget replaces the application check boxes 837 with the indicated application. If the user mode is not "operator", then in a step 1428, it displays the indicated application as the default application. Specifically, it displays a check in the check box corresponding to the indicated application.

After any of the steps 1428, 1426, or 1412, or after a negative determination in the step 1422, control of flow returns to the widget which requested the device suffix validation.

Prodtest Overview

Once the prodshell 110 has executed the top level interface and, if necessary, linked the prodtest 120 to the user code, the prodshell 110 invokes the prodtest 120. The prodshell 110 could do so, for example, with the "fork" system call of the unix operating system. Accordingly, once the prodtest 120 terminates, control of flow returns to the prodshell 110.

FIG. 1 shows the structure of the prodtest 120. Referring to FIG. 1, the prodtest comprises a parser 142, a prodconf 144, a prober controller 146, a prober library 148, a handler controller 150, a handler library 152, a package controller 154 and a reporting module 156. The parser analyzes data in the configuration file 128 and places them in the prodconf 144. The prodconf 144 comprises, among other structures, a testflow structure 158 and a binning structure 160.

The testflow structure essentially comprises a list of nodes representative of the testflow statements in the configuration file, and execution modules for carrying out the nodes. The testflow structure 158 is described in greater detail below in FIG. 25 and the accompanying text.

The binning structure 160 comprises a list of binning rules, an otherwise clause, a list of good major bins, a list of reprobe major bins, a mapping of logical bins to physical bins, and a mapping of logical bins to colors. The binning structure 160 is described in greater detail below in FIG. 31 and the accompanying text.

The prober controller 146 essentially ensures that the prober is properly positioned on the wafer IC device 116 for the next test to be executed. If the application is "wafer manual", then it does so by prompting the user to position the prober. If the application is "wafer autoprobe", then it does so by commanding the wafer prober 124 with routines in the prober library 148.

The handler controller 150 essentially positions the package handler 122 to prepare the next package part IC device 116 for testing. It does this by commanding the package handler 122 with routines in the handler library 152. The handler controller is used when the application is "package handler".

The package controller 154 prompts the user 113 to place the next package part IC device 116 on the package handler 122 for testing. The package controller 154 is used when the application is "package manual".

The reporting module 156 manages the reporting of results determined by the execution of the testflow structure 158 and the binning structure 160.

Figure 15:
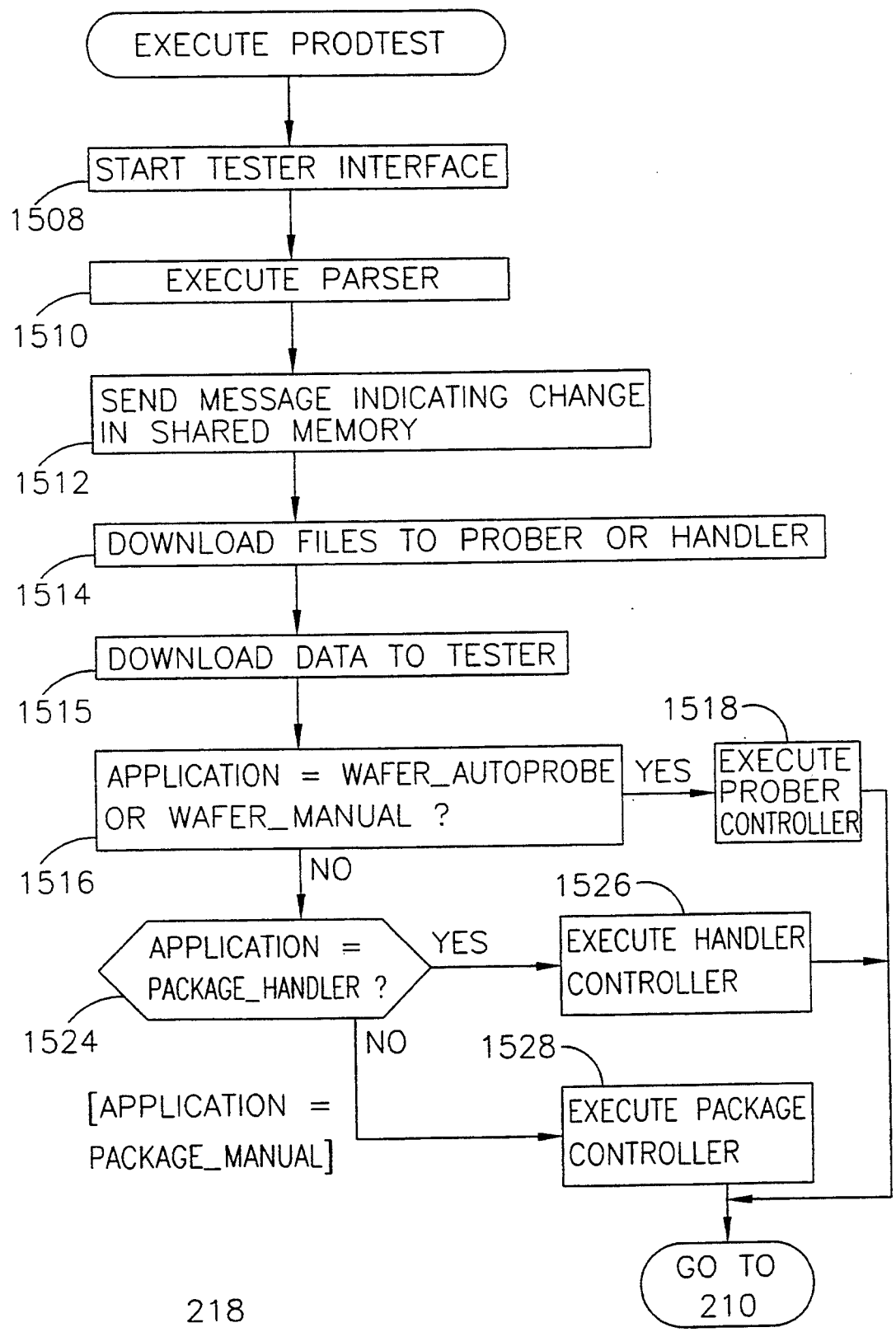
FIG. 15 shows a flowchart of the method of performing a prodtest of FIG. 1.

FIG. 15 describes the high level method of the prodtest 120. Referring to FIG. 15, in a step 1508, the prodtest 120 starts the tester interface 140 to facilitate communications with the tester 126. In a step 1510, the prodtest 120 executes the parser 142 to initialize the prodconf 144 with data from the configuration file 128. The parser 142 also creates test suite flags and may create user flags and change the value of system flags.

Accordingly, in the step 1512 the prodtest 120 notifies the flag interface 118 that flag values have been modified. As explained above (in the section entitled, "Flag interface 118") the flag interface 118 responds by updating the flag interface 118 windows in step 416 of FIG. 4.

In a step 1514, the prodtest 120 downloads to the wafer prober 124 any wafer download file specified in the configuration file 128. In a step 1515, the prodtest 120 downloads data to the tester 126. Specifically, the calibration file as well as any pin attribute and pin configuration files 128 specified in the configuration file 128. It also downloads chip specific information from the configuration file 128, including pin configurations, level settings, timing settings and vectors.

In a step 1516, the prodtest 120 examines the diceconf structure to determine whether the application is "wafer autoprobe" or "wafer manual". If it is either type, then in a step 1518 the prodtest 120 executes the prober controller 146. The structure and method of the prober controller 146 is described below in the section entitled, "wafer prober controller".

If the determination in the step 1516 was negative, then in a step 1524 the prodtest 120 determines whether the application specified was "package handler" 122. If so, then in a step 1526 the prodtest 120 executes the handler controller 150 of FIG. 17A. The structure and method of the handler controller 150 is described below in the subsection entitled "Handler Controller".

If the determination in the step 1524 was negative, then the application specified must have been package_manual. In that case, in a step 1528 the prodtest 120 executes a package controller 154. The structure and method of the package controller 154 are described below in the subsection entitled, "Package Controller".

After carrying out any of the steps 1618, 1626 or 1628, control of flow returns to the prodshell 110 at the step 210.

Prober Controller

Figure 16:
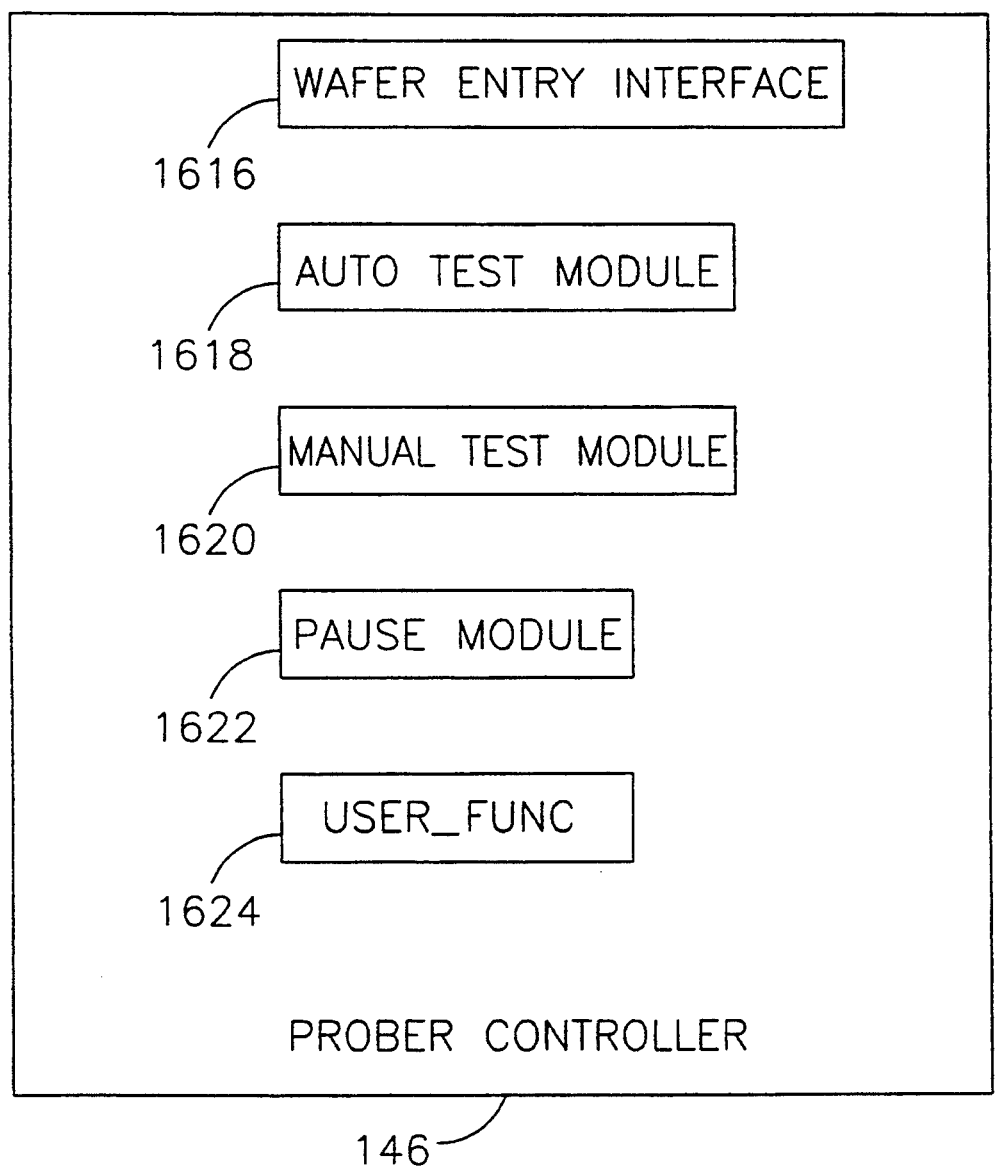
FIG. 16 shows a block diagram of a prober controller 146 of FIG. 1.

FIG. 16 is a block diagram of the structure of the prober controller 146. The prober controller 146 comprises a wafer entry interface 1616, an autotest module 1618, a manual test module 1620, and a user_func module 1624. The wafer entry interface 1616 presents a graphical representation of wafer cassettes and accepts manual, file-based or wafer reader input of wafer numbers. It allows manipulation such as insertion, deletion and clearing of the wafer numbers. It is described below in greater detail in the section entitled, "Wafer entry interface".

The user_func module 1624 executes the user_func test suite (if any) defined in the configuration file 128.

Figure 18A:
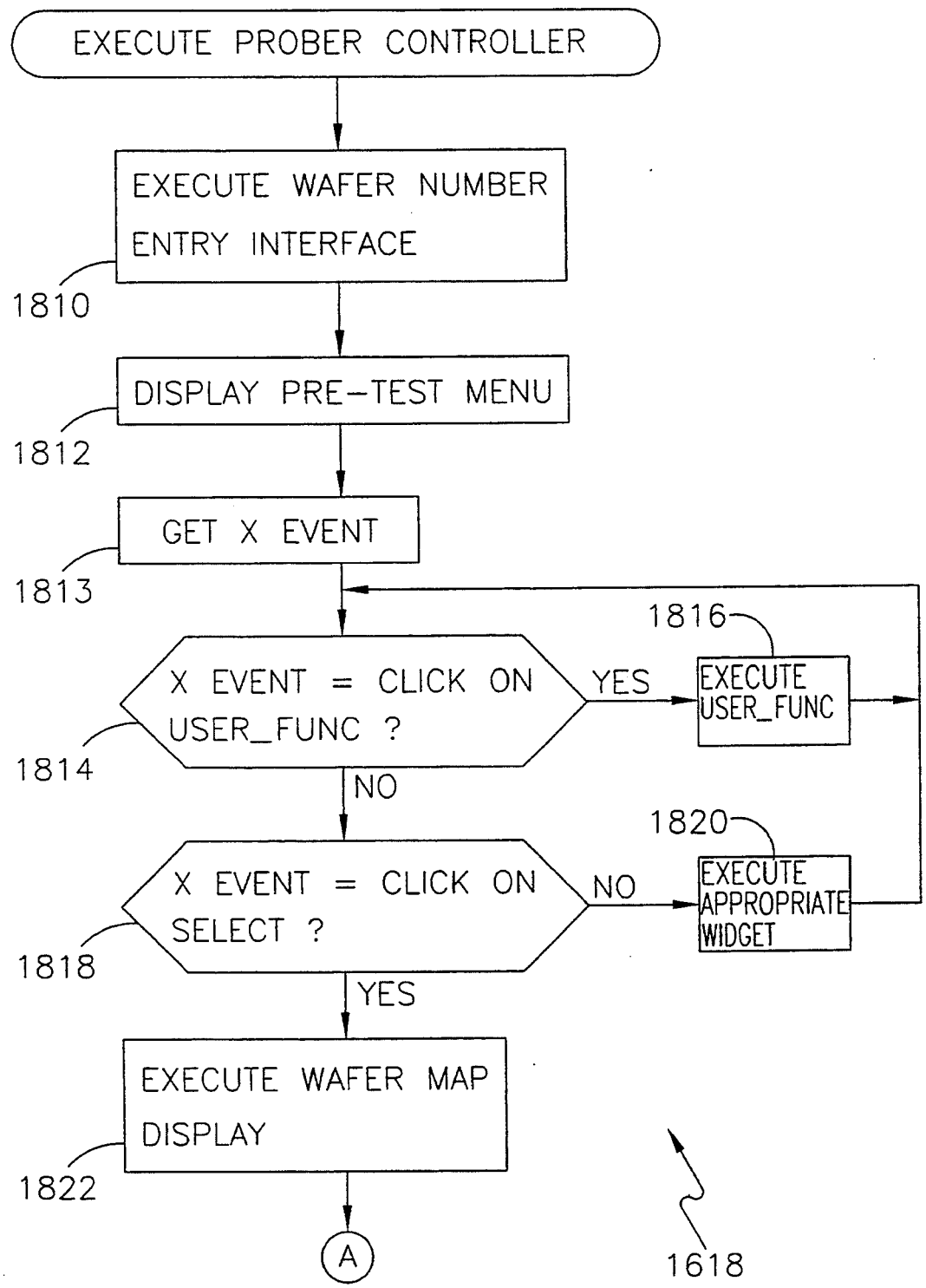
FIGS. 18A and 18B show a flowchart of the method of operation of the prober controller 146 of FIG. 16.

FIG. 18 is a flow chart which illustrates the method of operation the prober controller 146. Referring to FIG. 18, in a step 1810 the prober controller 146 executes the wafer entry interface 1616 to assign numbers to the wafers to be tested. The method of operation of the wafer entry interface 1616 is described below in the subsection entitled, "Wafer Entry Interface". Next, in a step 1812, a pre-test menu is displayed. If the application is "wafer autoprobe", then the pre-test menu presents a quit button, a help button and a select button. If the user_func test suite is defined in the configuration file 128, then the pre-test menu further comprises a user_func button. If the user mode is engineer, then the menu further comprises a tester interface button for accessing commands of the tester 126. The prober controller 146 then waits for an X event (i.e., for the user 113 to press one of the buttons). The pre-test menu instructs the user to load the first wafer onto the wafer prober 124 and to press the select button when ready.

In a step 1814, the prober controller 146 determines whether the X event was a click on the user_func button. If so, then in a step 1816, the user_func module 1624 executes the user_func test suite.

After a negative determination in the step 1814, in a step 1818, the prober controller 146 determines whether the user 113 clicked on the select button. If not, then in a step 1820 it executes the widget associated with the button pressed. Thus, if the user 113 pressed the quit button, then the prober controller 146 terminates, and control of flow returns to the prodshell 110 at the step 210 of FIG. 2. If the user 113 pressed the help button, then it displays a context-sensitive help screen. If the tester 126 interface button was pressed, then a tester interface menu is displayed to enable the user to access the tester interface 140. After either of the steps 1816 or 1820, control of flow of the prober controller 146 returns to the step 1814 to receive additional commands from the user 113.

After a positive determination in the step 1818, on the other hand, the prober controller 146 executes the wafer map display in a step 1822. The operation of the wafer map display is described in greater detail below in the section entitled, "Wafer Map Display".

Figure 18B:
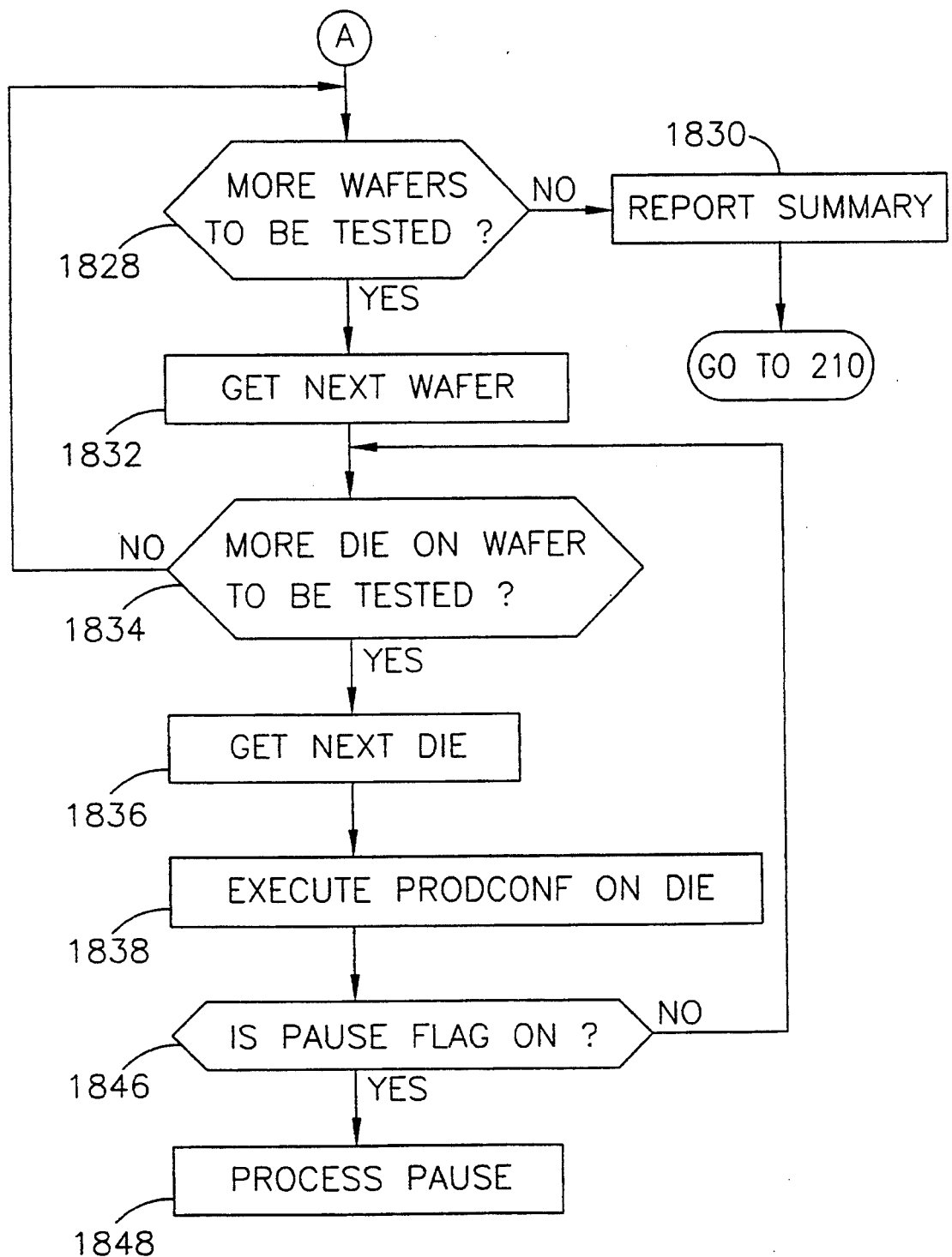

Looking at FIG. 18B, in a step 1828 the prober controller 146 determines whether there are additional wafers on the list of wafers entered by the user 113 which have not yet been tested. Once all wafers are tested, the prober controller 146 invokes the reporting module in step 1830 to summarize the test results and report them to the reporting window 138, the printer 134 and/or the report file 132 (depending on the system flag settings). Control of flow then returns to the prodshell 110 at the step 210.

If, on the other hand, there are additional wafers to be tested then in a step 1832 the wafer prober 124 controller gets the next wafer. If the application is wafer autoprobe, then it does so by issuing an appropriate command (supported by the wafer prober 124 library) to the wafer prober 124. If the application is wafer manual, on the other hand, then the wafer prober 124 controller 146 prompts the user 113 to place the next wafer on the wafer prober 124.

In a step 1834, the wafer prober 124 controller determines whether there are additional die on the current wafer which the user 113 has indicated should be tested. If all indicated dies have been tested, then control of flow of the wafer prober 124 controller returns to the step 1828 (explained above). Otherwise, the wafer prober 124 controller proceeds as follows.

In a step 1836, the prober controller 146 gets the next die to be tested. If the application is "wafer autoprobe", then it does so by issuing an appropriate command (supported by the wafer prober 124 library) to the wafer prober 124. Otherwise, it prompts the user 113 to enter the coordinates of the last die tested and advance the wafer prober 124 to the next die to be tested.

In a step 1838, the wafer prober 124 controller executes the prodconf 144 to execute the tests specified in the testflow structure 158 and the binning specified in the binning structure 160. The testflow structure 158 is described in greater detail below in the section entitled, "Testflow". The binning structure 160 is described in greater detail below in the section entitled, "Binning".

Next, in a step 1846, the wafer prober 124 controller determines whether the value of the pause flag in the shared memory 112 indicates that the user 113 has requested a pause. If not, then control of flow returns to the step 1834. Otherwise, in a step 1848, the pause module 1622 of the wafer prober 124 controller processes the pause request. The method by which it does so is described below.

Figure 19:
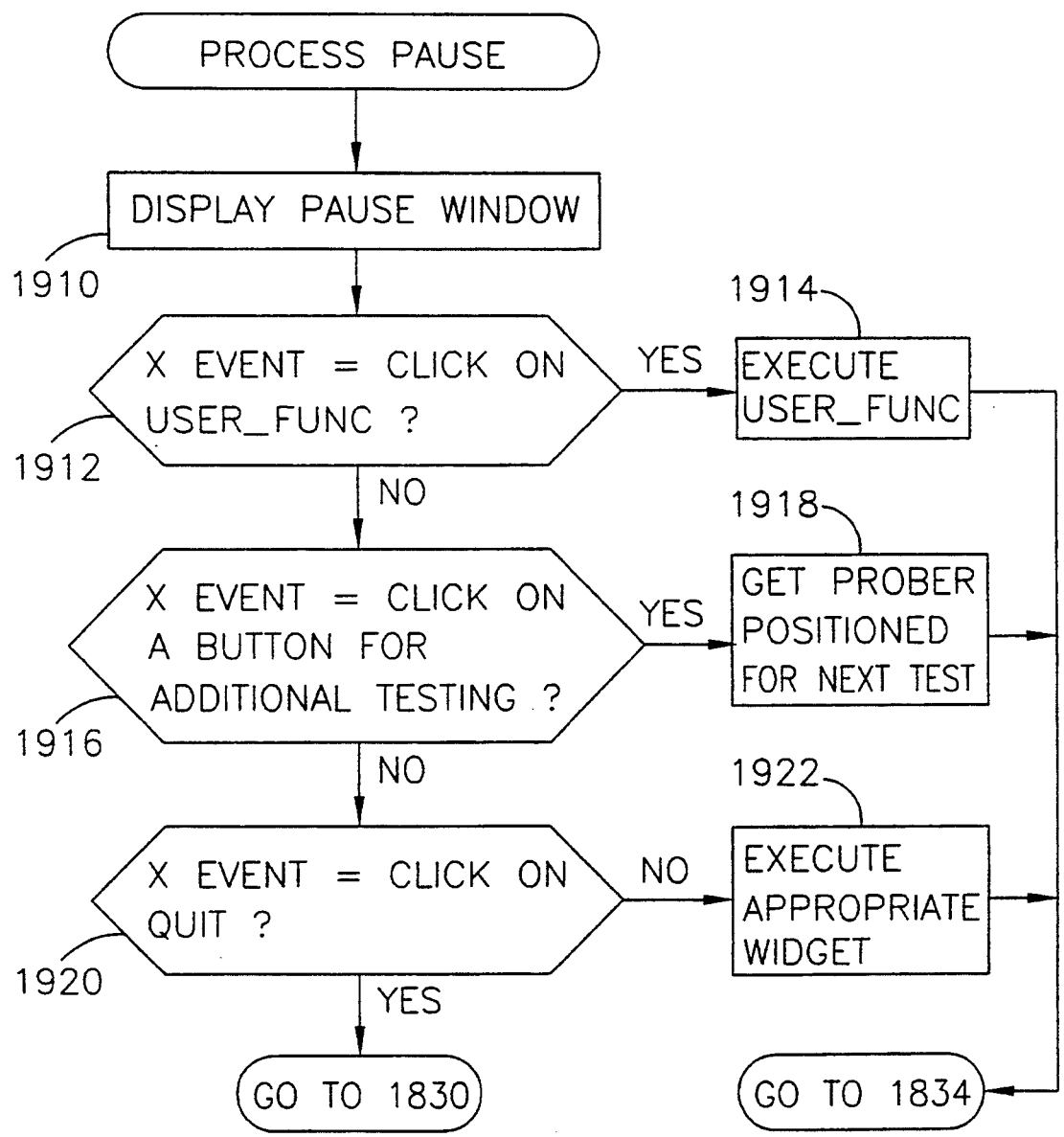
FIG. 19 shows a flowchart of the method of operation of a pause module 1722 of FIG. 16.

FIG. 19 shows a flow chart of the method of the pause module in processing a pause. In a step 1910, the pause module displays a pause menu. The pause menu contains quit, help, user_func (if defined), clean probes, retest die, retest wafer, skip wafer, tester 126 software (if the user mode is "engineer"), and select buttons. The pause module then waits for a response from the user 113 (in the form of an X event).

In a step 1912, the pause module determines whether the X event received was a click on the user_func button. If so, in a step 1914, it executes the user_func test suite.

If the determination in the step 1912 was negative, then in a step 1916 the pause module determines whether the X event was a click on any of the buttons which request additional testing. If so, then in a step 1918, the pause module (using the routines in the prober library 148) positions the wafer prober 124 as follows. If the user 113 pressed the retest die button, then the pause module leaves the wafer prober 124 where it is so that the next test will be performed on the same IC device 116 as the previous test. If the user 113 pressed the retest wafer button, then the pause module issues a command (supported by the prober library 148) to the wafer prober 124 to return to the first die on the wafer. If the user 113 pressed the skip wafer button, the pause module prompts the user 113 to load the next wafer and then advances to the first die of the next wafer. If the user 113 pressed the select button, then the pause module 1622 commands the prober to advance to the next die.

If the determination in the step 1916 was negative, then in a step 1920 the pause module determines whether the X event was a click on the quit button. If not, then in a step 1922, it executes the widget associated with the button pressed. After any of the steps 1914, 1918 or 1922, control of flow returns to the wafer prober 124 controller at the step 1834.

If, on the other hand, the X event was a click on the quit button, then control of flow returns to the wafer prober 124 controller at the step 1830 to generate the testing and binning summary.

Wafer Entry Interface

Figure 23A:
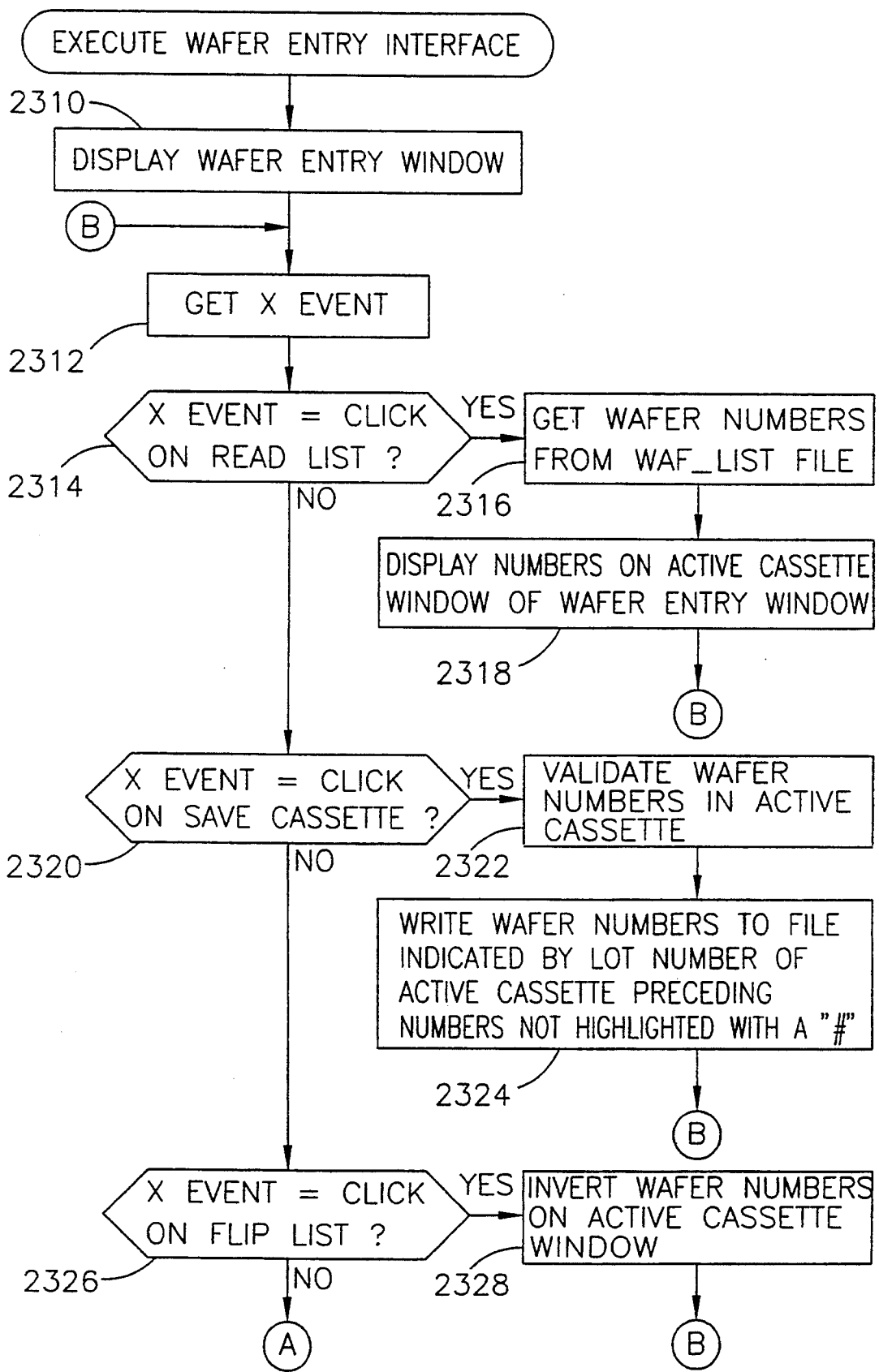
FIGS. 23A, 23B and 23C show a flowchart of the method of operation of a wafer entry interface 1716 of the prober controller of FIG. 16.
Figure 23B:
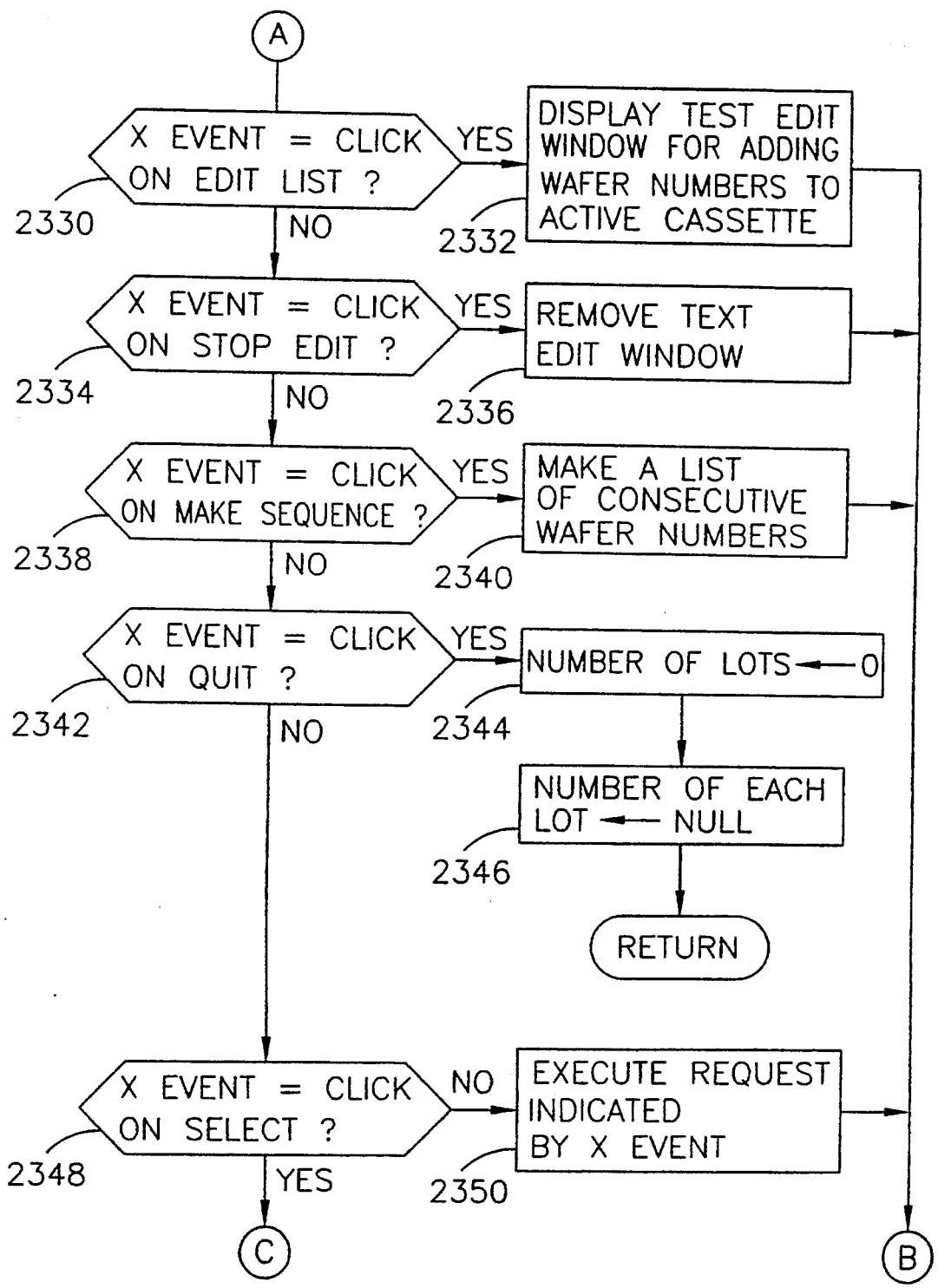
Figure 23C:
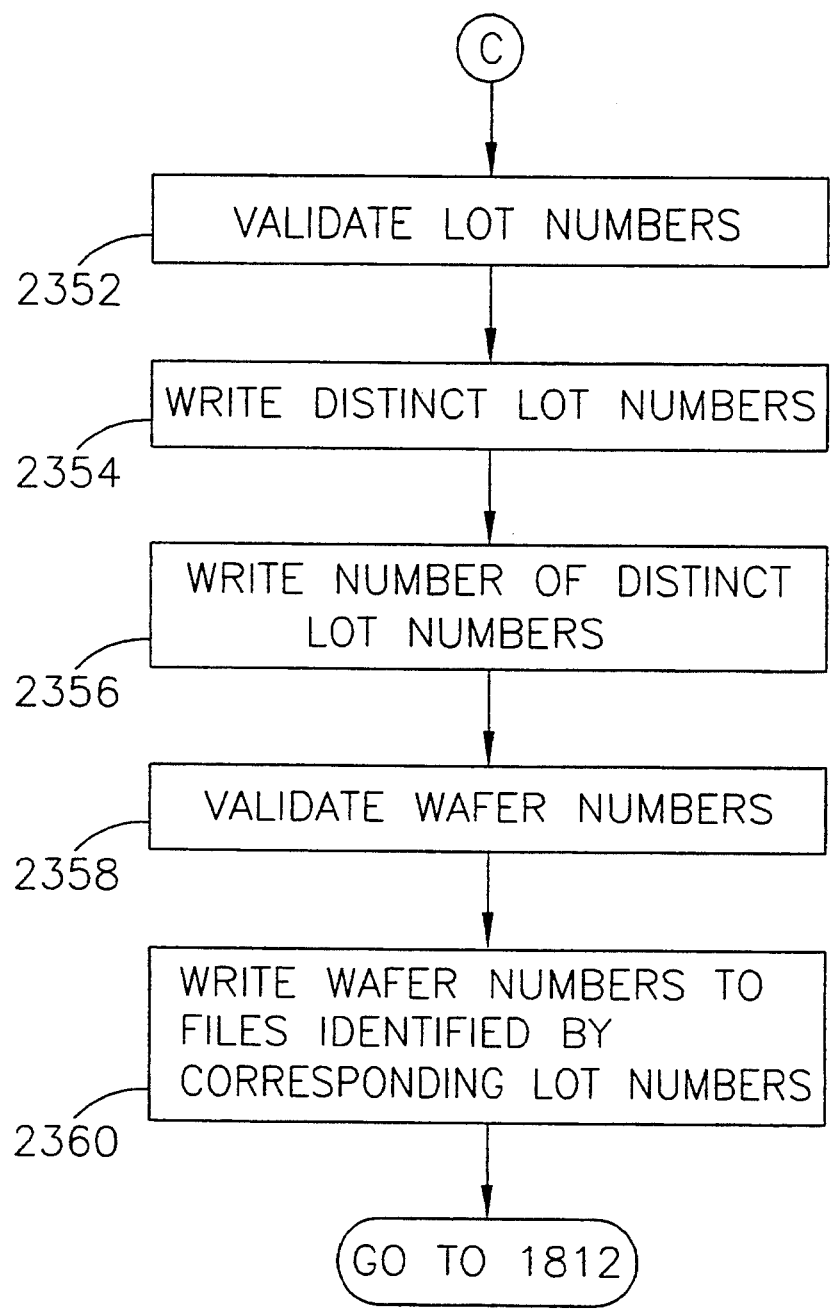
Figure 24:
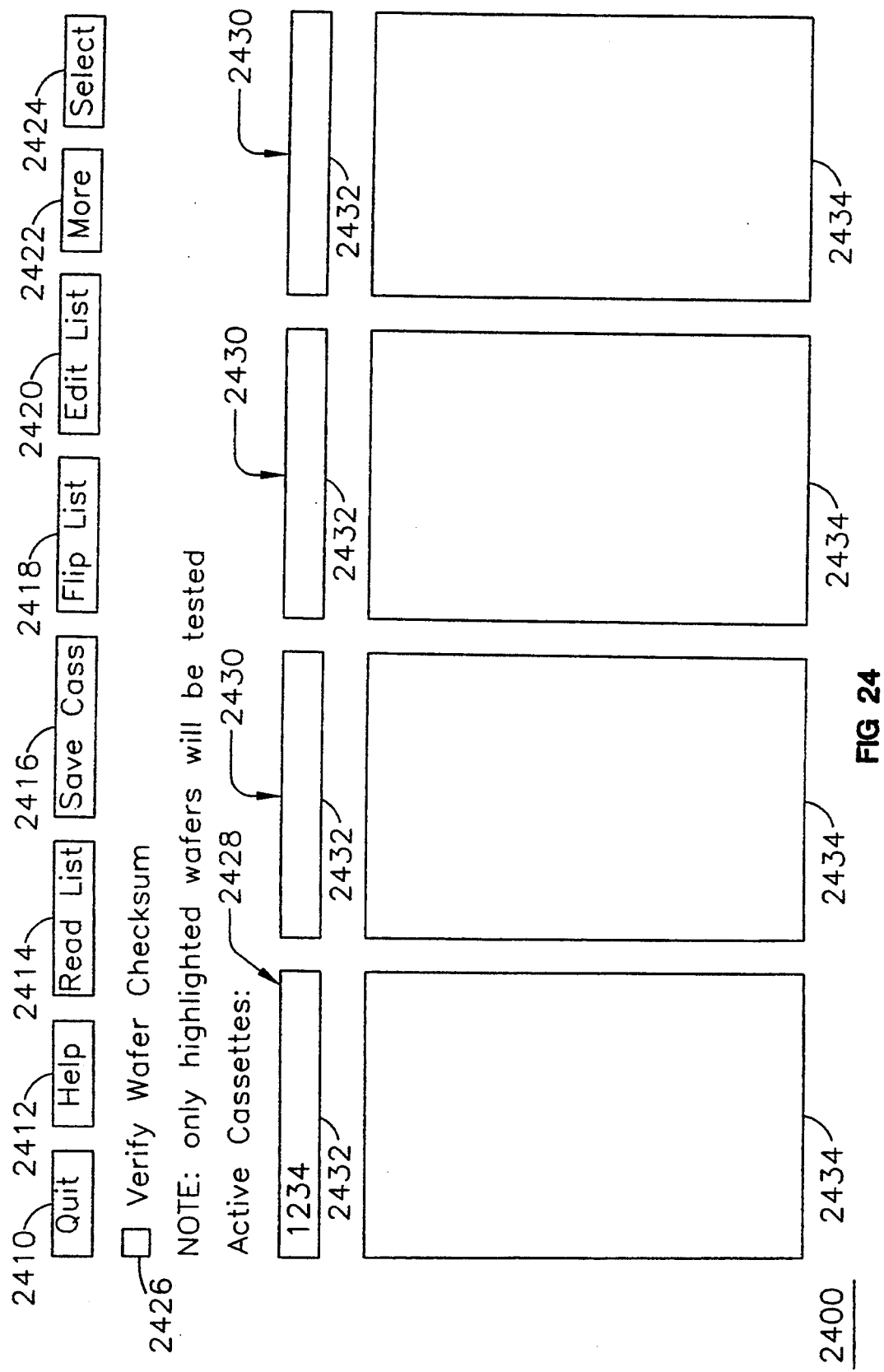
FIG. 24 shows a wafer entry menu displayed by the wafer entry interface 1716 of FIG. 16.

FIGS. 23A, 23B and 23C show a flow chart which illustrates the method of, the wafer entry interface 1716. The wafer entry interface 1716 is called by the prober controller 146 in the step 1810 of FIG. 18. In a step 2310 of FIG. 23A, the wafer entry interface 1716 displays a wafer entry menu 2400, which is shown in FIG. 24. The wafer entry menu 2400 comprises a quit button 2410, a help button 2412, a read list button 2414, a save cassette button 2416, a flip list button 2418, an edit list button 2420, a move button 2422, a select button 2424, and a verify wafer checksum box 2426. The wafer entry menu 2400 further comprises an active cassette dialog box 2428 and three inactive cassette dialog boxes 2430. Each cassette dialog box 2430 comprises a lot number dialog box 2432 and a wafer number dialog box 2434.

Wafers will be tested if they are highlighted. An unhighlighted wafer means the wafer is physically present in the cassette but is not to be tested (it will be skipped). The user 113 can toggle highlighting and unhighlighting of a wafer by clicking on it once with the mouse.

The user 113 can remove a wafer from the list by double clicking on it with the mouse. This copies a wafer to the wafer text entry box. (See the edit list button described below). The wafer number can then be edited.

The buttons of the wafer entry menu 2400 operate only on the active cassette 2428. The active cassette 2428 is changed by clicking on the lot number dialog box 2432 with the left mouse button, typing in a lot number (which will be validated) and pressing return. Alteratively, it can be changed by clicking on a wafer number in one of the cassette dialog boxes 2434.

After displaying the wafer entry menu 2400, the wafer entry interface 1616 waits for a response by the user 113 (in the form of an X event). Once it receives the X event in the step 2312, the wafer entry interface 1616 determines whether, in step 2314, the X event was a click on the read list button 2414. If so, a read list widget associated with the read list button 2414 reads a list of wafers from a file into the wafer number dialog box 2434 of the active cassette 2428. Specifically, in a step 2316 the read list widget gets the wafer numbers from a file called "war_list". The war_list file could be generated by a wafer laser number reader. Alternatively, it could be the wafer numbers last entered on the wafer entry menu 2400. In a step 2318, the read list widget displays the wafer numbers in the wafer number dialog box 2434 of the active cassette 2428. Control of flow then returns to the step 2312 to await the user's next request.

After a negative determination in the step 2314, then in a step 2320 the wafer entry interface 1716 determines whether the X event was a click on the save cassette button 2416. If so, then in a step 2322, a save cassette widget associated with the save cassette button 2416 validates the wafer numbers in the active cassette. Validation involves determining whether there are duplicate wafer numbers in a single lot and, if the verify wafer checksum check box 2426 is checked, then determining whether each wafer number complies with the wafer numbering standard used at the site. Then, in a step 2324 the save cassette widget writes the wafer numbers to a file, the name of which is indicated by the lot number of the cassette. If the user 113 has indicated that any of the wafer numbers are not to be tested, then the widget precedes these numbers in the file with the "#".

If the determination in the step 2320 was negative, then in a step 2326 the wafer entry interface 1716 determines whether the X event was a click on the flip list button 2418. If so, then in a step 2328, a flip list widget inverts the wafer numbers on the active cassette dialog box. This is useful if the wafer prober 124 reverses the wafer order in cassettes as it tests the wafers.

After a negative determination in the step 2326, then in a step 2330 (on FIG. 23B), the wafer entry interface 1616 determines whether the X event was a click on the edit list button 2420. If so, then in a step 2332, an edit list widget displays a text edit window for adding wafer numbers to the active cassette. The user 113 can type wafer numbers into the window one at a time. The wafer numbers are verified and then appended to the wafer number dialog box 2434 of the active cassette 2428. Alternatively, the user 113 can insert a wafer number at a specified numeric position of the wafer number dialog box 2434 by typing "@position" after the wafer number.

If the determination in the step 2330 is negative, then in a step 2334, the wafer entry interface 1616 determines whether the X event was a click on a stop edit button. (The stop edit button replaces the edit list button 2420 when the text edit window is displayed.) If so, then in a step 2336 the wafer entry interface 1616 removes the text edit window from the wafer entry interface 1616 menu 2400.

After a negative determination in the step 2334, then in a step 2338 the wafer entry interface 1616 determines whether the X event was a click on a make sequence button. (The make sequence button is displayed by clicking on the more button 2422.) If so, then in a step 2340 it lists consecutive wafer numbers in the wafer number dialog box 2434. If the lot number of the active cassette dialog box 2428 is the same as that of the preceding inactive cassette dialog box 2430, the numbering continues where the last cassette left off. Otherwise, the numbering starts at 1.

After a negative determination in the step 2338, then in a step 2342 the wafer entry interface 1616 determines whether the X event was a click on the quit button 2410, indicating a request to leave the wafer entry interface 1616 without entering the data. Any previously entered data will be ignored. If so, then in a step 2334, it sets a variable in the shared memory 112 for the number of lots to 0. In a step 2346, it sets variables in the shared memory 112 for each lot number to null. Control of flow then returns to the prober controller 146 at the step 1812 of FIG. 18A.

After a negative determination in the step 2342, then in a step 2348 the wafer entry interface 1616 determines whether the X event was a click on the select button 2424. If not, then in a step 2350 the wafer entry interface 1616 executes whatever request was indicated by the X event. After execution of any of the steps 2350, 2318, 2324, 2328, 2332, 2336 or 2340, control of flow returns to the step 2312 of FIG. 23A to wait for the next X event.

If the X event was a click on the select button 2424, then processing is as follows. Referring to FIG. 23C, in a step 2352, a select widget associated with the select button 2424 validates the lot numbers. Specifically, it ensures that each lot number conforms to a pre-specified lot number format. The lot number format is specified in an environment variable read by the wafer entry interface 1716.

In a step 2354, the wafer entry interface 1716 writes each different lot number to a lot number variable in the shared memory 112. If the wafer numbers of a single cassette are entered in more than one wafer number dialog box 2434, then there may be duplicate lot numbers. In a step 2356, it writes the number of different lot numbers to the lots variable in the shared memory 112.

In a step 2358, the wafer entry interface 1616 validates the wafer numbers. Wafer number validation is described above in this section.

Finally, in a step 2360, it writes the wafer numbers in each wafer number dialog box 2434 to a file identified by the lot number of the window. If wafer numbers from multiple wafer number menus 2434 are written to a single file, then a delimiter is placed between each set of wafer numbers. Also, as described above, any unhighlighted wafers are preceded by a "#". Control of flow then returns to the wafer prober 124 controller at the step 1812.

Wafer Map Display

Figure 28:
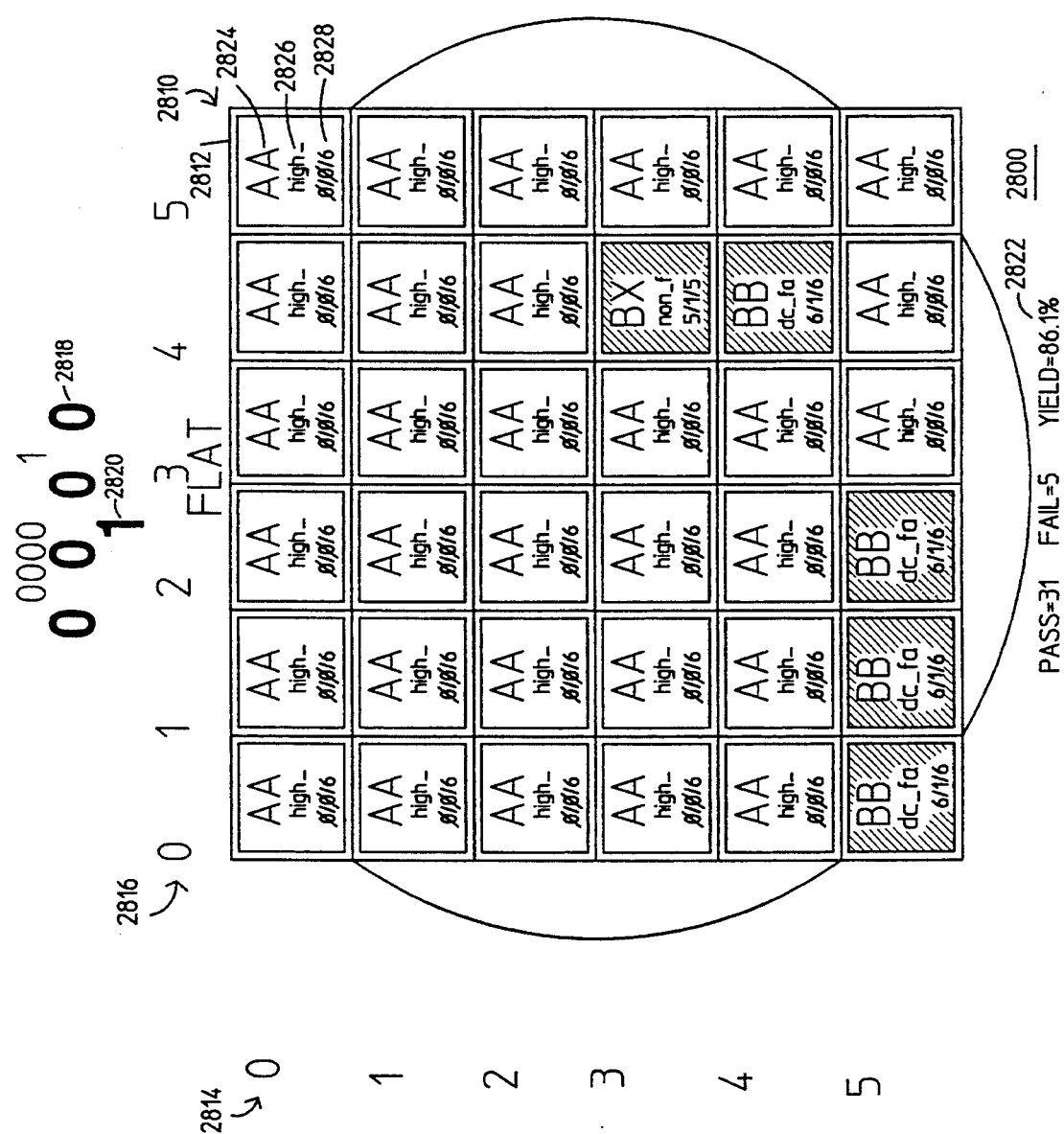
FIG. 28 shows a wafer map displayed by the wafer map display 164 of FIG. 1.

The wafer map display 164, called by the prober controller 146 in steps 1822 and 1844, is used to display the test results of each die on a wafer as it is tested. FIG. 28 shows a wafer map 2800 generated by the wafer map display 164. The wafer map 2800 comprises a wafer template 2810 of die cells representative of dies on a wafer, x coordinates 2814 and y coordinates 2816 to facilitate identification of individual dies, a lot number 2818, a wafer number 2820 and a wafer test summary 2822. Each die cell 2812 has a major bin identifier 2824, a minor bin identifier 2826 and a fingerprint 2828 as well as a color (not shown).

The fingerprint 2828 is in the form first fail/total fail/total run, where first fail is the number of the first test failed by the die, total fail is the total number of tests failed by the die and total run is the total number of tests executed on the die. The purpose of the fingerprint 2828 is to facilitate easy recognition of repeating patterns of defects. Defects on IC devices are generally caused by the falling of dust particles during fabrication and are therefore generally randomly distributed. Accordingly, a repeating pattern of defects indicates either: (1) a repeating defect in the silicon, or (2) an anomaly in the test setup or in how the test is written.

Figure 29:
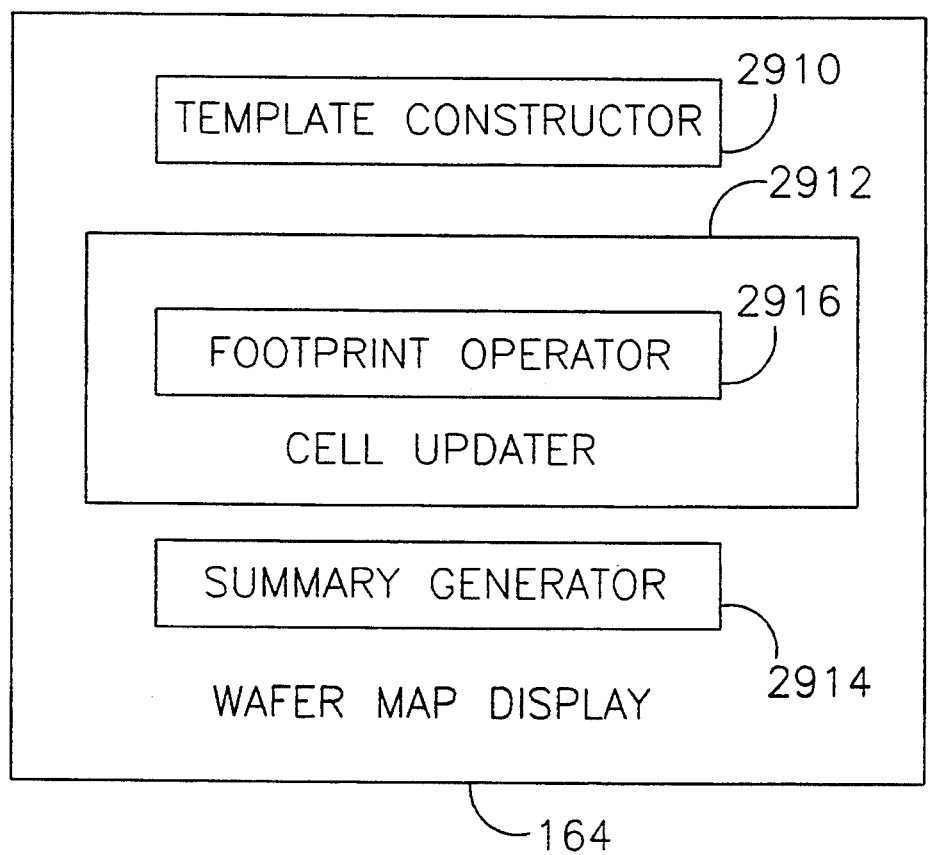
FIG. 29 shows a block diagram of the structure of the wafer map display 164 of FIG. 1.

FIG. 29 is a block diagram of the structure of the wafer map display 164. The wafer map display 164 comprises a template constructor 2910, a cell updater 2912 and a summary generator. The cell updater 2912 comprises a footprint generator 2916.

Figure 20A:
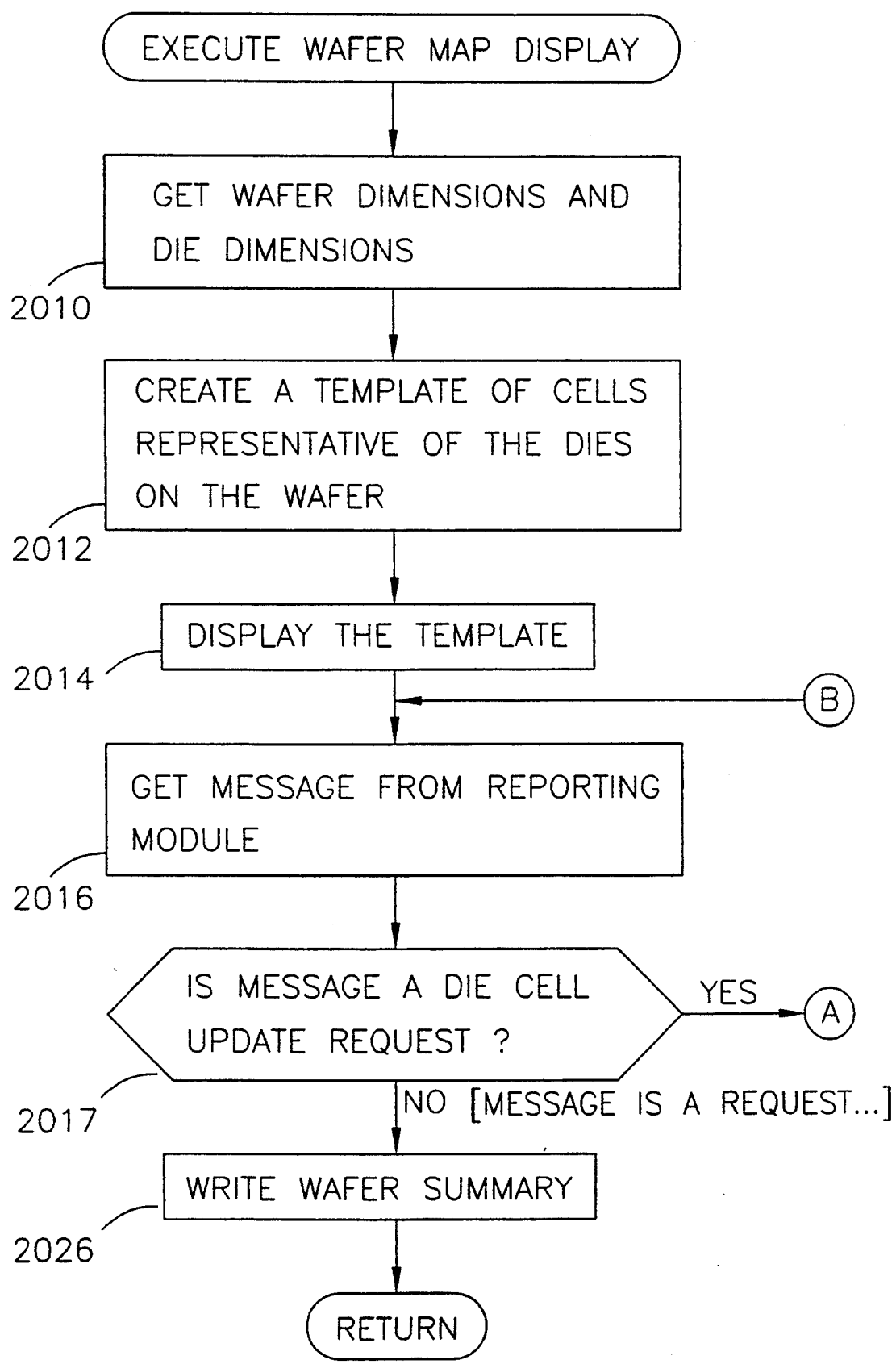
FIGS. 20A and 20B show a flowchart of the method of operation of the wafer map display 164 of FIG. 1.
Figure 20B:
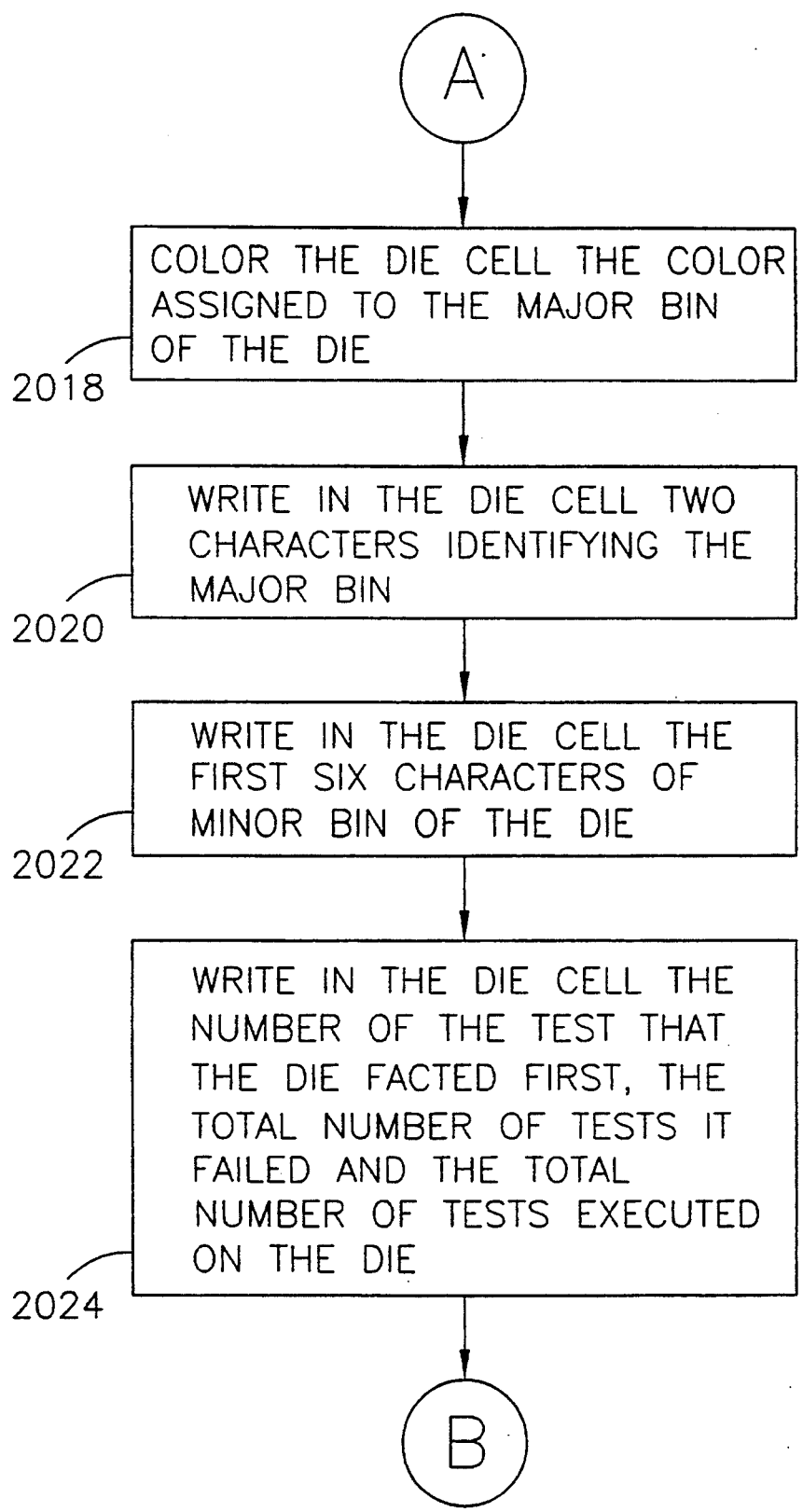

FIG. 20 is a flowchart which illustrates the method of the wafer map display 164. In a step 2010, the template constructor 2910 determines the dimensions of the current wafer and of each die on the wafer. It extracts the data from the prober download file specified in the configuration file 128. The template constructor 2910 uses the data to create the wafer template 2810 in a step 2012. In a step 2014, it displays the template on the display device 136. The die cells 2812 are initially blank and black.

The wafer map display 164 then waits for a message from the reporting module 156. Once the wafer map display 164 receives such a message in a step 2016, it determines in a step 2017 whether the message is a request to update a die cell 2912. If so, then the cell updater 2912 carries out steps 2018 through 2024.

In the step 2018, the cell updater 2912 colors the die cell the color mapped to by the major bin indicated by the test result. Mapping of major bins to colors is specified in the binning section of the configuration file 128.

In the step 2020, the cell updater 2912 writes the two identifying characters of the die's major bin into the die cell 2812. Then, in the step 2022, it writes the first five characters of the die's minor bin into the die cell 2812. The characters associated with the major bin and the minor bin are also specified in the binning section of the configuration file 128.

In the step 2024, the fingerprint generator 2916 determines the number of first tests failed, the total number of tests failed and the total number of tests executed on the die; the fingerprint generator then writes the fingerprint into the die cell. Control of flow then returns to the step 2016 to wait for additional messages from the reporting module 156.

If the reporting module 156 message was found not to be a die cell update request in the step 2017, then it must have indicated that all cells on the wafer were tested. In that case, in the step 2026, the wafer map display 164 summarizes the results of the tests performed so as to generate the wafer summary 2822. In the step 2026 it displays the wafer summary 2822 at the bottom of the wafer map 2800. Control of flow then returns to the reporting module 156.

Handler Controller

Figure 17A:
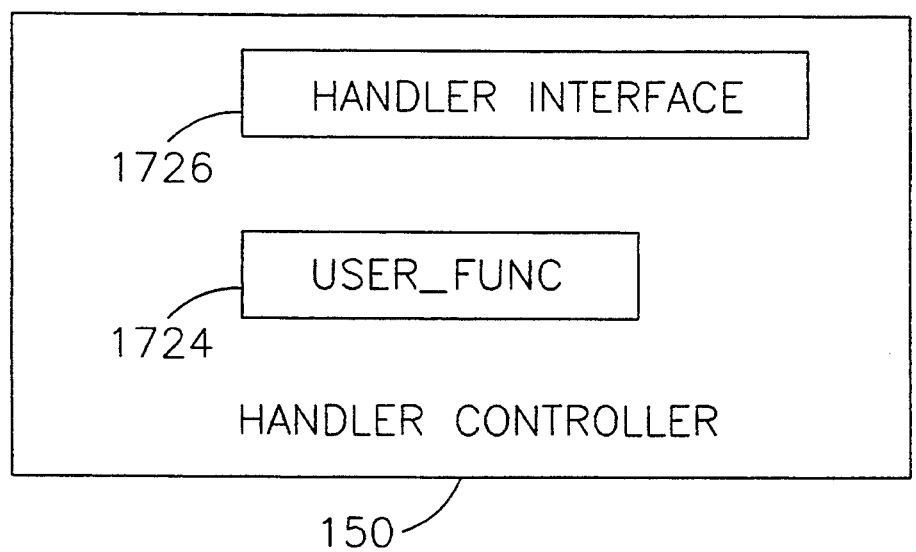
FIG. 17A shows a block diagram of a handler controller 150 of FIG. 1.
Figure 21A:
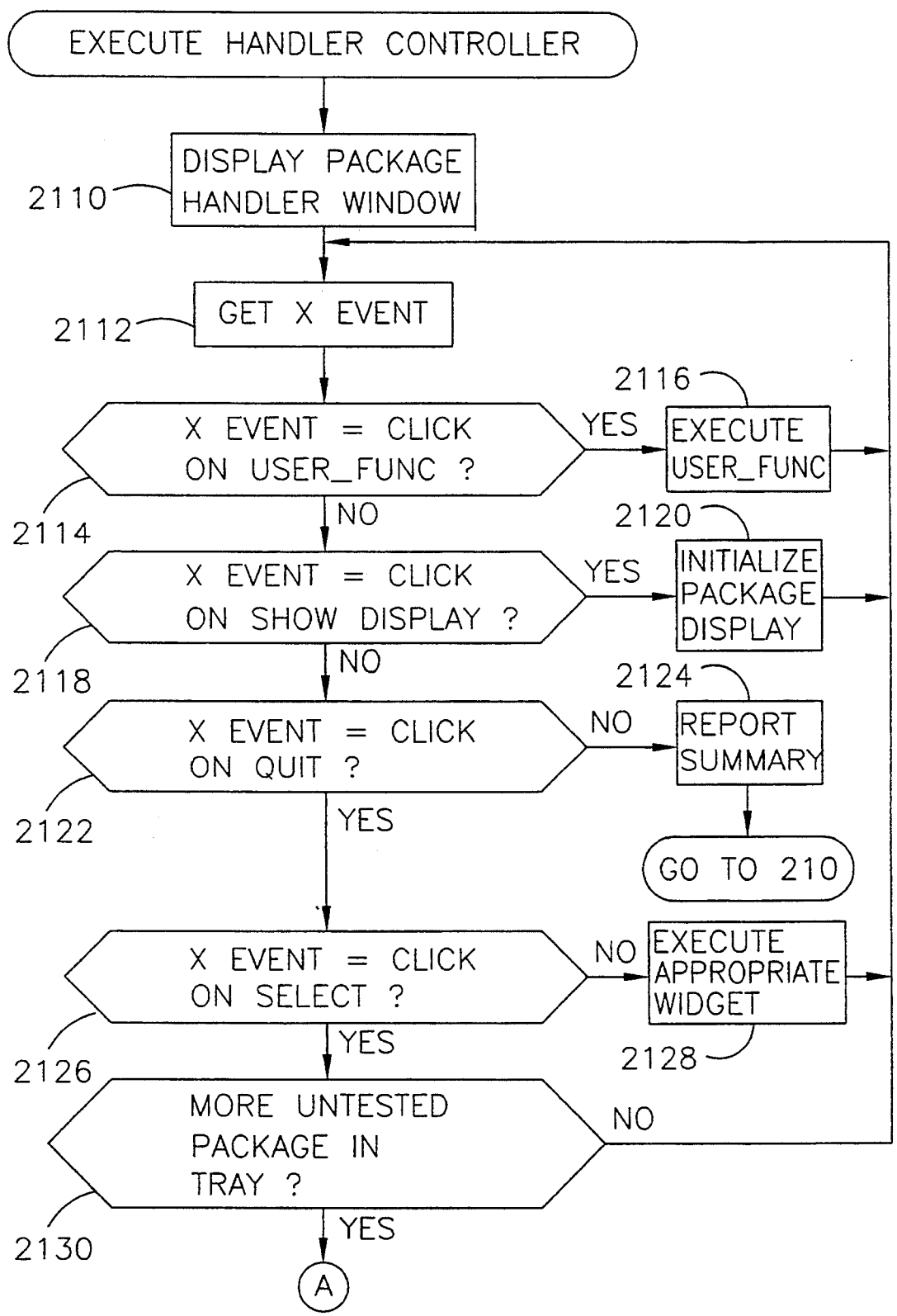
FIGS. 21A and 21B show a flowchart of the method of operation of the handler controller 150 of FIG. 17A.
Figure 21B:
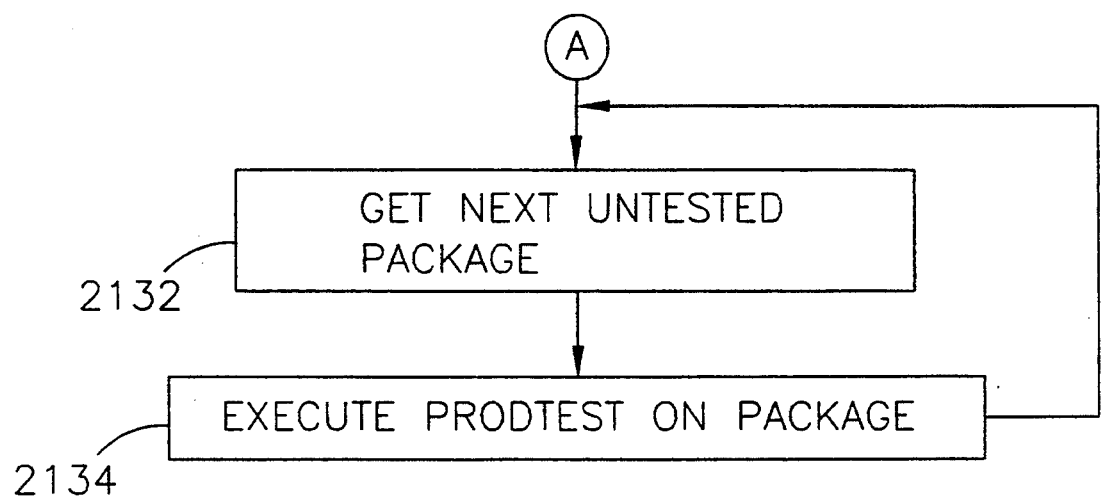

FIG. 17A shows a block diagram of the structure of the handler controller 150 executed in the step 1526 of FIG. 15. Looking at FIG. 17A the handler controller 150 comprises a handler interface 1726 and the user_func module 1724. FIGS. 21A and 21B show a flow chart which illustrates the method of operation of the handler controller 150. Referring to FIG. 21A, in a step 2110 the handler interface 1726 displays a package handler menu having quit, help, user_func, end lot, retest, show summary, show display and select buttons. It then waits to receive a response from the user 113 (in the form of an X event).

When it receives the X event, then in a step 2114 the handler 122 controller determines whether it is a click on the user_func button. If so, then in a step 2116 the user_func module 1724 executes the user_func test suite.

Otherwise, in a step 2118 the handler controller 150 determines whether the X event was a click on the show display button. If so, then in a step 2120 it sends a message to the reporting module 156 to execute the package display module 162. The reporting module 156 will then send an update message to the package display module 162 after each test is performed.

If the determination in the step 2118 was negative, then in a step 2122 the handler controller 150 determines whether the X event was a click on the quit button. If so, then in a step 2124 it invokes the reporting module 156 to generate a report summary. The reporting module 156 will then transmit the summary to the reporting window 138, the printer 134 and/or the report file 132 (whichever are specified by the system flags). Control of flow then returns to the prodshell 110 at the step 210.

If the determination in the step 2122 was negative, then in a step 2126 the handler controller 150 determines whether the X event was a click on the select button. If not, then in a step 2128 it executes the widget associated with the button pressed.

If, on the other hand, the X event was a click on the select button, then in a step 2130 the handler controller 150 determines whether there are additional untested packages in the tray currently in the package handler 122. If not, then control of flow returns to the step 2112. Otherwise, the handler controller 150 operates as follows.

In a step 2132, the handler interface 1726 prompts the user 113 to insert a tray of packages into the package handler 122 and press select. Once the user 113 does so, then in a step 2134 the handler controller 150 executes the prodconf 144. Execution of the prodconf 144 is described below in the section entitled "Prodconf". Control of flow then returns to the step 2132 to process any additional packages.

Package Controller

Figure 17B:
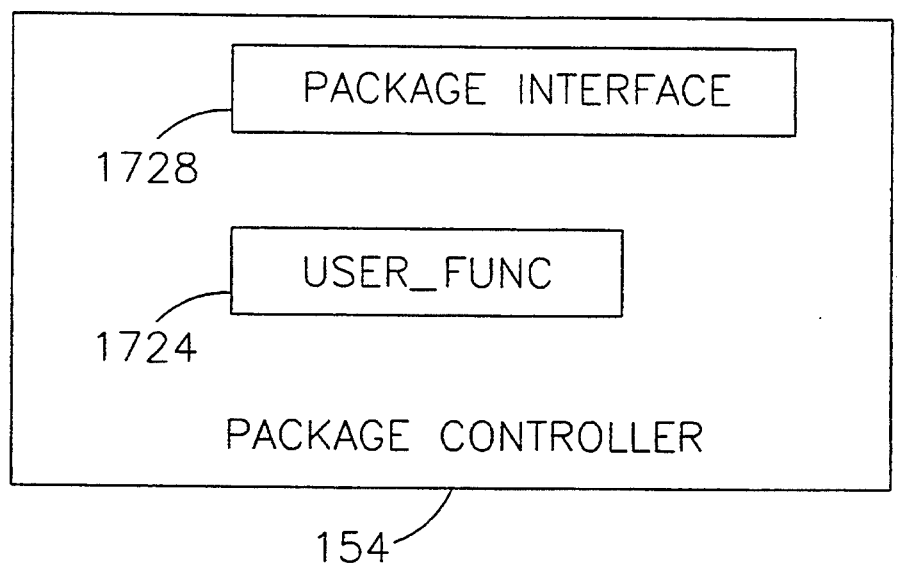
FIG. 17B shows a block diagram of a package controller 154 of FIG. 1.
Figure 22:
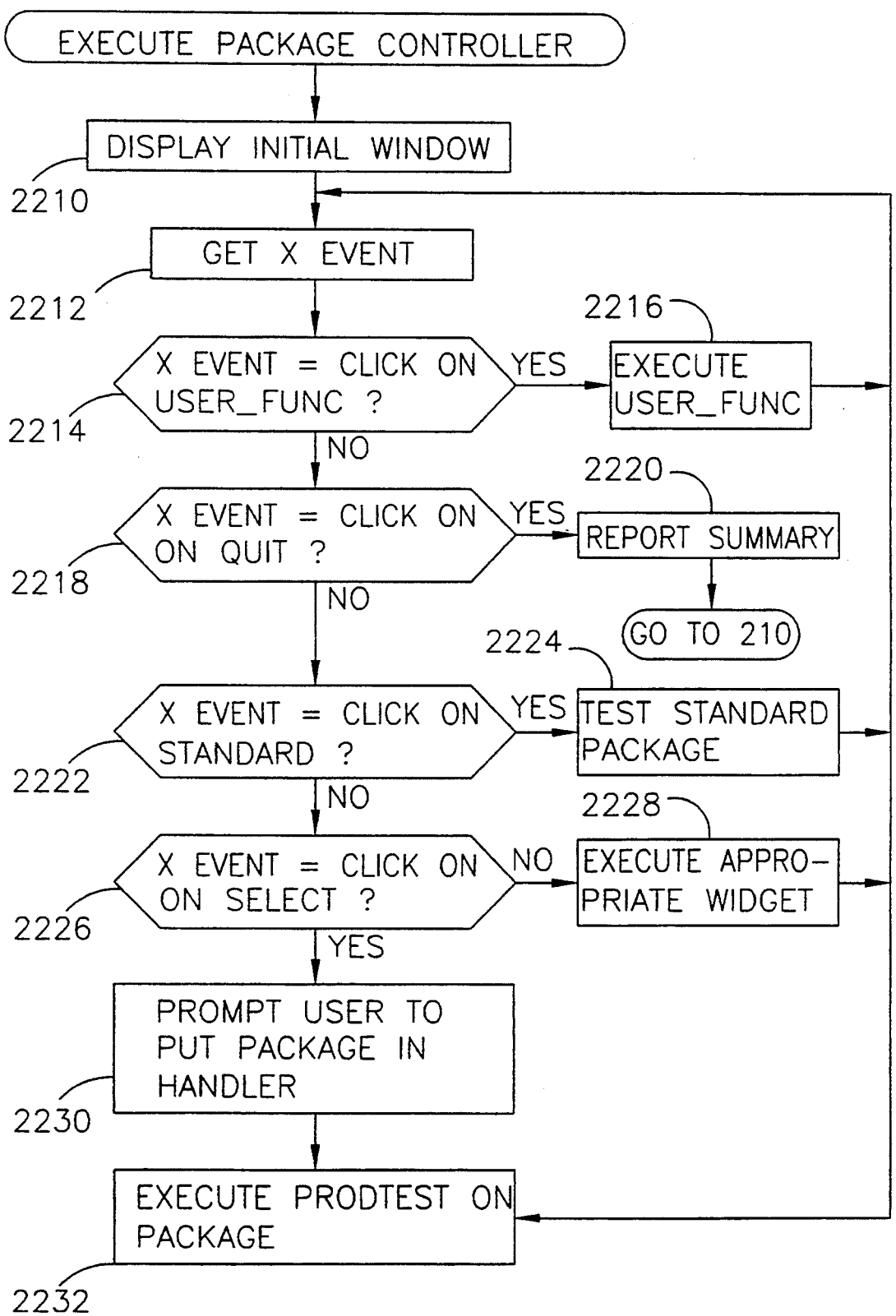
FIG. 22 shows a flowchart of the method of operation of the package controller 154 of FIG. 17B.

FIG. 17B shows a block diagram of the structure of the package controller 154 executed in the step 1626 of FIG. 16. Looking at FIG. 17B, the package controller 154 comprises a package interface 1728 and the user_func module 1724. FIG. 22 shows a flow chart which illustrates the method of the package controller. Referring to FIG. 22, in a step 2210 the package interface 1728 displays an initial package menu having quit, help, user_func, standard, tester control (if the user mode is engineer) and select buttons. The package controller 154 then waits to receive a response from the user 113 (in the form of an X event).

When it receives the X event, then in a step 2214 the package controller determines whether it is a click on the user_func button. If so, then in a step 2216 the user_func module 1724 executes the user_func test suite.

Otherwise, in a step 2218 the package controller determines whether the X event was a click on the quit button. If so, then in a step 2220 it invokes the reporting module 156 to generate a report summary. The reporting module 156 will then transmit the summary to the reporting window 138, the printer 134 and/or the report file 132 (whichever are specified by the system flags). Control of flow then returns to the prodshell 110 at the step 210.

If the determination in the step 2218 was negative, then in a step 2222 the package controller determines whether the X event was a click on the standard button. If so, then in a step 2224 the package interface 1728 prompts the user 113 to place a known good package (i.e., a standard package) in the tester 126. This enables the user 113 to verify the test setup. (Note that test results of the standard package are not included in the test summary.) After the first package is tested, the package interface 1728 will display a retest button and a summary button in addition to the buttons listed above. It will then prompt the user 113 to load the first package and press the select button.

If the determination in the step 2222 was negative, then in a step 2226 the package controller determines whether the X event was a click on the select button. If not, then in a step 2228 it executes the widget associated with the button pressed. Specifically, if the user 113 pressed the tester control button, it executes a widget to provide the user 113 with access to routines supported by the tester interface 140. If the user 113 pressed the help button, the package controller executes a widget to display a context-sensitive help message.

If, on the other hand, the X event was a click on the select button, then in a step 2230 the package interface 1728 prompts the user 113 to put the next package to be tested in the tester 126 and press the select button. Once the user 113 does so, then in a step 2232 the package controller executes the prodconf 144. Execution of the prodconf 144 is described below in the section entitled "Prodconf". Control of flow then returns to the step 2212 to process additional X events.

Prodconf

The prober controller 146, the handler controller 150 and the package controller 154 execute the prodconf 144 on each IC device 116. As stated, the prodconf 144 comprises a testflow module 158 for processing the testflow description of the configuration file 128 and a binning module 160 for processing the binning description of the configuration file 128.

Figure 30:
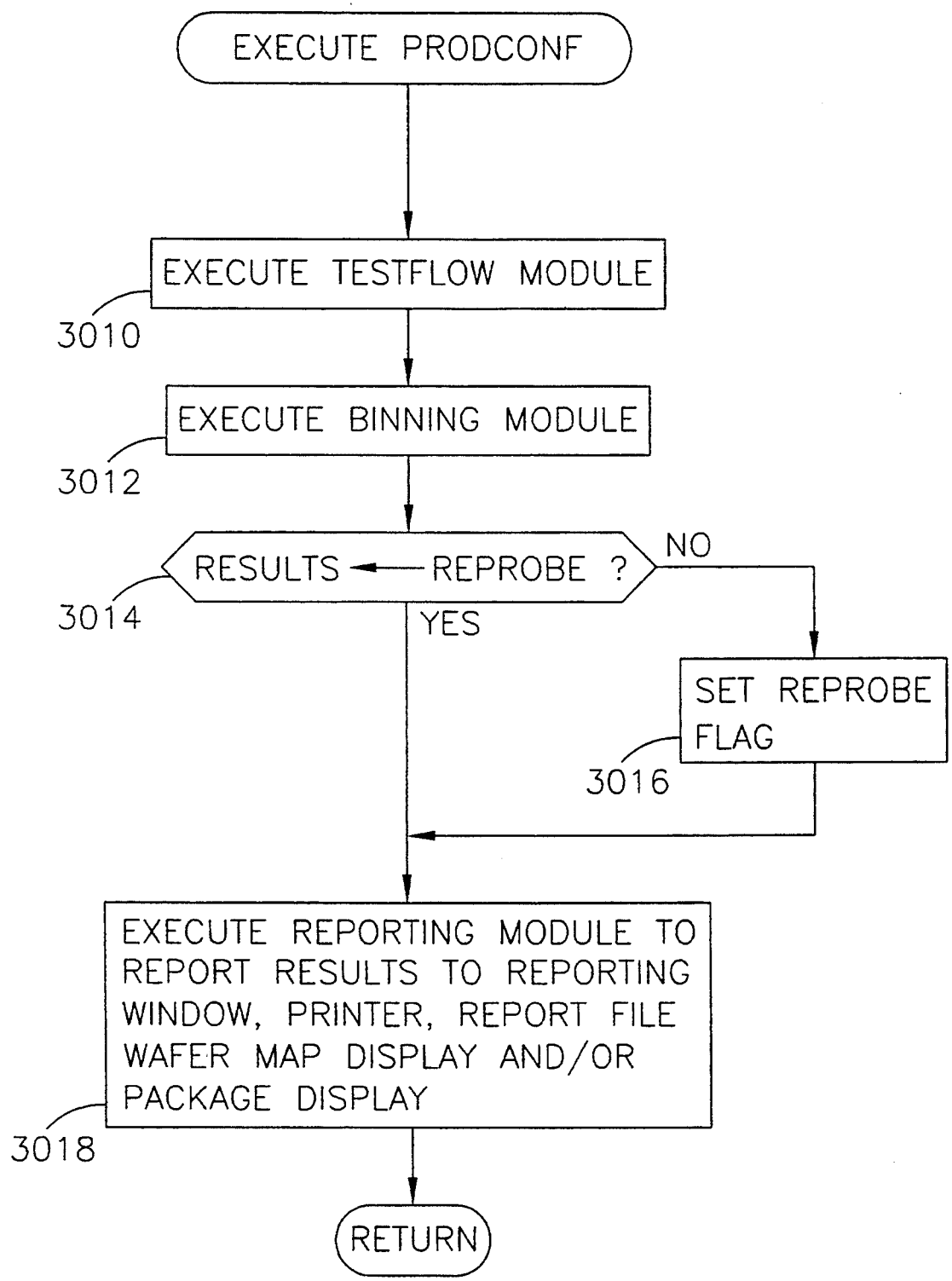
FIG. 30 shows a method of a prodconf 144 of FIG. 1.

FIG. 30 shows a flowchart which illustrates the method of the prodconf 144. In a step 3010, the prodconf executes the testflow module to execute tests on the IC device 116 as specified in the testflow description. The testflow module is explained in greater detail below in the section entitled "Testflow".

In a step 3012, the prodconf 144 executes the binning module 160 to perform the binning as specified in the binning description. The binning module is described in greater detail below in the section entitled "Binning". As is explained in that section, the binning description can specify that the IC device 116 be reprobed as a consequence of particular test results. Accordingly, in a step 3014, the binning module 160 determines whether the test results indicate that the IC device 116 should be reprobed. If so, then in a step 3016 the binning module 160 determines whether the IC device 116 has already been reprobed more than a specified maximum number of times and, if not, sets a reprobe flag. If the reprobe flag is set, then the prober controller 146, the handler controller 148 or the package controller 150 will cause the IC device 116 under test to be reprobed. (The maximum number of reprobes is specified by the user 113.).

After step 3016 or a negative determination in the step 3014, then in a step 3018 the prodconf executes the reporting module 156. Depending on the values of the associated system flags, the reporter module 156 transmits the results to the reporting window 138, the printer 134, and/or the report file 132. If the IC device 116 is a die on a wafer, then the reporting module further transmits the test results (as an update message) to the wafer map display 164. If the IC device 116 was a package part and the user 113 did not turn off the "show display" flag (see step 2118 of FIG. 21A), then the reporting module 156 transmits the results (as an update message) to the package display 162. Upon receiving the message, the package display 162 displays a package template representative of the package just tested. The package display 162 will color the package template green if the package was found to be a shippable part, and red otherwise. It will also display the two major bin characters and the first five minor bin characters for the major bin and minor bin determined by the binning module 160. Finally, it will display the fingerprint of the package. That is, it will write the number of the first test that the package failed, the total number of tests that the package failed, and the number of tests executed on the package.

After the step 3018, control of flow returns to the calling module (i.e., the prober controller 146, the handler controller 150 or the package controller 154).

Testflow

When the prodtest 120 executes the parser 142 in the step 1610 of FIG. 16, the parser 142 creates a testflow list 2500 of the testflow 158 from the testflow description in the configuration file 128. The testflow description is a simple programming language used to specify and control the way in which test suites are applied to the IC device 116 under test. The testflow 158 is executed once for each IC device under test, whether the IC device 116 is a die on a wafer or a package part. The testflow description comprises at least one statement, where a statement is of one of the following forms, and text following "--" is a comment.

| | |
|---|---|
| run(<test_suite>); | --a run statement |
| print(@<var_name); | --a print statement |
| if <expression> then <statement>; | --an if statement |
| [else <statement>;] | --an else clause |
| while <expression> do <statement>; | --a while statement |
| repeat <statement>; until <expression> | --a repeat statement |
| { <statement>; [<statement>;] } | --a compound statement |
| @<var_name> = <expression> | --an expression assignment statement |
| @<var name> = "<string>" | --a string-assignment statement |
| @<var_name> = <string_expression> | --a string expression assignment statement |
| ; | --a null statement |
| stop; | --a stop statement |

An <expression> in the testflow description is an arithmetic and/or boolean expression with operators: "+", "−", "*", "/", ">", ">=", "<", "<=", "==", "?=", "(",")", "and", "or", "not" and operands:

| | |
|---|---|
| pass(<test_suite>) | --1 if<test suite> passed, 0 otherwise |
| fail(<test_suite>) | --1 if <test suite> failed, 0 otherwise |
| has_run(<test_suite>) | --1 if <test suite> has run, 0 otherwise |
| has_not_run(<test_suite>) | --1 if <test suite> has not run, 0 otherwise |
| ( expression ) | |
| @<var_name> | |
| <real_number> | |
| "<string > " | |
| <string_expression > | |

A <test suite> in the testflow description is a previously defined test suite name, and a <var_name> is an alphanumeric label of a variable. A <string> is any sequence of ASCII characters. A <string_expression> is a string expression with strings as operands and operators:

==

?=

+

A <real_number> is any integer or real number, containing [0–9] and, for real numbers, the decimal point.

Figure 25:
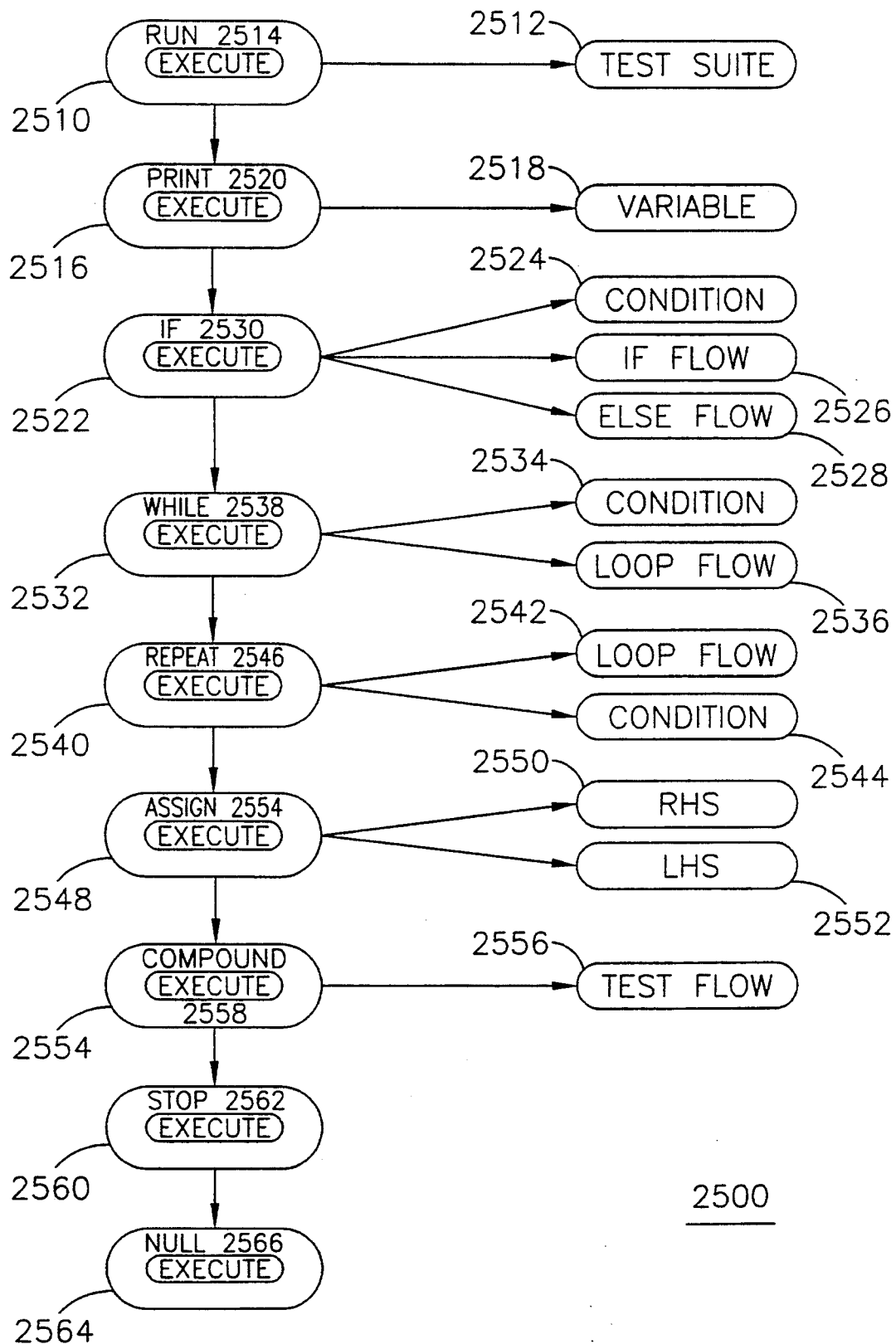
FIG. 25 shows a testflow list of a testflow module 158 of FIG. 1.

FIG. 25 shows the structure of the testflow list 2500. The testflow list has a node for each type of statement in the testflow description. The nodes of the testflow are described as follows.

A run node 2510 points to a test suite 2512 and comprises an execute module 2514 for executing the test suite 2512. A print node 2516 points to a variable 2518 and comprises an execute module 2520 for printing the variable 2518. An if node 2522 points to a condition 2524, an ifFlow node 2526, and an elseFlow node 2528. The if node 2522 comprises an execute module 2530 for (1) evaluating the condition 2524, (2) causing execution of the ifFlow node 2526 if the condition is true, and (3) causing the execution of the elseFlow node 2528 if that node is not null and the condition is false.

A while node 2532 has a pointer to a condition 2534 and to a loopFlow node 2536. The while node comprises an execute module 2538 for evaluating the condition 2534 and, while the condition is true, causing the execution of the loopFlow node 2536.

A repeat node 2540 has a pointer to a loopFlow 2542 and to a condition 2544. The repeat node 2540 comprises an execute module 2546 for causing the execution of the loopFlow node 2542 and evaluating the condition 2544 to determine if the execution of the loopFlow node 2542 is repeated.

An assign node 2548 has a pointer to a right hand side 2550 and to a left hand side 2552. The assign node 2548 comprises an execute module 2554 for evaluating the right hand side (if it is an expression) and assigning the value of the right hand side 2550 to the left hand side 2552.

A compound node 2554 has a pointer to a testflow sublist 2556 of the testflow list 2500, and comprises an execute module 2558. The testflow sublist 2556 comprises at least one flow node. The execute module 2558 causes the execution of all testflow nodes on the testflow sublist 2556.

A stop node 2560, comprises an execute module 2562 for breaking out of a loop which is processing the testflow sublist 2500 (or the testflow sublist 2556).

A null node 2564 comprises an execute module 2566 for returning control of flow to the node that called the null node. (The null statement does nothing.)

Figure 26A:
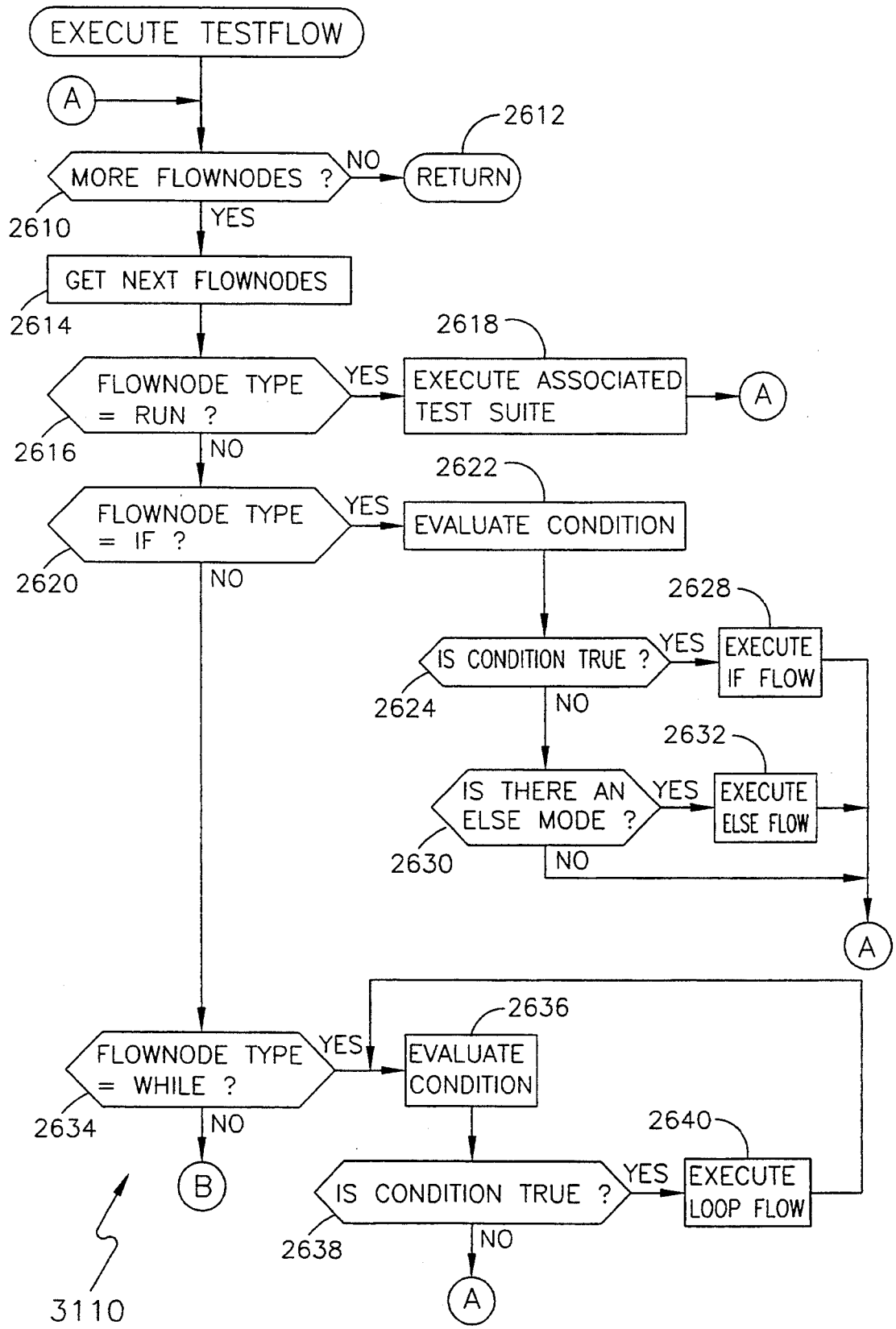
FIGS. 26A, 26B and 26C show a flowchart which illustrates the method of operation of the testflow module 158 of FIG. 1.
Figure 26B:
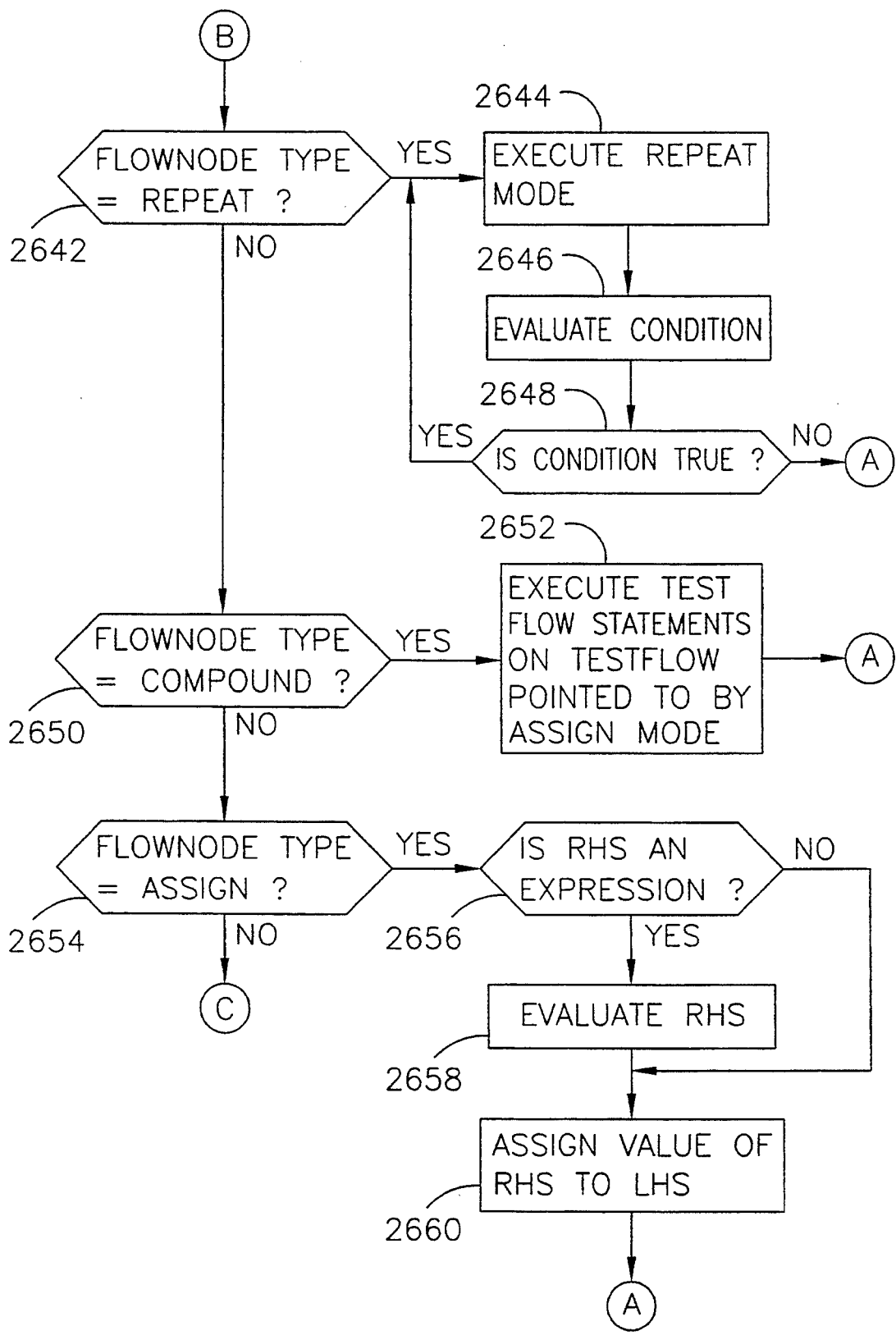
Figure 26C:
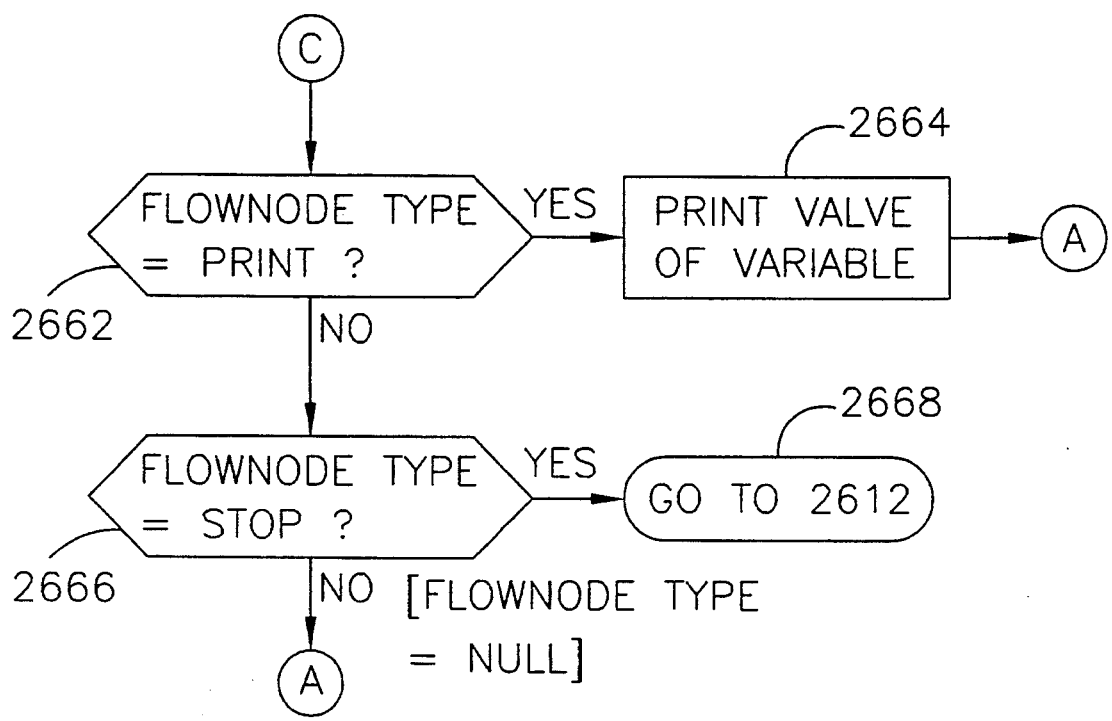

FIGS. 26A, 26B and 26C show a flow chart of the method of the testflow module 158. Looking at FIG. 26A, in a step 2610 the testflow module 158 determines whether there are additional Flow nodes to process. Once all Flow nodes have been processed, then in a step 2612 control of flow returns to the calling module. That is, it returns to the prober controller 146 at the step 1840, to the handler 122 controller 150 at the step 2136, or to the package controller 154 at the step 2234. Otherwise, the testflow module 158 proceeds as follows. In a step 2614, it retrieves the next node of the testflow list 2500. In a step 2616, it determines whether the flow node is the run node 2510. If so, then the execute module 2514 of the run node executes the associated test suite 2512.

Otherwise, the testflow module 158 determines whether the flow node is the if node 2522 in a step 2620. If so, then in step 2622 the associated execute module 2530 evaluates the condition 2524. If the condition is true, then in a step 2628 the execute module 2530 causes the ifFlow 2526 to be executed. It does so by invoking the execute module of the appropriate node. For example, if the ifFlow node 2526 were a print node 2516, then the execute module 2520 would print the variable specified.

If, on the other hand, the condition 2524 was false, then in a step 2630 the execute module 2530 determines whether there is an elseFlow node 2528. If so, then in a step 2632 it causes the elseFlow node 2528 to be executed. After the step 2628 or 2632, control of flow returns to the step 2610 to process any additional flow nodes.

After a negative determination in the step 2620, in a step 2634 the testflow module 158 determines whether the flow node is the while node 2532. If so, then in a step 2636 the execute module 2538 determines whether the condition 2534 is true. If so, then in a step 2640 it executes the loop flow 2536. Control of flow then returns to the step 2636 to determine whether the condition 2534 is still true. Once the condition 2534 is found not to be true in the step 2638, control of flow returns to the step 2610.

After a negative determination in the step 2634, then in a step 2642 the testflow module 158 determines whether the flow node is the repeat node 2540. If so, then in a step 2644 the execute module 2546 causes the loop flow node 2542 to be executed. In a step 2646 the execute module 2546 evaluates the condition 2544. If the condition is true, then in a step 2648 control of flow returns to the step 2644 to again execute the loop flow node 2542. Otherwise, control of flow returns to the step 2610 of FIG. 26A.

After a negative determination in the step 2642, then in a step 2650 the testflow module 158 determines whether the flow is the compound node 2554. If so, then in a step 2652 the execute module 2558 causes the execution of the testflow sublist 2556. It does so with a recursive call to the testFlow module 156. Control of flow then returns to the step 2610.

After a negative determination in the step 2654, the testflow module 158 determines whether the flow node was the assign node 2548. If so, then in a step 2656 the execute module 2554 determines whether the RHS node 2550 contains an expression. If so, then in a step 2658 the execute module 2554 evaluates the expression. If, on the other hand, the RHS node 2550 contains a simple value, or after the step 2658, then in a step 2660 the execute module 2554 assigns the value of the RHS node 2550 to the variable of the LHS node 2552. Control of flow then returns to the step 2610 of FIG. 26A.

After a negative determination in the step 2654, then in a step 2662 the testflow module 158 determines whether the flow node is the "print" node 2516. If so, then in a step 2664 the execute module 2520 prints the value of the variable 2518. Control of flow then returns to the step 2610.

After a negative determination in the step 2662, the testflow module 158 determines whether the flow node is the "stop" node 2560. If so, the execute module 2562 causes control of flow to break out of the loop processing the nodes on the testflow list 2500. That is, it causes control of flow to go to the step 2612 of FIG. 26A.

Otherwise, the flow node must have been the "null" node 2564. In that case, control of flow returns to the step 2610.

Binning

After execution of the testflow, the binning module is executed to characterize the quality of the IC device 116 based on the test results. Operation of the binning module is specified in the binning description of the configuration file 128.

Each binning rule in the binning description specifies a major bin and a minor bin. A major bin can be used to indicate a general type of failure, such as a short, a continuity failure, an AC failure, or a DC failure. Minor bins could be used to provide more information about a failure at a glance, but may only be meaningful to one familiar with the IC device 116 under tests. Several minor bins can map into one major bin.

Binning is specified in the configuration file 128 with the following syntax.

```
Keyword Line:
   binning
Entry line:
   <binning_rule>;
   [...]
   otherwise bin = <major_bin> <minor_bin>;
   good = <major_bin_list>;
   reprobe = <major_bin_list>;
   physical_mapping
      <number> = <major_bin_list>;
      [...]
   color_mapping
      <color> = <major_bin_list>;
      [...]
```

Terms used in the binning rules are as follows:

| | |
|---|---|
| <binning_rule> = | if <expression> bin = <major_bin> <minor_bin> |
| <expression> = | a boolean expression with operators ">", ">=", "<", "<=", "==", "!=", "(",")", "and", "or", and "not". (Note that the quotes here are not literal and are only used for clarity.) and operands pass(<test_suite>) fail(<test_suite>) has_run(<test_suite>) has_not_run(<test_suite>) ( expression ) @<var_name> <real_number> "<string >" |
| <test_suite> = | previously defined test suite name |
| <var_name> = | an alphanumeric label, with a letter as the first character. See the declarations section for a complete description of variables |
| <string > = | any sequence of ASCII characters |
| <string_expression > = | a string expression with operators "==", "!", "+", and with strings as operands. |
| <real_number> = | any integer real number, containing [0-9] and for real numbers, the decimal point. |
| <major_bin> = | location or industry standard bin |
| <minor_bin> = | user-defined bin for diagnostic purposes |
| <major_bin_list> = | comma separated list of one or more major bins |
| <number> = | an integer number |
| <color> = | an integer number (where 0 = black, 1 = white, 2 = red, 3 = yellow, 4 = green, 5 = cyan, 6 = blue, 7 = magenta), or the name of the color in lower case. |

The following is an example of a set of binning rules.

```
binning          -- major       minor
if fail(continuity)     bin = "ZC"    "continuity_failure";
if fail(nominal)        bin = "BZ"    "non_functional";
if fail(nominal2)       bin = "BA"    "almost_good";
if pass(nominal2)       bin = "AA"    "good_part";
otherwise               bin = "XX"    "oops";
good = "AA";
reprobe = "ZC";
physical_mapping
   1 = "ZC";
   2 = "BZ", "BA";
   3 = "AA";
   4 = "XX";
color_mapping
   red = "ZC";
   yellow = "BZ", "BA";
   green = "AA";
   black = "XX";
end
```

The binning module 160 processes the binning description essentially as follows. When an expression within a binning rule is true, the IC device 116 just tested is assigned the major bin and the minor bin contained in that binning rule. Binning rules are evaluated in the order in which they are listed. Binning rules following the first true rule are ignored. This allows for less complex binning equations, but also can yield different results if equations are reordered.

The IC device 116 is binned according to the otherwise clause when no binning rule is true.

The good keyword is used to define the list of major bins which are shippable parts. The reprobe keyword is used to define the list of major bins which should be reprobed if the initial test fails. The physical_mapping keyword is used to define a mapping of logical bins to physical bins, for example, output bins on the package handler 122. The color_mapping keyword is used to assign a color to a logical bin when the binning result is displayed by the package display 162 or the wafer display 164.

Figure 31:
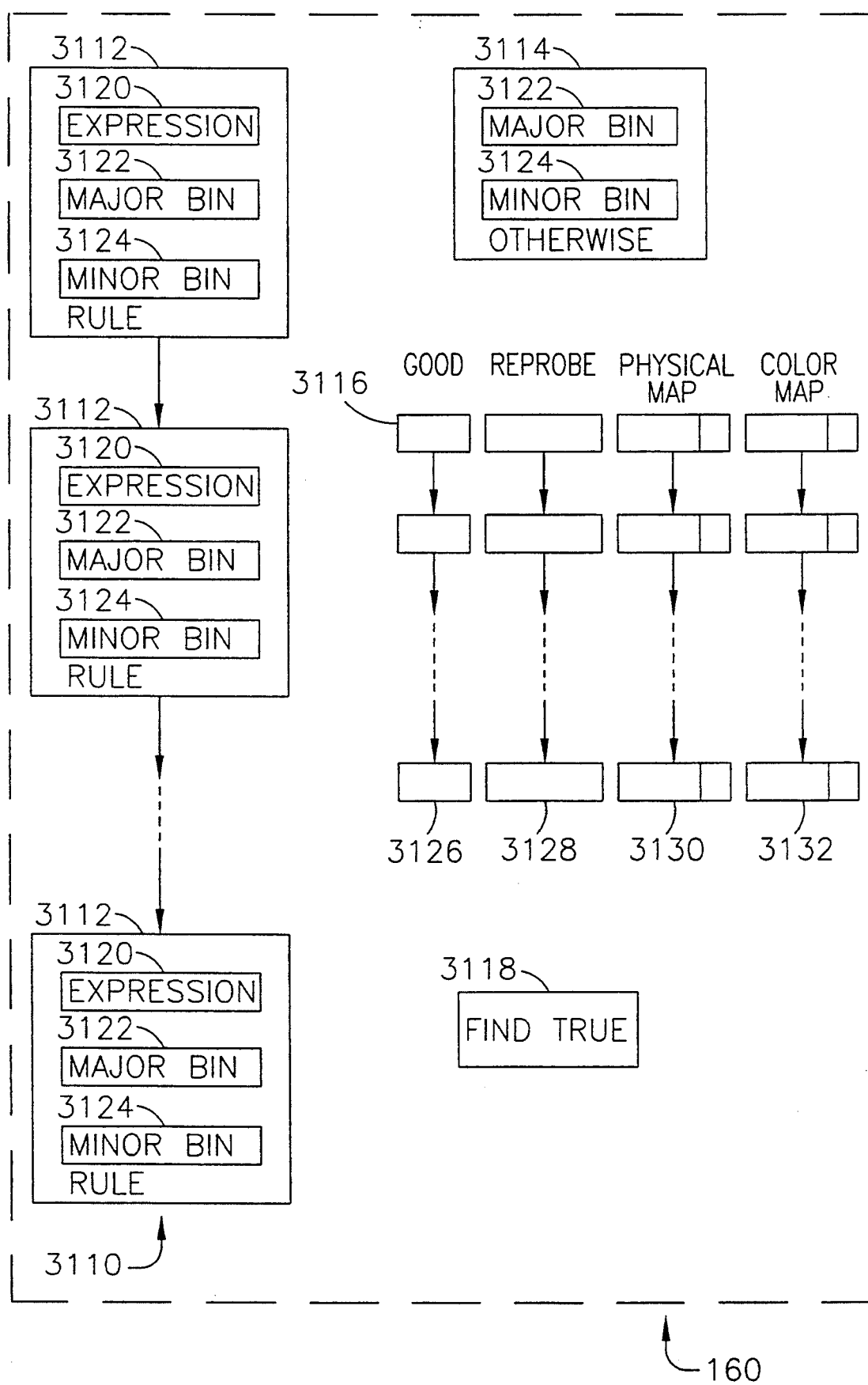
FIG. 31 shows a block diagram of the binning module 160 of FIG. 1.

FIG. 31 shows a block diagram of the structure of the binning module 160. The binning module 160 comprises a list of binning rules 3110, an otherwise clause 3114, major bin lists 3116 and a find_true module 3118. Each binning rule 3112 of the binning rule list 3110 comprises an expression 3120, a major bin 3122 and a minor bin 3124. The otherwise clause 3114 also comprises the major bin 3122 and the minor bin 3124.

The major bin lists 3116 comprise a good list 3126 containing the major bins following good keyword in the binning description, a reprobe list 3128 comprising the major bins following the reprobe keyword, a physical map 3130 comprising the logical bin/physical bin pairs following the physical_mapping keyword, and a color map 3132 comprising the logical bin/color pairs following the color_mapping keyword.

The find_true module 3118 traverses the binning rule list 3110 until it finds a binning rule 3112 whose expression 3120 is true. The structures and module of the binning module 160 are further described in FIGS. 27A and 27B.

Figure 27A:
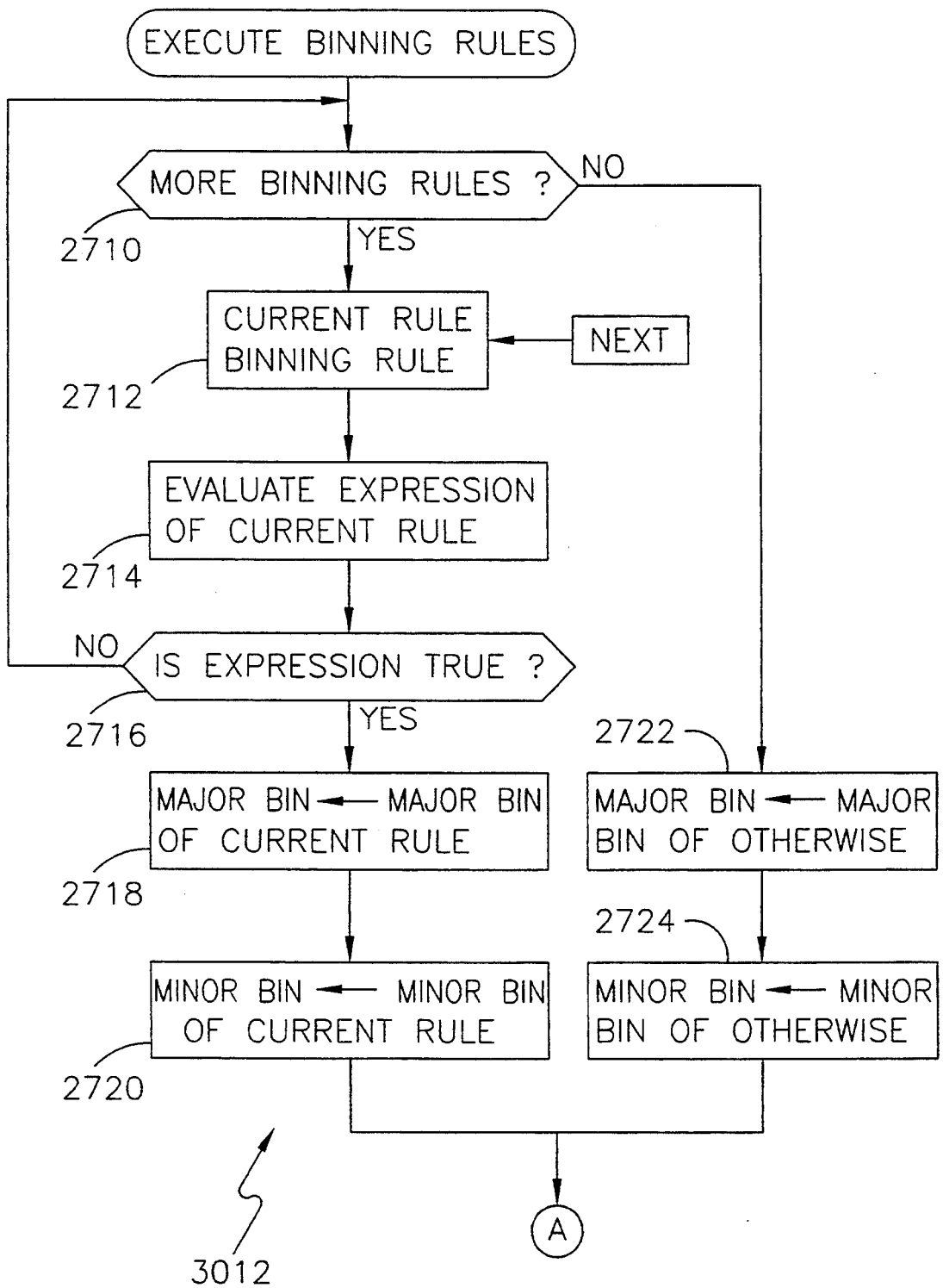
FIGS. 27A and 27B show a flowchart of the method of operation of a binning module 160 of FIG. 1.
Figure 27B:
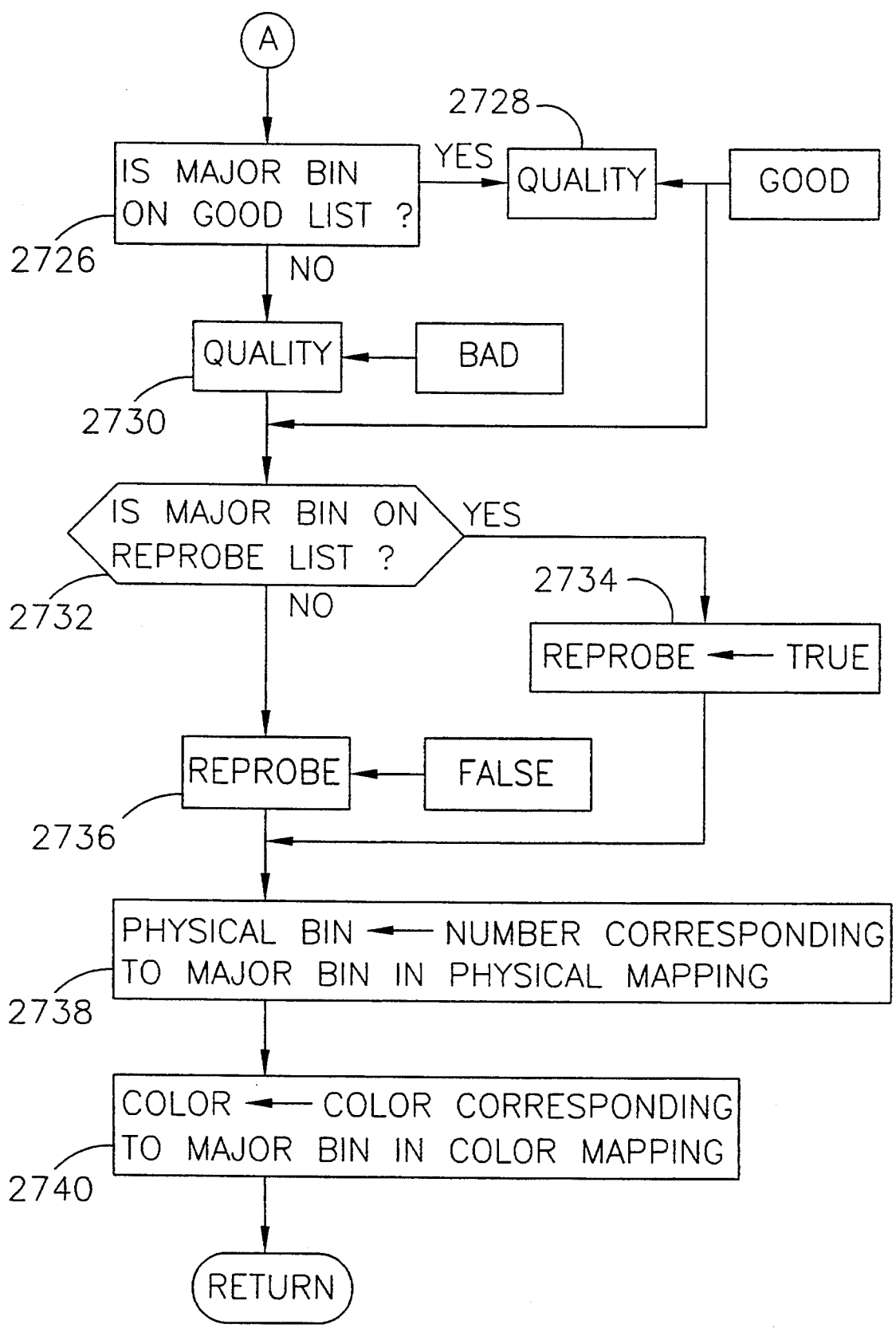

FIGS. 27A and 27B show a flow chart which illustrates the method of the binning module 160. Referring to FIG. 27A, in a step 2710 the binning module determines whether there are additional binning rules 3112 on the binning list 3110. If so, then in a step 2712 it retrieves the next such rule (referred to as the current binning rule 3112). In a step 2713, the find_true module 3118 evaluates the expression 3120 of the current binning rule 3112. If the expression is false (see step 2716), then control of flow returns to the step 2710. Accordingly, the find_true module 3118 will traverse the binning rule list 3112 until finding a binning rule 3112 whose expression 3120 is true or until there are no more binning rules 3112 on the binning list 3110.

If the find_true module 3118 found a binning rule 3112 whose expression 3120 was true, then in a step 2718 the binning module 160 sets the major bin of the IC device 116 just tested to the major bin 3122 of that binning rule 3112. In a step 2720, it sets the minor bin of the IC device 116 to the minor bin 3124 of the binning rule 3112.

If, on the other hand, the find_true module 3118 found no binning rule 3112 whose expression 3120 was true, then in a step 2722 the binning module sets the major bin 3122 of the IC device 116 just tested to the major bin of the otherwise clause 314. It then sets the minor bin of the IC device 116 to the minor bin 3124 of the otherwise clause 314 in the step 2724.

After the step 2720 or 2724, then in a step 2726 the binning module 160 determines whether the major bin of the IC device 116 is on the good list 3126. If so, then in a step 2728 it sets the quality of IC device 116 to good. Otherwise, in a step 2730 it sets the quality to bad.

Next, in a step 2732 the binning module determines whether the major bin of the IC device 116 is on the reprobe list. If so, then in a step 2734 the binning module 160 indicates that the IC device 116 should be reprobed. Otherwise, in a step 2736, it indicates that the IC device 116 should not be reprobed.

Then, in a step 2738, the binning module sets the physical bin of the IC device 116 to the physical bin in the physical map 3130 mapped to the major bin of the IC device 116. In a step 2740, it sets the color of the IC device 116 to the color in the color map 3132 mapped to the major bin of the IC device 116. Control of flow then returns to the calling module (that is, the prober controller 146, the handler controller 150 or the package controller 154).

Conclusion

While the invention has been particular shown and described with reference to the preferred embodiments thereof, it will be understood by those skilled in the art that the foregoing and other changes in form and detail may be made therein without departing from the spirit and scope of the invention.

We claim:

1. A method for enabling a user to specify wafer numbers corresponding to wafers in a cassette to be tested by a computer controlled integrated circuit (IC) testing system, the method comprising the steps of:
   (a) presenting, via a graphics interface displayed on a display device of the computer, a graphical representation of the cassette;
   (b) receiving an indication of the wafer numbers from the user via said graphics interface;
   (c) presenting the wafer numbers on said graphical representation; and
   (d) communicating the wafer numbers to the testing system.

2. The method of claim 1, wherein step (b) comprises the step of generating consecutive numbers.

3. The method of claim 1, wherein step (b) comprises the step of inputting wafer numbers generated by a wafer number reading device.

4. The method of claim 1, wherein step (b) comprises the step of inputting at least one of the wafer numbers from the user.

5. The method of claim 1, wherein step (b) comprises the step of inputting wafer numbers previously specified by the user.

6. The method of claim 1, further comprising the step of:
   (e) determining, between steps (b) and (e), whether the wafer numbers comply with a checksum.

7. The method of claim 1, further comprising the steps of:
   (e) inputting a flip list action from the user; and
   (f) reversing the order of the wafer numbers on said graphical representation.

8. The method of claim 1, further comprising the steps of:
   (e) inputting a clear action from the user; and
   (f) clearing said wafer numbers from said graphical representation.

9. The method of claim 1, further comprising the steps of:
   (e) enabling the user to select a wafer number displayed on said graphical representation;
   (f) inputting a skip action made by the user on said wafer number; and
   (g) marking the wafer number so that the corresponding wafer in the cassette will not be tested.

10. The method of claim 1, further comprising the steps of:
   (e) enabling the user to select a wafer number displayed on said graphical representation;
   (f) moving said selected wafer number from said graphical representation to an edit window;
   (g) inputting an edit action made by the user on said edit window;
   (h) modifying said selected wafer number as directed by said edit action; and (i) moving said modified selected wafer number from said edit window to said graphical representation.

11. The method of claim 1, further comprising the steps of:
   (e) inputting a delete action made by the user on a selected wafer on said graphical representation; and
   (f) removing said selected wafer number from said graphical representation.

12. The method of claim 1, further comprising the step of:
   (e) enabling the testing system to execute tests on the wafers in the cassette corresponding to the wafer numbers specified by the user.

13. An apparatus for enabling a user to specify wafer numbers corresponding to wafers in a cassette to be tested by a computer controlled integrated circuit (IC) testing system, the apparatus comprising:
   means for providing a graphics interface via a display device of the computer a graphical representation of the cassette;
   means for receiving from said graphics interface an indication of the wafer numbers to be tested;
   means for presenting the wafer numbers on said graphical representation; and
   means for communicating the wafer numbers to the testing system.

14. The apparatus of claim 13, wherein said determining means comprises means for generating consecutive numbers.

15. The apparatus of claim 13, wherein said determining means comprises means for receiving wafer numbers from a wafer number reading device.

16. The apparatus of claim 13, wherein said determining means comprises means for receiving at least one of the wafer numbers from the user.

17. The apparatus of claim 13, wherein said determining means comprises means for receiving wafer numbers previously specified by the user.

18. The apparatus of claim 13, further comprising means for determining whether the wafer numbers comply with a checksum.

19. The apparatus of claim 13, further comprising:
   means for receiving a flip list action from the user; and
   means for reversing the order of the wafer numbers on said graphical representation.

20. The apparatus of claim 13, further comprising:
   means for receiving a clear action from the user; and
   means for clearing said wafer numbers from said graphical representation.

21. The apparatus of claim 13, further comprising:
   means for receiving from the user a skip action made on a selected wafer number displayed on said graphical representation; and
   means for marking the selected wafer number so that the corresponding wafer in the cassette will not be tested.

22. The apparatus of claim 13, further comprising:
   means for receiving from the user a select action made on a selected wafer number displayed on said graphical representation;
   means for moving said selected wafer number from said graphical representation to an edit window;
   means for receiving from the user an edit action made on said edit window;
   means for modifying said selected wafer number as directed by said edit action; and
   means for moving said modified selected wafer number from said edit window to said graphical representation.

23. The apparatus of claim 13, further comprising the steps of:
   means for receiving from the user a delete action made on a selected wafer number displayed on said graphical representation; and
   means for removing said selected wafer number from said graphical representation.

24. The apparatus of claim 13, further comprising means for enabling the testing system to execute tests on the wafers in the cassette corresponding to the wafer numbers specified by the user.

* * * * *

UNITED STATES PATENT AND TRADEMARK OFFICE
CERTIFICATE OF CORRECTION

PATENT NO. : 5,381,344
DATED : January 10, 1995
INVENTOR(S) : Rohrbaugh et al.

It is certified that error appears in the above-indentified patent and that said Letters Patent is hereby corrected as shown below:

Column 31, line 21, change "providing a graphics interface via a display" to --providing, via a graphics interface on a display--; and line 22, after "computer" insert -- , --.

Signed and Sealed this

Fourth Day of February, 1997

Attest:

BRUCE LEHMAN

Attesting Officer

Commissioner of Patents and Trademarks